US009590178B2

(12) United States Patent
Mitchell et al.

(10) Patent No.: US 9,590,178 B2
(45) Date of Patent: *Mar. 7, 2017

(54) CONJUGATED POLYMERS

(75) Inventors: William Mitchell, Chandler's Ford (GB); Nicolas Blouin, Southampton (GB); Amy Phillips, Hampshire (GB); Steven Tierney, Southampton (GB); Miguel Carrasco-Orozco, Winchester (GB); Toby Cull, Romsey (GB)

(73) Assignee: MERCK PATENT GMBH, Darmstadt (DE)

( * ) Notice: Subject to any disclaimer, the term of this patent is extended or adjusted under 35 U.S.C. 154(b) by 168 days.

This patent is subject to a terminal disclaimer.

(21) Appl. No.: 14/346,757

(22) PCT Filed: Aug. 29, 2012

(86) PCT No.: PCT/EP2012/003631
§ 371 (c)(1),
(2), (4) Date: Apr. 4, 2014

(87) PCT Pub. No.: WO2013/045014
PCT Pub. Date: Apr. 4, 2013

(65) Prior Publication Data
US 2014/0209839 A1    Jul. 31, 2014

(30) Foreign Application Priority Data
Sep. 28, 2011 (EP) .................... 11007872

(51) Int. Cl.
| H01L 51/00 | (2006.01) |
| C08G 61/12 | (2006.01) |
| C08L 65/00 | (2006.01) |
| C09K 11/06 | (2006.01) |
| H05B 33/14 | (2006.01) |
| B82Y 10/00 | (2011.01) |
| C08K 3/04 | (2006.01) |
| H01L 51/42 | (2006.01) |

(52) U.S. Cl.
CPC .......... *H01L 51/0036* (2013.01); *B82Y 10/00* (2013.01); *C08G 61/123* (2013.01); *C08G 61/126* (2013.01); *C08L 65/00* (2013.01); *C09K 11/06* (2013.01); *H01L 51/0043* (2013.01); *H05B 33/14* (2013.01); *C08G 2261/12* (2013.01); *C08G 2261/1426* (2013.01); *C08G 2261/3223* (2013.01); *C08G 2261/3243* (2013.01); *C08G 2261/3246* (2013.01); *C08G 2261/414* (2013.01); *C08G 2261/51* (2013.01); *C08G 2261/91* (2013.01); *C08K 3/04* (2013.01); *C09K 2211/1458* (2013.01); *H01L 51/0047* (2013.01); *H01L 51/4253* (2013.01); *Y02E 10/549* (2013.01)

(58) Field of Classification Search
CPC .... B82Y 10/00; C08G 61/123; C08G 61/126; C08L 65/00; C09K 11/06; H01L 51/0036; H01L 51/0043; H05B 33/14

USPC ......... 252/501.1, 500; 526/239, 240; 549/44
See application file for complete search history.

(56) References Cited

U.S. PATENT DOCUMENTS

| 7,524,922 | B2 | 4/2009 | Heeney et al. |
| 7,534,922 | B2* | 5/2009 | Goring .................... C07C 41/56 422/129 |
| 8,334,456 | B2 | 12/2012 | Zhu et al. |
| 8,598,449 | B2 | 12/2013 | Pan et al. |
| 8,969,508 | B2 | 3/2015 | Wen et al. |
| 9,035,015 | B1 | 5/2015 | Wen et al. |
| 9,337,358 | B2 | 5/2016 | Byrne et al. |
| 2005/0082525 | A1* | 4/2005 | Heeney ................ C07D 495/04 257/40 |
| 2009/0256139 | A1* | 10/2009 | Wu ...................... H01L 51/0036 257/40 |
| 2010/0307594 | A1 | 12/2010 | Zhu et al. |
| 2012/0187385 | A1 | 7/2012 | Pan et al. |
| 2013/0043434 | A1 | 2/2013 | Tierney et al. |
| 2013/0098448 | A1 | 4/2013 | Zhu et al. |
| 2013/0167929 | A1 | 7/2013 | Wen et al. |
| 2014/0061538 | A1* | 3/2014 | Blouin ................. C07D 495/04 252/301.35 |
| 2014/0124035 | A1 | 5/2014 | Byrne et al. |
| 2015/0076418 | A1* | 3/2015 | Blouin .................... C08K 3/04 252/511 |
| 2015/0108409 | A1* | 4/2015 | Meyer .................. C07D 495/04 252/500 |
| 2015/0129038 | A1 | 5/2015 | Wen et al. |
| 2015/0207076 | A1 | 7/2015 | Tierney et al. |

FOREIGN PATENT DOCUMENTS

| CN | 101875717 A | 11/2010 |
| CN | 102844312 A | 12/2012 |

(Continued)

OTHER PUBLICATIONS

International Search Report from PCT/EP2012/003631 dated Aug. 29, 2012.

(Continued)

*Primary Examiner* — Douglas McGinty
(74) *Attorney, Agent, or Firm* — Millen, White, Zelano & Branigan, P.C.

(57) ABSTRACT

The invention relates to novel polymers containing one or more 4,8-dioxycarbonylalkyl-benzo[1,2-b:4,5-b']dithiophene repeating units or their thioester derivatives, methods for their preparation and monomers used therein, blends, mixtures and formulations containing them, the use of the polymers, blends, mixtures and formulations as semiconductor in organic electronic (OE) devices, especially in organic photovoltaic (OPV) devices, and to OE and OPV devices comprising these polymers, blends, mixtures or formulations.

28 Claims, No Drawings

(56) References Cited

FOREIGN PATENT DOCUMENTS

| CN | 103249799 A | 8/2013 | |
|---|---|---|---|
| EP | 1916250 A1 | 4/2008 | |
| GB | WO 2011131280 A1 * | 10/2011 | ........... C07D 495/04 |
| GB | WO 2012003918 A1 * | 1/2012 | ............ B82Y 10/00 |
| JP | 2005120379 A | 5/2005 | |
| JP | 2008109135 A | 5/2008 | |
| JP | 2011187541 S | 9/2011 | |
| JP | 2013530258 A | 7/2013 | |
| WO | 2010135701 A1 | 11/2010 | |
| WO | 2011/085004 A2 | 7/2011 | |
| WO | WO 2014088795 A1 * | 6/2014 | ......... H01L 51/0036 |

OTHER PUBLICATIONS

Official Action related to corresponding Chinese Patent Application No. 201280047060.8, dated Sep. 29, 2015.
Taiwanese Search Report dated Jul. 25, 2016, issued in corresponding Taiwan Application No. 101135680, 4 pages.
Japanese Office Action dated Jun. 21, 2016, issued in corresponding Japanese Patent Application No. 2014-532258, 8 pages.
English translation Abstract of JP2005120379A published May 12, 2005 (1page).
English translation Abstract of JP2011187541A published Sep. 22, 2011 (1 page).
English translation Abstract of CN101875717A published Nov. 3, 2010 (1 page).
English translation Abstract of JP2008109135A published May 8, 2008 (1 page).
English translation Abstract of JP2013530258A published Jul. 25, 2013 (1 page).

* cited by examiner

CONJUGATED POLYMERS

FIELD OF THE INVENTION

The invention relates to novel polymers containing one or more 4,8-dioxycarbonylalkyl-benzo[1,2-b:4,5-b']dithiophene repeating units or their thioester derivatives, methods for their preparation and monomers used therein, blends, mixtures and formulations containing them, the use of the polymers, blends, mixtures and formulations as semiconductor in organic electronic (OE) devices, especially in organic photovoltaic (OPV) devices, and to OE and OPV devices comprising these polymers, blends, mixtures or formulations.

BACKGROUND OF THE INVENTION

In recent years there has been growing interest in the use of conjugated, semiconducting polymers for electronic applications. One particular area of importance is organic photovoltaics (OPV). Conjugated polymers have found use in OPVs as they allow devices to be manufactured by solution-processing techniques such as spin casting, dip coating or ink jet printing. Solution processing can be carried out cheaper and on a larger scale compared to the evaporative techniques used to make inorganic thin film devices. Currently, polymer based photovoltaic devices are achieving efficiencies up to 8%.

The conjugated polymer serves as the main absorber of the solar energy, therefore a low band gap is a basic requirement of the ideal polymer design to absorb the maximum of the solar spectrum. A commonly used strategy to provide conjugated polymers with narrow band gap is to utilize alternating copolymers consisting of both electron rich donor units and electron deficient acceptor units within the polymer backbone.

However, the conjugated polymers that have been suggested in prior art for use ion OPV devices do still suffer from certain drawbacks. For example many polymers suffer from limited solubility in commonly used organic solvents, which can inhibit their suitability for device manufacturing methods based on solution processing, or show only limited power conversion efficiency in OPV bulk-hetero-junction devices, or have only limited charge carrier mobility, or are difficult to synthesize and require synthesis methods which are unsuitable for mass production.

Therefore, there is still a need for organic semiconducting (OSC) materials that are easy to synthesize, especially by methods suitable for mass production, show good structural organization and film-forming properties, exhibit good electronic properties, especially a high charge carrier mobility, good processibility, especially a high solubility in organic solvents, and high stability in air. Especially for use in OPV cells, there is a need for OSC materials having a low bandgap, which enable improved light harvesting by the photoactive layer and can lead to higher cell efficiencies, compared to the polymers from prior art.

It was an aim of the present invention to provide compounds for use as organic semiconducting materials that do not have the drawbacks of prior art materials as described above, are easy to synthesize, especially by methods suitable for mass production, and do especially show good processibility, high stability, good solubility in organic solvents, high charge carrier mobility, and a low bandgap. Another aim of the invention was to extend the pool of OSC materials available to the expert. Other aims of the present invention are immediately evident to the expert from the following detailed description.

The inventors of the present invention have found that one or more of the above aims can be achieved by providing conjugated polymers containing benzo[1,2-b:4,5-b']dithiophene (hereinafter shortly referred to as "BDT") repeating units that are substituted in 4- and 8-position with an —X—CX—R group, hereinafter also referred to "reverse ester", wherein X is O or S and R is carbyl or hydrocarbyl. It was found that polymers comprising such units are attractive candidates for photovoltaic applications, specifically in bulk heterojunction (BHJ) photovoltaic devices. By the incorporation of the electron-donating BDT unit and an electron-accepting unit into a copolymer i.e. a "donor-acceptor" polymer, a reduction of the bandgap can be achieved, which enables improved light harvesting properties in bulk heterojunction (BHJ) photovoltaic devices. Also, by modifying the BDT core unit with the addition of a reverse ester functionality at the 4- and 8-positions, respectively, the solubility and electronic properties of the copolymer can be further optimised.

U.S. Pat. No. 7,524,922 B2 discloses polymers comprising a BDT unit that is substituted in 4- and 8-position and/or in 3- and 7-position by optionally substituted groups like alkyl which may also contain an ester group.

WO 2010/135701 A1 discloses polymers comprising a BDT unit that is substituted in 4- and 8-position and/or in 3- and 7-position by a group like selected for example from a broad variety including H, CN, alkoxy, thioalkyl, ketone, ester, sulfonate, alkyl, alkenyl, alkynyl, haloalkyl, cycloalkyl, aryl, haloaryl, cycloheteroalkyl and heteroaryl.

However polymers with the specific structure as claimed in the present invention have not been not explicitly disclosed in prior art.

SUMMARY OF THE INVENTION

The invention relates to a conjugated polymer comprising one or more divalent units of formula I

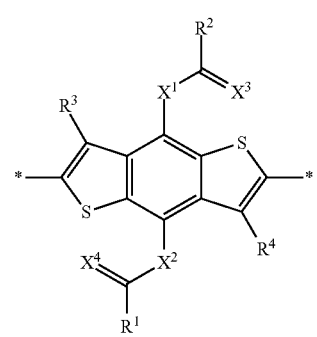

wherein
$X^1$, $X^2$, $X^3$, $X^4$ denote independently of each other, and on each occurrence identically or differently O or S,
$R^1$, $R^2$ denote independently of each other, and on each occurrence identically or differently, straight-chain, branched or cyclic alkyl with 1 to 30 C atoms, preferably 1 to 20 C atoms, in which one or more non-adjacent C atoms are optionally replaced by —O—, —S—, —C(O)—, —C(S)—, —C(O)—O—, —C(S)—O—, —C(S)—S—, —C(O)—S—, —O—C(O)—, —O—C (S)—, —S—C(S)—, —S—C(O)—, —CH=CH— or —C≡C— and which are unsubstituted or substituted by F, Cl, Br, I or CN, $R^3$, $R^4$ denote independently of each other, and on each occurrence identically or differently, H, halogen, or an optionally substituted carbyl or hydrocarbyl group, wherein one or more C atoms are optionally replaced by a hetero atom.

The invention further relates to a conjugated polymer comprising one or more repeating units, wherein said repeating units contain a unit of formula I and/or one or more groups selected from aryl and heteroaryl groups that are optionally substituted, and wherein at least one repeating unit in the polymer contains at least one unit of formula I.

The invention further relates to monomers containing a unit of formula I and further containing one or more reactive groups, which can be used for the preparation of conjugated polymers as described above and below.

The invention further relates to the use of units of formula I as electron donor units in semiconducting polymers.

The invention further relates to a semiconducting polymer comprising one or more units of formula I as electron donor units, and preferably further comprising one or more units having electron acceptor properties.

The invention further relates to the use of the polymers according to the present invention as p-type semiconductor.

The invention further relates to the use of the polymers according to the present invention as electron donor component in semiconducting materials, formulations, blends, devices or components of devices.

The invention further relates to a semiconducting material, formulation, polymer blend, device or component of a device comprising a polymer according to the present invention as electron donor component, and preferably further comprising one or more compounds or polymers having electron acceptor properties.

The invention further relates to a mixture or polymer blend comprising one or more polymers according to the present invention and one or more additional compounds or polymers which are preferably selected from compounds and polymers having one or more of semiconducting, charge transport, hole or electron transport, hole or electron blocking, electrically conducting, photoconducting or light emitting properties.

The invention further relates to a mixture or polymer blend as described above and below, which comprises one or more polymers according to of the present invention and one or more n-type organic semiconductor compounds, preferably selected from fullerenes or substituted fullerenes.

The invention further relates to a formulation comprising one or more polymers, mixtures or polymer blends according to the present invention and optionally one or more solvents, preferably selected from organic solvents.

The invention further relates to the use of a compound, polymer, formulation, mixture or polymer blend according to the present invention as charge transport, semiconducting, electrically conducting, photoconducting or light emitting material, or in an optical, electrooptical, electronic, electroluminescent or photoluminescent device, or in a component of such a device or in an assembly comprising such a device or component.

The invention further relates to a charge transport, semiconducting, electrically conducting, photoconducting or light emitting material comprising a compound, polymer, formulation, mixture or polymer blend according to the present invention.

The invention further relates to an optical, electrooptical, electronic, electroluminescent or photoluminescent device, or a component thereof, or an assembly comprising it, which comprises a compound, polymer, formulation, mixture or polymer blend, or comprises a charge transport, semiconducting, electrically conducting, photoconducting or light emitting material, according to the present invention.

The optical, electrooptical, electronic, electroluminescent and photoluminescent devices include, without limitation, organic field effect transistors (OFET), organic thin film transistors (OTFT), organic light emitting diodes (OLED), organic light emitting transistors (OLET), organic photovoltaic devices (OPV), organic photodetector (OPD), organic solar cells, organic sensor, laser diodes, Schottky diodes, photoconductors and photodetectors.

The components of the above devices include, without limitation, charge injection layers, charge transport layers, interlayers, planarising layers, antistatic films, polymer electrolyte membranes (PEM), conducting substrates and conducting patterns.

The assemblies comprising such devices or components include, without limitation, integrated circuits (IC), radio frequency identification (RFID) tags or security markings or security devices containing them, flat panel displays or backlights thereof, electrophotographic devices, electrophotographic recording devices, organic memory devices, sensor devices, biosensors and biochips.

In addition the compounds, polymers, formulations, mixtures or polymer blends of the present invention can be used as electrode materials in batteries and in components or devices for detecting and discriminating DNA sequences.

DETAILED DESCRIPTION OF THE INVENTION

The monomers and polymers of the present invention are easy to synthesize and exhibit advantageous properties. The conjugated polymers of the present invention show good processability for the device manufacture process, high solubility in organic solvents, and are especially suitable for large scale production using solution processing methods. At the same time, they show a low bandgap, high charge carrier mobility, high external quantum efficiency in BHJ solar cells, good morphology when used in p/n-type blends e.g. with fullerenes, high oxidative stability, and a long lifetime in electronic devices, and are promising materials for organic electronic OE devices, especially for OPV devices with high power conversion efficiency.

The unit of formula I is especially suitable as (electron) donor unit in p-type semiconducting polymers or copolymers, in particular copolymers containing both donor and acceptor units, and for the preparation of mixtures or blends of p-type and n-type semiconductors which are suitable for use in bulk-heterojunction (BHJ) organic photovoltaic (OPV) devices.

In addition, they show the following advantageous properties:

i) The ester side chains improve the solubility of the benzo[1,2-b;4,5-b']dithiophene core versus alkoxy side-chains and thus enhance polymer solubility in non-halogenated solvents that are desired for mass-production printing of OPV modules.

ii) The ester side chains can be readily introduced to the benzo[1,2-b;4,5-b']dithiophene core using inexpensive commercially available acid chlorides in reaction with 2,6-dibromo-benzo[1,2-b;4,5-b']dithiophene-4,8-dione. This facilitates optimization of the ester side chain length to yield the preferred properties in the donor polymer with regard to solubility profile, blend morphology in the bulk-heterojunction, and thermal stability of the bulk-heterojunction.

iii) When using the polymer as donor in a BHJ OPV module together with a fullerene acceptor like $C_{61}$PCBM or $C_{71}$PCBM, the ester side chains can facilitate electron-transfer from the donor polymer to the fullerene acceptor at donor-acceptor interfaces throughout the BHJ layer by providing favourable localized morphology via complimentary intermolecular interactions with the ester side chain located on the $C_{61}$PCBM or $C_{71}$PCBM fullerene acceptor.

The synthesis of the unit of formula I, its functional derivatives, homopolymer, and co-polymers can be achieved based on methods that are known to the skilled person and described in the literature, as will be further illustrated herein.

Above and below, the term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention a polymer means a compound having >1, i.e. at least 2 repeating units, preferably ≥5 repeating units, and an oligomer means a compound with >1 and <10, preferably <5, repeating units.

Above and below, in a formula showing a polymer or a repeating unit, like formula I and its subformulae, an asterisk ("*") denotes a linkage to an adjacent repeating unit or a terminal group in the polymer chain.

The terms "repeating unit" and "monomeric unit" mean the constitutional repeating unit (CRU), which is the smallest constitutional unit the repetition of which constitutes a regular macromolecule, a regular oligomer molecule, a regular block or a regular chain (PAC, 1996, 68, 2291).

The terms "donor" and "acceptor", unless stated otherwise, mean an electron donor or electron acceptor, respectively. "Electron donor" means a chemical entity that donates electrons to another compound or another group of atoms of a compound. "Electron acceptor" means a chemical entity that accepts electrons transferred to it from another compound or another group of atoms of a compound. (see also U.S. Environmental Protection Agency, 2009, Glossary of technical terms, http://www.epa.gov/oust/cat/TUM-GLOSS.HTM).

The term "leaving group" means an atom or group (charged or uncharged) that becomes detached from an atom in what is considered to be the residual or main part of the molecule taking part in a specified reaction (see also PAC, 1994, 66, 1134).

The term "conjugated" means a compound containing mainly C atoms with sp²-hybridisation (or optionally also sp-hybridisation), which may also be replaced by hetero atoms. In the simplest case this is for example a compound with alternating C—C single and double (or triple) bonds, but does also include compounds with units like 1,3-phenylene. "Mainly" means in this connection that a compound with naturally (spontaneously) occurring defects, which may lead to interruption of the conjugation, is still regarded as a conjugated compound.

Unless stated otherwise, the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1, 2, 4-trichlorobenzene. Unless stated otherwise, 1,2,4-trichlorobenzene is used as solvent. The degree of polymerization, also referred to as total number of repeating units, n, means the number average degree of polymerization given as $n=M_n/M_U$, wherein $M_n$ is the number average molecular weight and $M_U$ is the molecular weight of the single repeating unit, see J. M. G. Cowie, *Polymers: Chemistry & Physics of Modern Materials*, Blackie, Glasgow, 1991.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

The term "hetero atom" means an atom in an organic compound that is not a H- or C-atom, and preferably means N, O, S, P, Si, Se, As, Te or Ge.

A carbyl or hydrocarbyl group comprising a chain of 3 or more C atoms may be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more hetero atoms, preferably selected from N, O, S, P, Si, Se, As, Te and Ge.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be straight-chain or branched. The $C_1$-$C_{40}$ carbyl or hydrocarbyl group includes for example: a $C_1$-$C_{40}$ alkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_6$-$C_{12}$ aryl group, and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Aryl and heteroaryl preferably denote a mono-, bi- or tricyclic aromatic or heteroaromatic group with 4 to 30 ring C atoms that may also comprise condensed rings and is optionally substituted with one or more groups L, wherein L is selected from halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, P-Sp-, optionally substituted silyl, or carbyl or hydrocarbyl with 1 to 40 C atoms that is optionally substituted and optionally comprises one or more hetero atoms, and is preferably alkyl, alkoxy, thiaalkyl, alkylcarbonyl, alkoxycarbonyl or alkoxycarbonyloxy with 1 to 20 C atoms that is optionally fluorinated, and R$^0$, R$^{00}$, X$^0$, P and Sp have the meanings given above and below.

Very preferred substituents L are selected from halogen, most preferably F, or alkyl, alkoxy, oxaalkyl, thioalkyl, fluoroalkyl and fluoroalkoxy with 1 to 12 C atoms or alkenyl, alkynyl with 2 to 12 C atoms.

Especially preferred aryl and heteroaryl groups are phenyl in which, in addition, one or more CH groups may be replaced by N, naphthalene, thiophene, selenophene, thienothiophene, dithienothiophene, fluorene and oxazole, all of which can be unsubstituted, mono- or polysubstituted with L as defined above. Very preferred rings are selected from pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene preferably 2-thiophene, selenophene, preferably 2-selenophene, thieno[3,2-b]thiophene, indole, isoindole, benzofuran, benzothiophene, benzodithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, all of which can be unsubstituted, mono- or polysubstituted with L as defined above. Further examples of heteroaryl groups are those selected from the following formulae An alkyl or alkoxy radical, i.e. where the terminal CH$_2$ group is replaced by —O—, can be straight-chain or branched. It is preferably straight-chain, has 2, 3, 4, 5, 6, 7 or 8 carbon atoms and accordingly is preferably ethyl, propyl, butyl, pentyl, hexyl, heptyl, octyl, ethoxy, propoxy, butoxy, pentoxy, hexoxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

An alkenyl group, wherein one or more CH$_2$ groups are replaced by —CH=CH— can be straight-chain or branched. It is preferably straight-chain, has 2 to 10 C atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

Especially preferred alkenyl groups are C$_2$-C$_7$-1E-alkenyl, C$_4$-C$_7$-3E-alkenyl, C$_5$-C$_7$-4-alkenyl, C$_6$-C$_7$-5-alkenyl and C$_{7-6}$-alkenyl, in particular C$_2$-C$_7$-1E-alkenyl, C$_4$-C$_7$-3E-alkenyl and C$_5$-C$_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Groups having up to 5 C atoms are generally preferred.

An oxaalkyl group, i.e. where one CH$_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example. Oxaalkyl, i.e. where one CH$_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one CH$_2$ group is replaced by —O— and one by —C(O)—, these radicals are preferably neighboured. Accordingly these radicals together form a carbonyloxy group —C(O)—O— or an oxycarbonyl group —O—C(O)—. Preferably this group is straight-chain and has 2 to 6 C atoms. It is accordingly preferably acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxy-carbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, 4-(methoxycarbonyl)-butyl.

An alkyl group wherein two or more CH$_2$ groups are replaced by —O— and/or —C(O)O— can be straight-chain or branched. It is preferably straight-chain and has 3 to 12 C atoms. Accordingly it is preferably bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl, 5,5-bis-(ethoxycarbonyl)-hexyl.

A thioalkyl group, i.e where one CH$_2$ group is replaced by —S—, is preferably straight-chain thiomethyl (—SCH$_3$), 1-thioethyl (—SCH$_2$CH$_3$), 1-thiopropyl (=—SCH$_2$CH$_2$CH$_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the CH$_2$ group adjacent to the sp$^2$ hybridised vinyl carbon atom is replaced.

A fluoroalkyl group is preferably straight-chain perfluoroalkyl C$_i$F$_{2i+1}$, wherein i is an integer from 1 to 15, in particular CF$_3$, C$_2$F$_5$, C$_3$F$_7$, C$_4$F$_9$, C$_5$F$_{11}$, C$_6$F$_{13}$, C$_7$F$_{15}$ or C$_8$F$_{17}$, very preferably C$_6$F$_{13}$.

The above-mentioned alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, in particular 2-methylbutyl, 2-methylbutoxy, 2-methylpentoxy, 3-methylpentoxy, 2-ethyl-hexoxy, 1-methylhexoxy, 2-octyloxy, 2-oxa-3-methylbutyl, 3-oxa-4-methylpentyl, 4-methylhexyl, 2-hexyl, 2-octyl, 2-nonyl, 2-decyl, 2-dodecyl, 6-methoxyoctoxy, 6-methyloctoxy, 6-methyloctanoyloxy, 5-methylheptyloxy-carbonyl, 2-methylbutyryloxy, 3-methylvaleryloxy, 4-methylhexanoyloxy, 2-chloropropionyloxy, 2-chloro-3-methylbutyryloxy, 2-chloro-4-methyl-valeryloxy, 2-chloro-3-methylvaleryloxy, 2-methyl-3-oxapentyl, 2-methyl-3-oxahexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Very preferred are 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy and 3-methylbutoxy.

In another preferred embodiment of the present invention, $R^3$ and $R^4$ are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

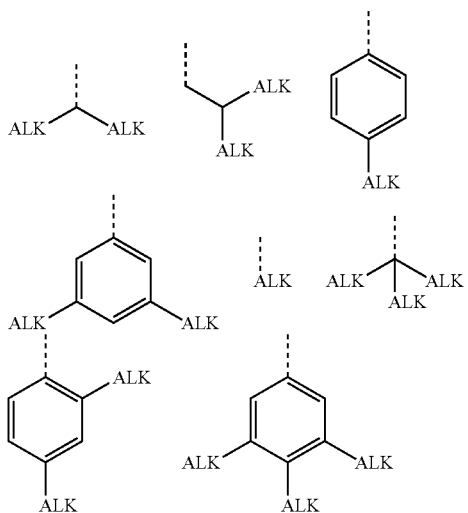

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

—$CY^1$=$CY^2$— is preferably —CH=CH—, —CF=CF— or —CH=C(CN)—.

Halogen is F, Cl, Br or I, preferably F, Cl or Br.

—CO—, —C(=O)— and —C(O)— denote a carbonyl group, i.e.

The units and polymers may also be substituted with a polymerisable or crosslinkable reactive group, which is optionally protected during the process of forming the polymer. Particular preferred units polymers of this type are those comprising one or more units of formula I wherein one or more of $R^{1-4}$ denote or contain a group P-Sp-. These units and polymers are particularly useful as semiconductors or charge transport materials, as they can be crosslinked via the groups P, for example by polymerisation in situ, during or after processing the polymer into a thin film for a semiconductor component, to yield crosslinked polymer films with high charge carrier mobility and high thermal, mechanical and chemical stability.

Preferably the polymerisable or crosslinkable group P is selected from $CH_2$=$CW^1$—C(O)—O—, $CH_2$=$CW^1$—C(O)—,

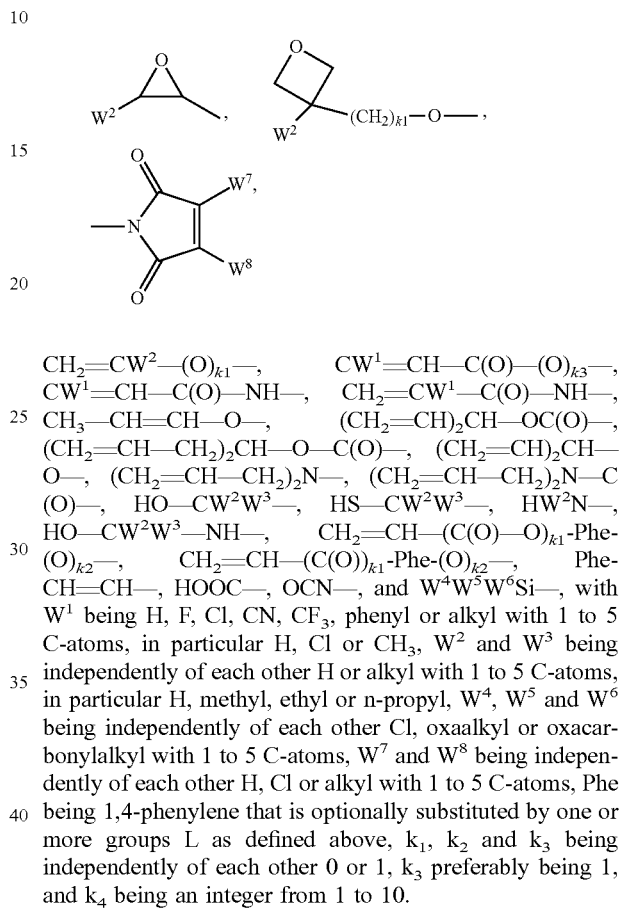

$CH_2$=$CW^2$—(O)$_{k1}$—, $CW^1$=CH—C(O)—(O)$_{k3}$—, $CW^1$=CH—C(O)—NH—, $CH_2$=$CW^1$—C(O)—NH—, $CH_3$—CH=CH—O—, $(CH_2$=CH)$_2$CH—OC(O)—, $(CH_2$=CH—$CH_2)_2$CH—O—C(O)—, $(CH_2$=CH)$_2$CH—O—, $(CH_2$=CH—$CH_2)_2$N—, $(CH_2$=CH—$CH_2)_2$N—C(O)—, HO—$CW^2W^3$—, HS—$CW^2W^3$—, H$W^2$N—, HO—$CW^2W^3$—NH—, $CH_2$=CH—(C(O)—O)$_{k1}$-Phe-(O)$_{k2}$—, $CH_2$=CH—(C(O))$_{k1}$-Phe-(O)$_{k2}$—, Phe-CH=CH—, HOOC—, OCN—, and $W^4W^5W^6$Si—, with $W^1$ being H, F, Cl, CN, $CF_3$, phenyl or alkyl with 1 to 5 C-atoms, in particular H, Cl or $CH_3$, $W^2$ and $W^3$ being independently of each other H or alkyl with 1 to 5 C-atoms, in particular H, methyl, ethyl or n-propyl, $W^4$, $W^5$ and $W^6$ being independently of each other Cl, oxaalkyl or oxacarbonylalkyl with 1 to 5 C-atoms, $W^7$ and $W^8$ being independently of each other H, Cl or alkyl with 1 to 5 C-atoms, Phe being 1,4-phenylene that is optionally substituted by one or more groups L as defined above, $k_1$, $k_2$ and $k_3$ being independently of each other 0 or 1, $k_3$ preferably being 1, and $k_4$ being an integer from 1 to 10.

Alternatively P is a protected derivative of these groups which is non-reactive under the conditions described for the process according to the present invention. Suitable protective groups are known to the ordinary expert and described in the literature, for example in Green, "Protective Groups in Organic Synthesis", John Wiley and Sons, New York (1981), like for example acetals or ketals.

Especially preferred groups P are $CH_2$=CH—C(O)—O—, $CH_2$=C($CH_3$)—C(O)—O—, $CH_2$=CF—C(O)—O—, $CH_2$=CH—O—, $(CH_2$=CH)$_2$CH—O—C(O)—, $(CH_2$=CH)$_2$CH—O—,

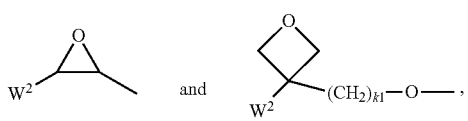

or protected derivatives thereof. Further preferred groups P are selected from the group consisting of vinyloxy, acrylate, methacrylate, fluoroacrylate, chloracrylate, oxetan and epoxy groups, very preferably from an acrylate or methacrylate group.

Polymerisation of group P can be carried out according to methods that are known to the ordinary expert and described in the literature, for example in D. J. Broer; G. Challa; G. N. Mol, *Macromol. Chem.,* 1991, 192, 59.

The term "spacer group" is known in prior art and suitable spacer groups Sp are known to the ordinary expert (see e.g. Pure Appl. Chem. 73(5), 888 (2001). The spacer group Sp is preferably of formula Sp'-X', such that P-Sp- is P-Sp'-X'—, wherein Sp' is alkylene with up to 30 C atoms which is unsubstituted or mono- or polysubstituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —C(O)—, —C(O)O—, —OC(O)—, —OC(O)—O—, —S—C(O)—, —C(O)—S—, —CH=CH— or —C≡C— in such a manner that O and/or S atoms are not linked directly to one another, X' is —O—, —S—, —C(O)—, —C(O)O—, —OC(O)—, —O—C(O)O—, —C(O)—$NR^0$—, —$NR^0$—C(O)—, —$NR^0$—C(O)—$NR^{00}$—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^0$—, —$CY^1$=$CY^2$—, —C≡C—, —CH=CH—C(O)O—, —OC(O)—CH=CH— or a single bond, $R^0$ and $R^{00}$ are independently of each other H or alkyl with 1 to 12 C-atoms, and $Y^1$ and $Y^2$ are independently of each other H, F, Cl or CN. X' is preferably —O—, —S—, —$OCH_2$—, —$CH_2O$—, —$SCH_2$—, —$CH_2S$—, —$CF_2O$—, —$OCF_2$—, —$CF_2S$—, —$SCF_2$—, —$CH_2CH_2$—, —$CF_2CH_2$—, —$CH_2CF_2$—, —$CF_2CF_2$—, —CH=N—, —N=CH—, —N=N—, —CH=$CR^0$—, —$CY^1$=$CY^2$—, —C≡C— or a single bond, in particular —O—, —S—, —C≡C—, —$CY^1$=$CY^2$— or a single bond. In another preferred embodiment X' is a group that is able to form a conjugated system, such as —C≡C— or —$CY^1$=$CY^2$—, or a single bond.

Typical groups Sp' are, for example, —$(CH_2)_p$—, —$(CH_2CH_2O)_q$—$CH_2CH_2$—, —$CH_2CH_2$—S—$CH_2CH_2$— or —$CH_2CH_2$—NH—$CH_2CH_2$— or —($SiR^0R^{00}$—O)$_p$—, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethylene-oxyethylene, methyleneoxybutylene, ethylene-thioethylene, ethylene-N-methyl-iminoethylene, 1-methylalkylene, ethenylene, propenylene and butenylene for example.

Preferably $R^3$ and $R^4$ in formula I are selected from straight-chain, branched or cyclic alkyl with 1 to 30 C atoms, preferably 1 to 20 C atoms, in which one or more non-adjacent C atoms are optionally replaced by —O—, —S—, —C(O)—, —C(S)—, —C(O)—O—, —C(S)—O—, —C(S)—S—, —C(O)—S—, —O—C(O)—, —O—C(S)—, —S—C(S)—, —S—C(O)—, —CH=CH— or —C≡C— and which are unsubstituted or substituted by F, Cl, Br, I or CN.

Preferably $X^3$ and $X^4$ in formula I are O.

Further preferably $X^1$ and $X^2$ in formula I are O.

Preferred units of formula I are those wherein $X^1$ and $X^2$ are O or S and $X^3$ and $X^4$ are O.

Further preferred units of formula I are those wherein $X^1$, $X^2$, $X^3$ and $X^4$ are O.

Further preferred units of formula I are those wherein $X^1$ and $X^2$ are S and $X^3$ and $X^4$ are O.

Further preferred units of formula I are those wherein $X^1$, $X^2$, $X^3$ and $X^4$ are S.

Preferred polymers according to the present invention comprise one or more repeating units of formula II:

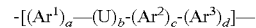   II wherein

U is a unit of formula I, $Ar^1$, $Ar^2$, $Ar^3$ are, on each occurrence identically or differently, and independently of each other, aryl or heteroaryl that is different from U, preferably has 5 to 30 ring atoms, and is optionally substituted, preferably by one or more groups $R^S$, $R^S$ is on each occurrence identically or differently F, Br, Cl, —CN, —NC, —NCO, —NCS, —OCN, —SCN, —C(O) $NR^0R^{00}$, —$C(O)X^0$, —$C(O)R^0$, —$C(O)OR^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, carbyl or hydrocarbyl with 1 to 40 C atoms that is optionally substituted and optionally comprises one or more hetero atoms, or P-Sp-, $R^0$ and $R^{00}$ are independently of each other H or optionally substituted $C_{1-40}$ carbyl or hydrocarbyl, P is a polymerisable or crosslinkable group, Sp is a spacer group or a single bond, $X^0$ is halogen, preferably F, Cl or Br, a, b and c are on each occurrence identically or differently 0, 1 or 2, d is on each occurrence identically or differently 0 or an integer from 1 to 10, wherein the polymer comprises at least one repeating unit of formula II wherein b is at least 1.

Further preferred polymers according to the present invention comprise, in addition to the units of formula I or II, one or more repeating units selected from monocyclic or polycyclic aryl or heteroaryl groups that are optionally substituted.

These additional repeating units are preferably selected of formula III

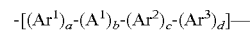   III wherein $Ar^1$, $Ar^2$, $Ar^3$, a, b, c and d are as defined in formula II, and $A^1$ is an aryl or heteroaryl group that is different from U and $Ar^{1-3}$, preferably has 5 to 30 ring atoms, is optionally substituted by one or more groups $R^S$ as defined above and below, and is preferably selected from aryl or heteroaryl groups having electron acceptor properties, wherein the polymer comprises at least one repeating unit of formula III wherein b is at least 1.

$R^s$ preferably has one of the meanings given for $R^1$ or $R^3$.

The conjugated polymers according to the present invention are preferably selected of formula IV:

   IV wherein

A is a unit of formula I or II or its preferred subformulae,

B is a unit that is different from A and comprises one or more aryl or heteroaryl groups that are optionally substituted, and is preferably selected of formula III, x is >0 and ≤1,
y is ≥0 and <1,
x+y is 1, and
n is an integer >1.

Preferred polymers of formula IV are selected of the following formulae

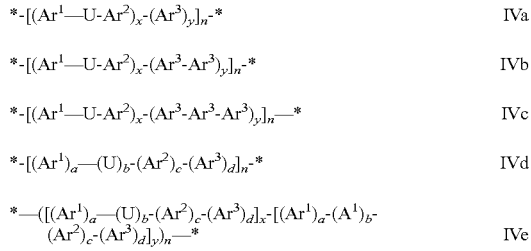

*-[(Ar¹—U-Ar²)$_x$-(Ar³)$_y$]$_n$-*  IVa

*-[(Ar¹—U-Ar²)$_x$-(Ar³-Ar³)$_y$]$_n$-*  IVb

*-[(Ar¹—U-Ar²)$_x$-(Ar³-Ar³-Ar³)$_y$]$_n$—*  IVc

*-[(Ar¹)$_a$—(U)$_b$-(Ar²)$_c$-(Ar³)$_d$]$_n$-*  IVd

*—([(Ar¹)$_a$—(U)$_b$-(Ar²)$_c$-(Ar³)$_d$]$_x$-[(Ar¹)$_a$-(A¹)$_b$-(Ar²)$_c$-(Ar³)$_d$]$_y$)$_n$—*  IVe wherein U, Ar¹, Ar², Ar³, a, b, c and d have in each occurrence identically or differently one of the meanings given in formula II, A¹ has on each occurrence identically or differently one of the meanings given in formula III, and x, y and n are as defined in formula IV, wherein these polymers can be alternating or random copolymers, and wherein in formula IVd and IVe in at least one of the repeating units [(Ar¹)$_a$—(U)$_b$-(Ar²)$_c$-(Ar³)$_d$] and in at least one of the repeating units [(Ar¹)$_a$-(A¹)$_b$-(Ar²)$_c$-(Ar³)$_d$] b is at least 1.

In the polymers according to the present invention, the total number of repeating units n is preferably from 2 to 10,000. The total number of repeating units n is preferably ≥5, very preferably ≥10, most preferably ≥50, and preferably ≤500, very preferably ≤1,000, most preferably ≤2,000, including any combination of the aforementioned lower and upper limits of n.

The polymers of the present invention include homopolymers and copolymers, like statistical or random copolymers, alternating copolymers and block copolymers, as well as combinations thereof.

Especially preferred are polymers selected from the following groups:
  Group A consisting of homopolymers of the unit U or (Ar¹—U) or (Ar¹—U-Ar²) or (Ar¹—U-Ar³) or (U-Ar²-Ar³) or (Ar¹—U-Ar²-Ar³), i.e. where all repeating units are identical,
  Group B consisting of random or alternating copolymers formed by identical units (Ar¹—U-Ar²) and identical units (Ar³),
  Group C consisting of random or alternating copolymers formed by identical units (Ar¹—U-Ar²) and identical units (A¹),
  Group D consisting of random or alternating copolymers formed by identical units (Ar¹—U-Ar²) and identical units (Ar¹-A¹-Ar²),
wherein in all these groups U, A¹, Ar¹, Ar² and Ar³ are as defined above and below, in groups A, B and C Ar¹, Ar² and Ar³ are different from a single bond, and in group D one of Ar¹ and Ar² may also denote a single bond.

Preferred polymers of formula IV and IVa to IVe are selected of formula V

R⁵-chain-R⁶  V wherein "chain" denotes a polymer chain of formulae IV or IVa to IVe, and R⁵ and R⁶ have independently of each other one of the meanings of R' as defined above, and preferably denote, independently of each other, H, F, Br, Cl, I, —CH$_2$Cl, —CHO, —CR'=CR"$_2$, —SiR'R"R''', —SiR'X'X", —SiR'R"X', —SnR'R"R''', —BR'R", —B(OR')(OR"), —B(OH)$_2$, —O—SO$_2$—R', —C≡CH, —C≡C—SiR'$_3$, —ZnX', P-Sp- or an endcap group, wherein P and Sp are as defined in formula II, X' and X" denote halogen, R', R" and R''' have independently of each other one of the meanings of R⁰ given in formula I, and two of R', R" and R''' may also form a ring together with the hetero atom to which they are attached.

In the polymers represented by formula IV, IVa to IVe and V, x denotes the mole fraction of units A, y denotes the mole fraction of units B, and n denotes the degree of polymerisation or total number of units A and B. These formulae includes block copolymers, random or statistical copolymers and alternating copolymers of A and B, as well as homopolymers of A for the case when x is >0 and y is 0.

Another aspect of the invention relates to monomers of formula VI

R⁵-(Ar¹)$_a$—U-(Ar²)$_b$—R⁶  VI wherein U, Ar¹, Ar², R⁵, R⁶, a and b have the meanings of formula II and V, or one of the preferred meanings as described above and below.

Especially preferred are monomers of the following formulae

R⁵-Ar¹—U-Ar²—R⁶  VI1

R⁵—U—R⁶  VI2

R⁵-Ar¹—U—R⁶  VI3

R⁵—U-Ar²—R⁶  VI4 wherein U, Ar¹, Ar², R⁵ and R⁶ are as defined in formula VI.

Especially preferred are monomers of formula VI wherein R⁵ and R⁶ are, preferably independently of each other, selected from the group consisting of Cl, Br, I, O-tosylate, O-triflate, O-mesylate, O-nonaflate, —SiMe$_2$F, —SiMeF$_2$, —O—SO$_2$Z¹, —B(OZ²)$_2$, —CZ³=C(Z³)$_2$, —C≡CH, —C≡CSi(Z¹)$_3$, —ZnX⁰ and —Sn(Z⁴)$_3$, wherein X⁰ is halogen, preferably Cl, Br or I, Z$^{1-4}$ are selected from the group consisting of alkyl and aryl, each being optionally substituted, and two groups Z² may also together form a cyclic group.

Preferably R¹ and/or R² denote independently of each other straight-chain or branched alkyl with 1 to 20 C atoms which is unsubstituted or substituted by one or more F atoms.

Especially preferred are repeating units, monomers and polymers of formulae I, II, III, IV, IVa to IVe, V, VI and their subformulae wherein one or more of Ar¹, Ar² and Ar³ denote aryl or heteroaryl, preferably having electron donor properties, selected from the group consisting of the following formulae

(D1)

(D2)

-continued
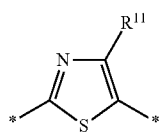
(D3)
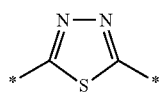
(D4)
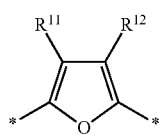
(D5)
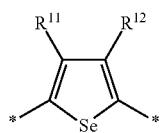
(D6)
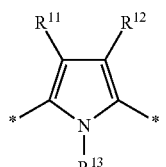
(D7)
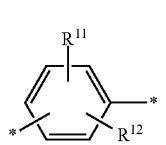
(D8)
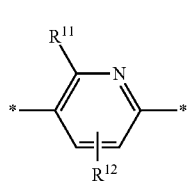
(D9)
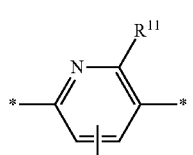
(D10)
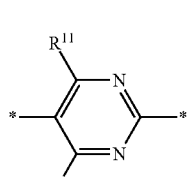
(D11)
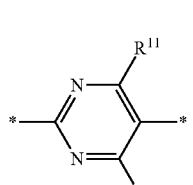
(D12)
-continued
(D13)
(D14)
(D15)
(D16)
(D17)
(D18)
(D19)
(D20)
(D21)
(D22)
(D23)

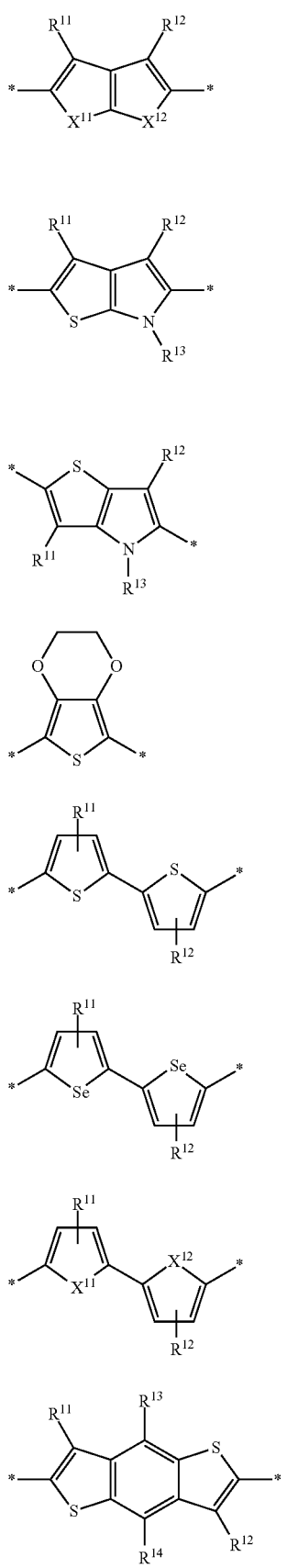
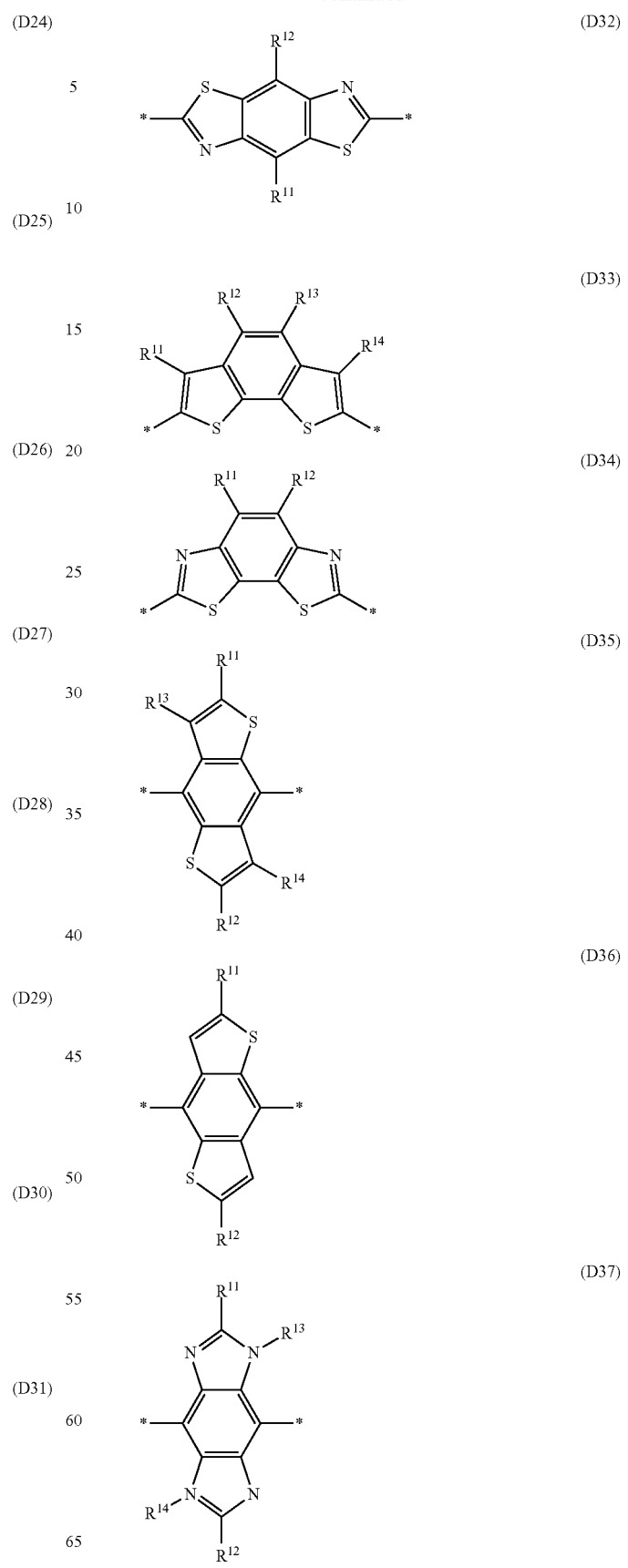

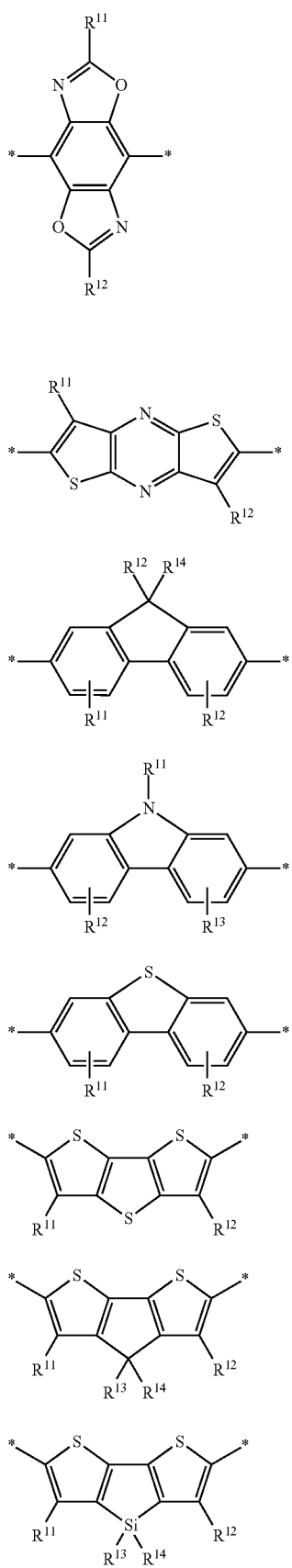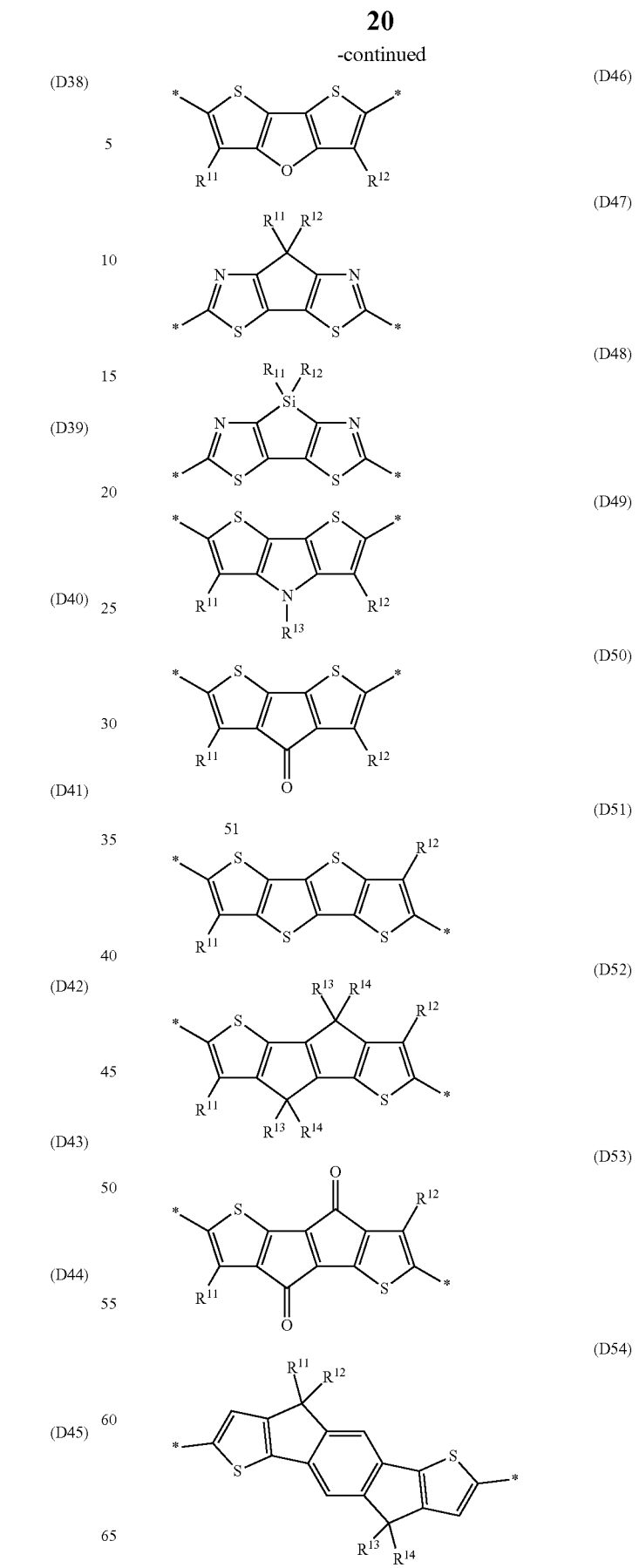

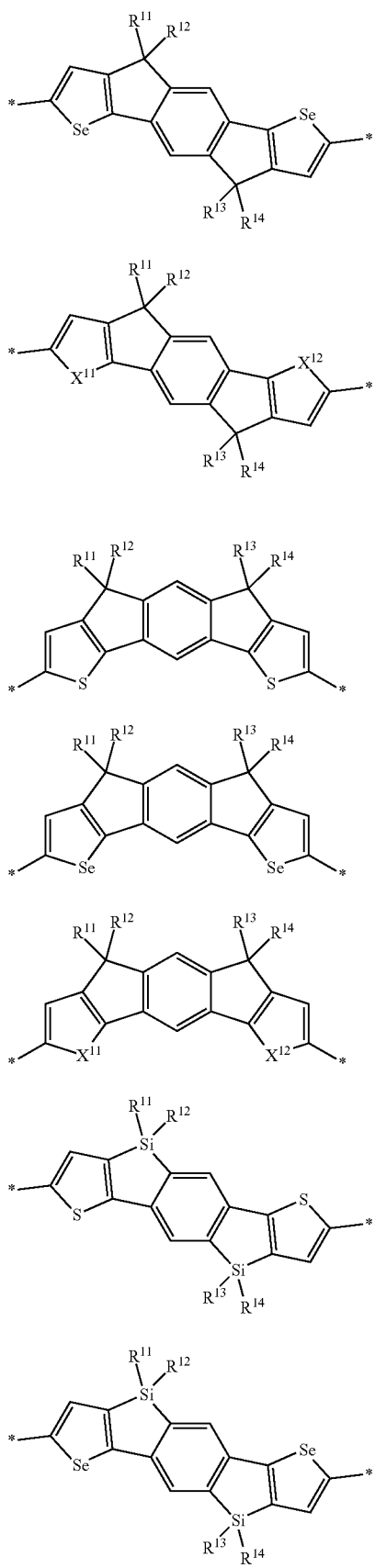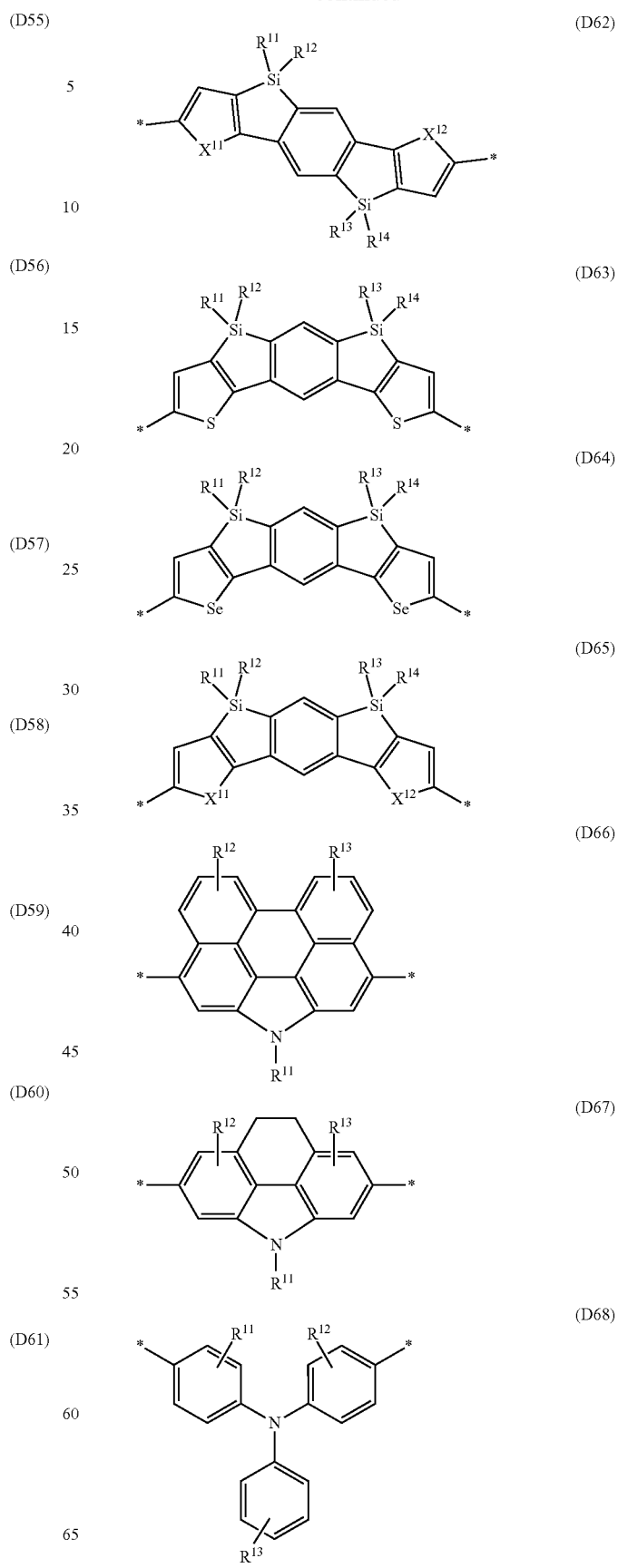

(D69) 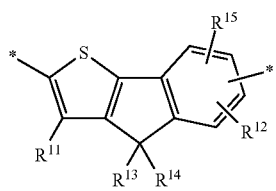
(D70) 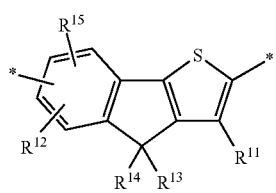
(D71) 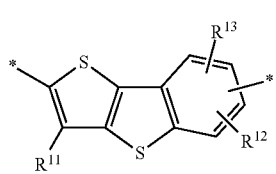
(D72) 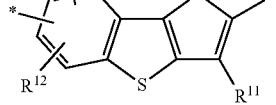
(D73) 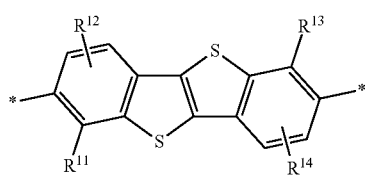
(D74) 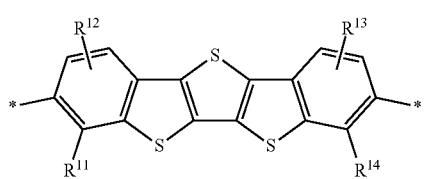
(D75) 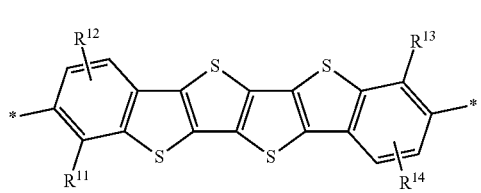
(D76) 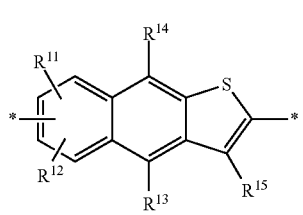
(D77) 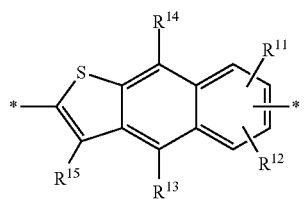
(D78) 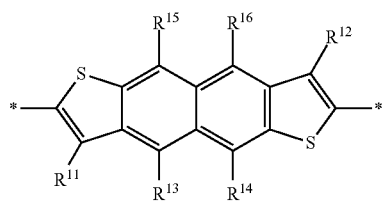
(D79) 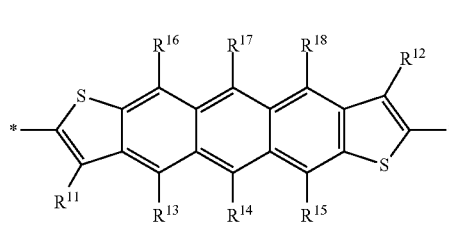
(D80) 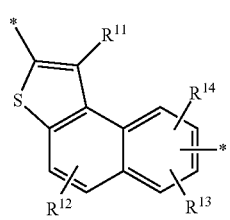
(D81) 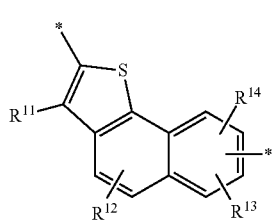
(D82) 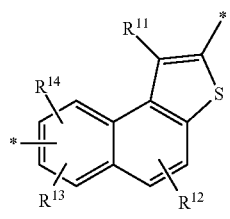
(D83) 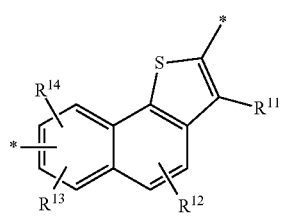

-continued
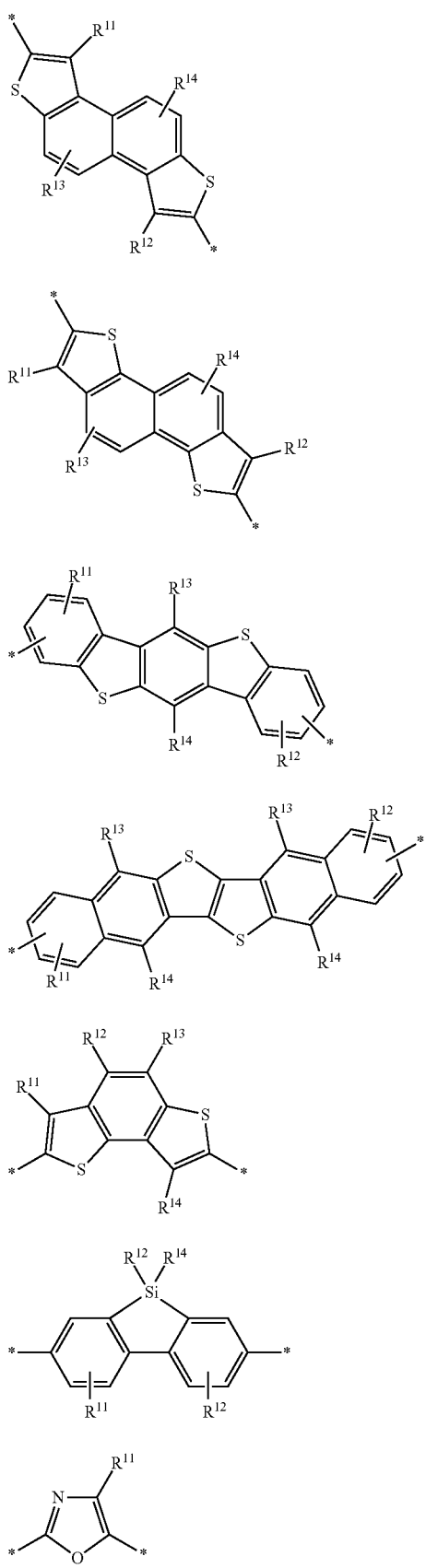
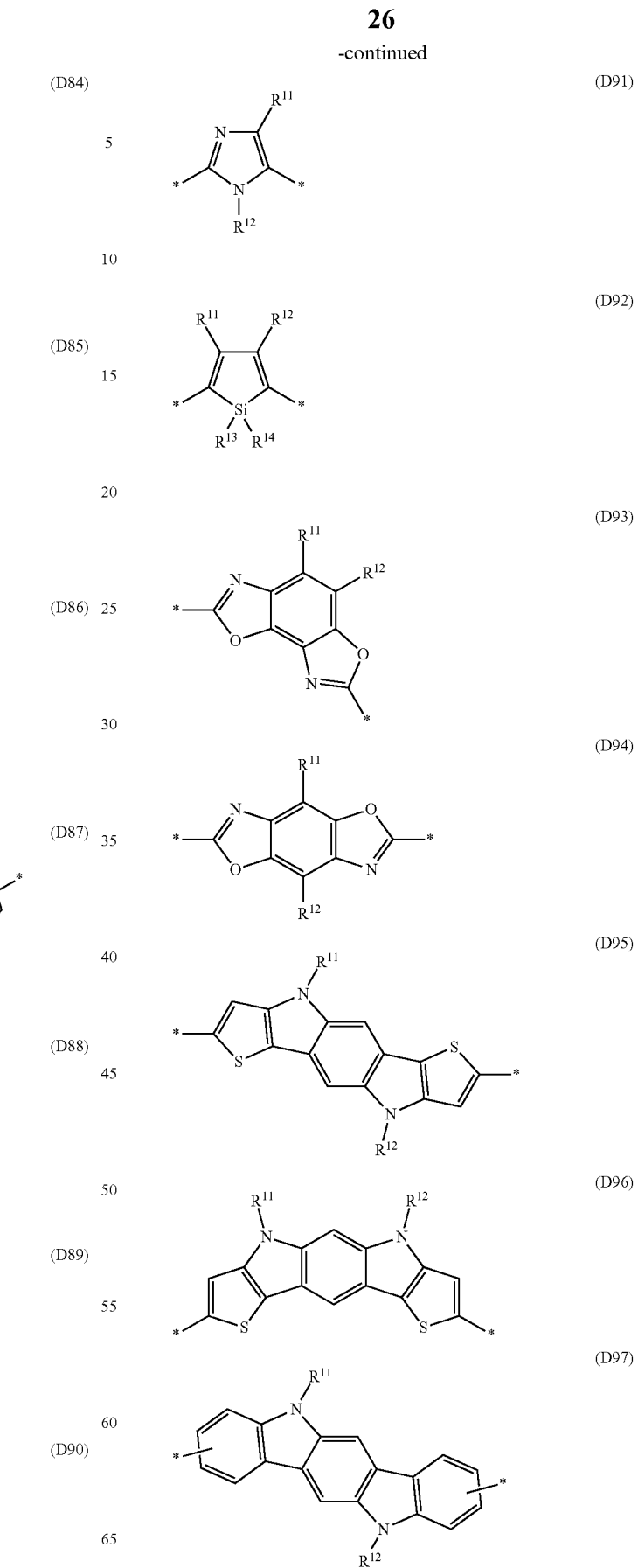

-continued

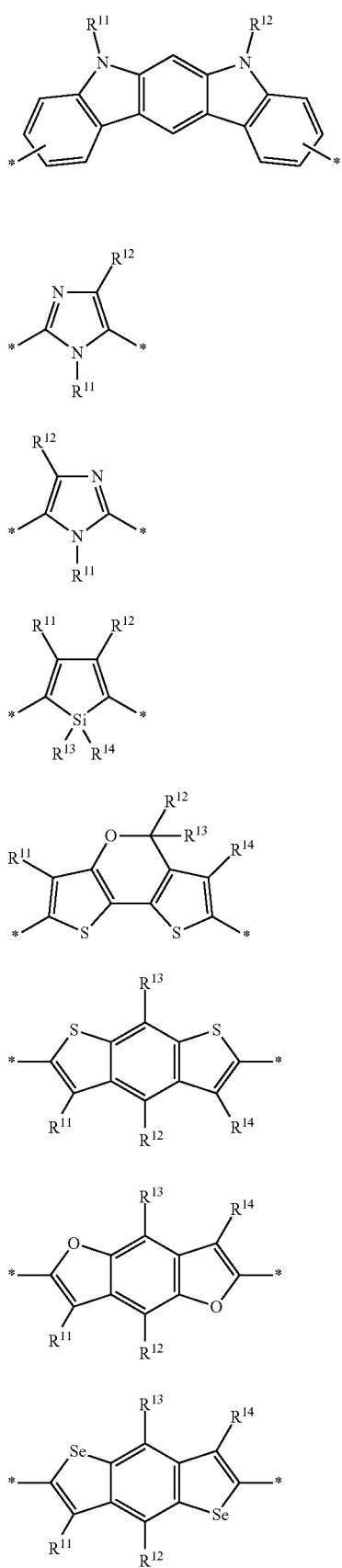

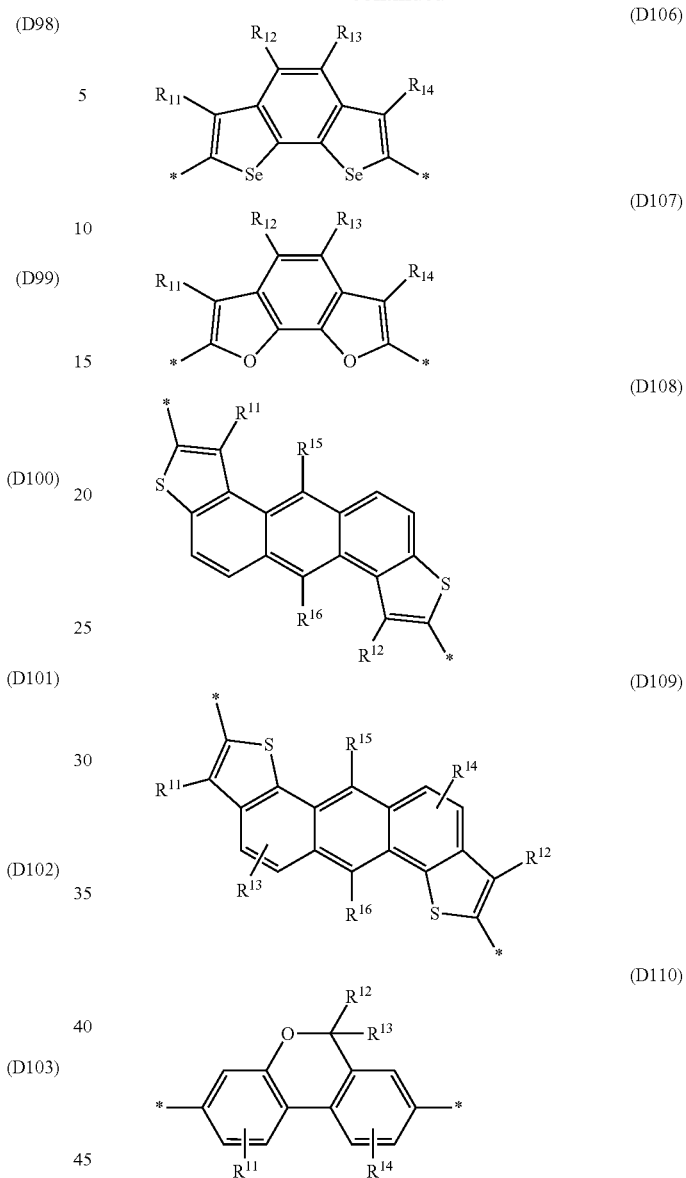

wherein one of $X^{11}$ and $X^{12}$ is S and the other is Se, and $R^{11}$, $R^{12}$, $R^{13}$, $R^{14}$, $R^{15}$, $R^{16}$, $R^{17}$, and $R^{18}$ independently of each other denote H or have one of the meanings of $R^3$ as defined above and below.

Preferably one or more of $Ar^1$, $Ar^2$ and $Ar^3$ are selected from the group consisting of formulae D1, D2, D3, D4, D5, D6, D7, D19, D21, D23, D28, D29 and D30, very preferably from formulae D1, D2, D3, D5, D19 and D28.

In another preferred embodiment invention in formula D1 $R^{11}$ and $R^{12}$ denote H or F. In another preferred embodiment of the present invention in formulae D2, D5, D6, D19, D20 and D28 $R^{11}$ and $R^{12}$ denote H or F.

Further preferred are repeating units, monomers and polymers of formulae I, II, III, IV, IVa to IVe, V, VI and their subformulae wherein one or more of $Ar^3$ and $A^1$ denote aryl or heteroaryl, preferably having electron acceptor properties, selected from the group consisting of the following formulae

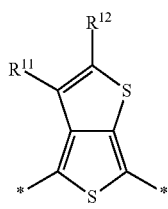 (A1)
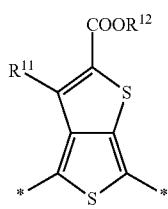 (A2)
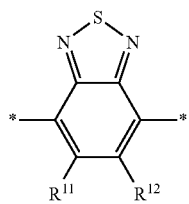 (A3)
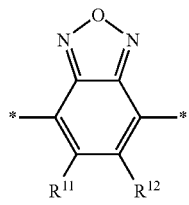 (A4)
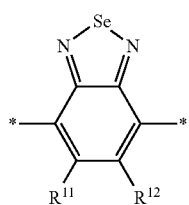 (A5)
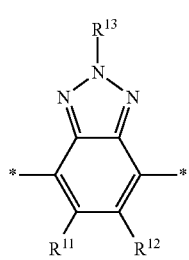 (A6)
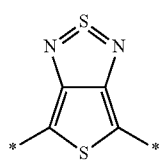 (A7)
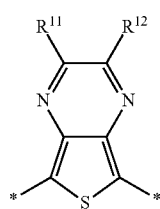 (A8)
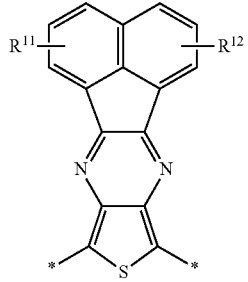 (A9)
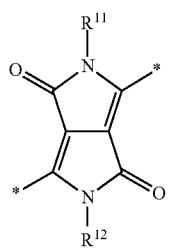 (A10)
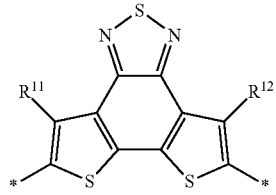 (A11)
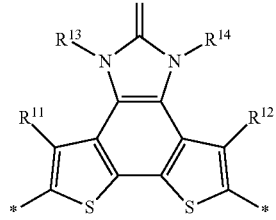 (A12)
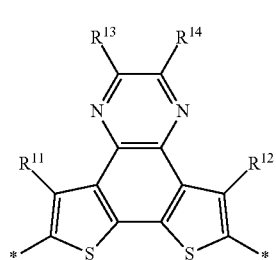 (A13)

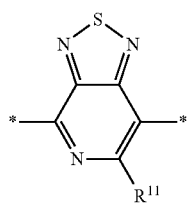 (A14)
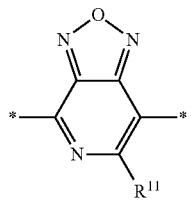 (A15)
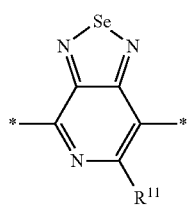 (A16)
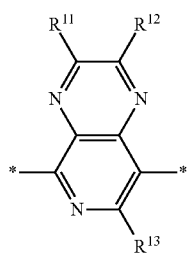 (A17)
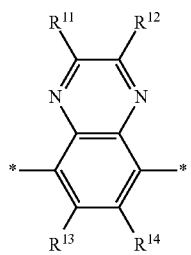 (A18)
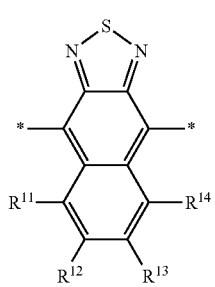 (A19)
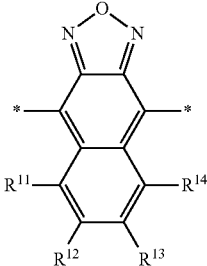 (A20)
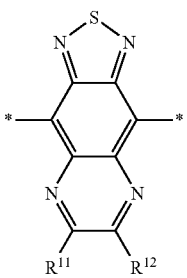 (A21)
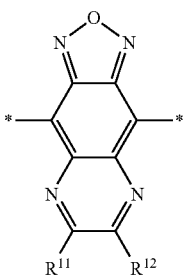 (A22)
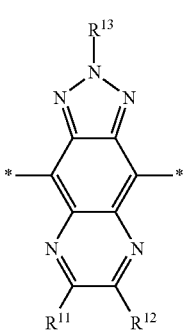 (A23)
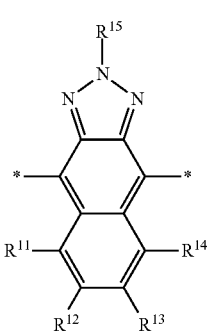 (A24)

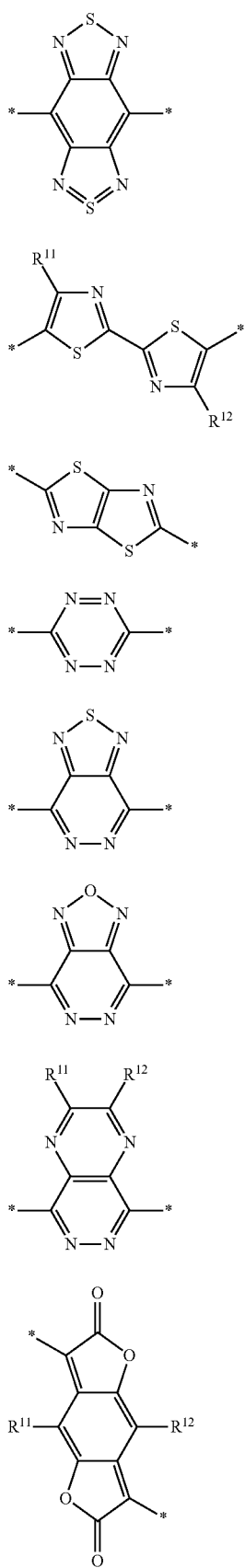
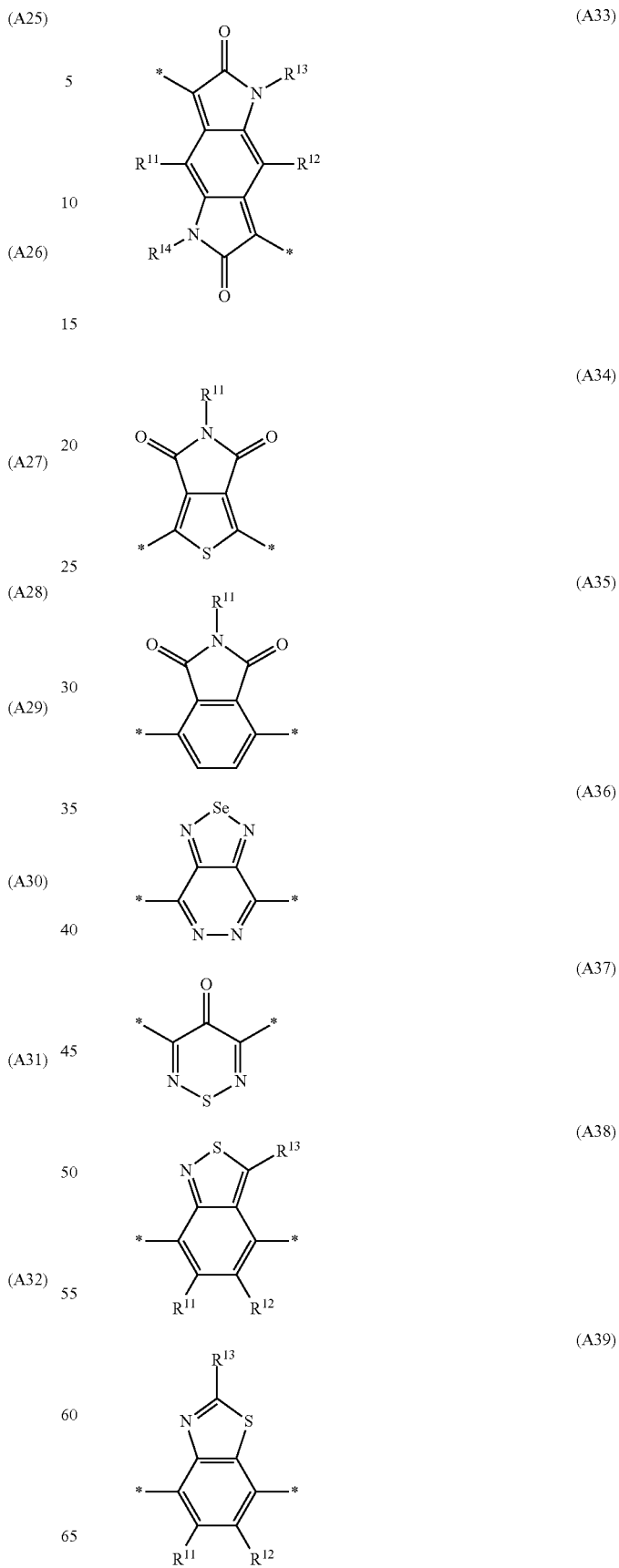

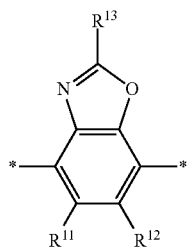 (A40)
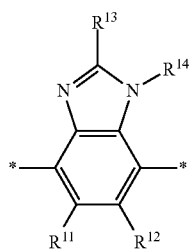 (A41)
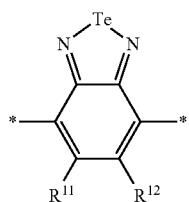 (A42)
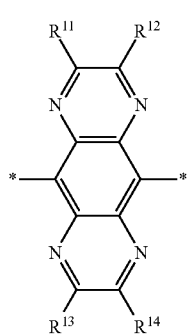 (A43)
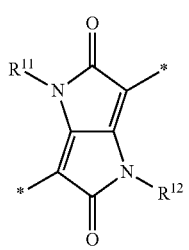 (A44)
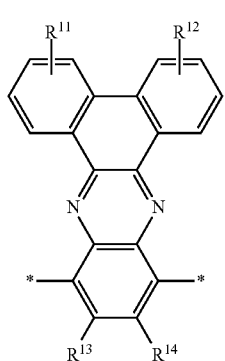 (A45)
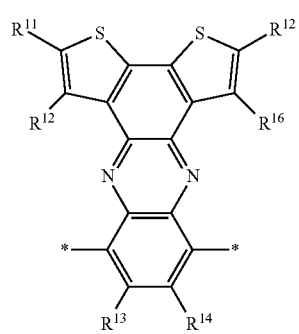 (A46)
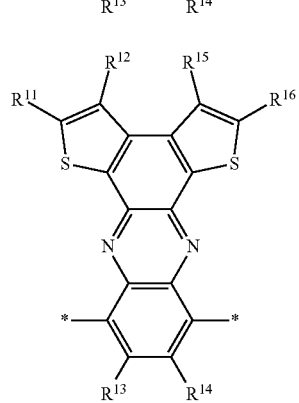 (A47)
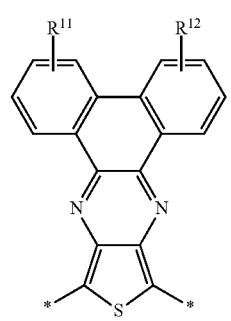 (A48)
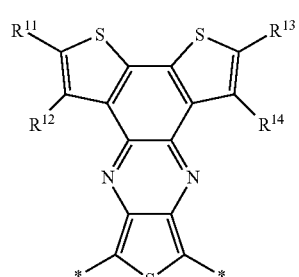 (A49)
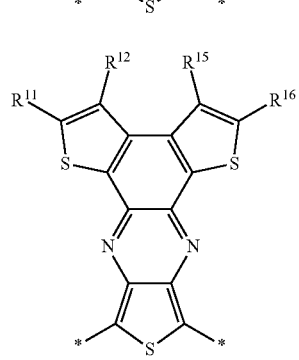 (A50)

(A51)

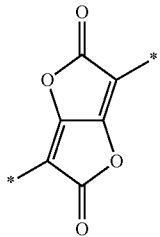

(A52)

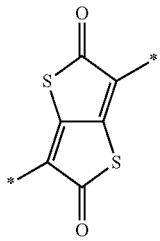

(A53)

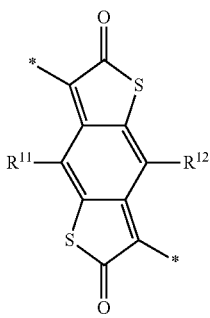

(A54)

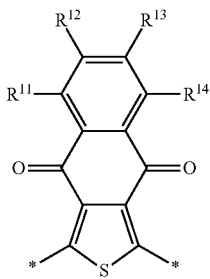

(A55)

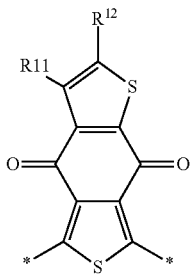

(A56)

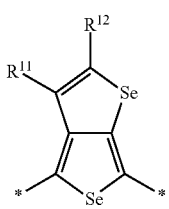

(A57)

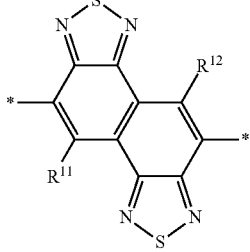

wherein one of $X^{11}$ and $X^{12}$ is S and the other is Se, and $R^{11}$, $R^{12}$, $R^{13}$, $R^{14}$ and $R^{15}$ independently of each other denote H or have one of the meanings of $R^3$ as defined above and below.

Preferably one or more of $Ar^3$ and $A^1$ are selected from the group consisting of formulae A1, A2, A3, A4, A5, A38 and A44, very preferably from formulae A2 and A3.

Further preferred are repeating units, monomers and polymers of formulae I, II, III, IV, IVa to IVe, V, VI and their subformulae selected from the following list of preferred embodiments:

$X^3$ and $X^4$ are O,
$X^1$ and $X^2$ are O,
$X^1$, $X^2$, $X^3$ and $X^4$ are O,
$X^1$ and $X^2$ are S and $X^3$ and $X^4$ are O,
$X^1$, $X^2$, $X^3$ and $X^4$ are S,
$X^1$ and $X^2$ are O or S and $X^3$ and $X^4$ are O,
y is $\geq 0$ and $\leq 1$,
b=d=1 and a=c=0, preferably in all repeating units,
a=b=c=d=1, preferably in all repeating units,
a=b=d=1 and c=0, preferably in all repeating units,
a=b=c=1 and d=0, preferably in all repeating units,
a=c=2, b=1 and d=0, preferably in all repeating units,
a=c=2 and b=d=1, preferably in all repeating units,
n is at least 5, preferably at least 10, very preferably at least 50, and up to 2,000, preferably up to 500.
$M_w$ is at least 5,000, preferably at least 8,000, very preferably at least 10,000, and preferably up to 300,000, very preferably up to 100,000,
$R^1$ and/or $R^2$ are independently of each other selected from the group consisting of primary alkyl with 1 to 30 C atoms, preferably 1 to 20 C atoms, secondary alkyl with 3 to 30 C atoms, and tertiary alkyl with 4 to 30 C atoms, wherein in all these groups one or more H atoms are optionally replaced by F,
$R^3$ and/or $R^4$ denote H,
$R^3$ and/or $R^4$ are independently of each other selected from the group consisting of primary alkyl or alkoxy with 1 to 30 C atoms, secondary alkyl or alkoxy with 3 to 30 C atoms, and tertiary alkyl or alkoxy with 4 to 30 C atoms, wherein in all these groups one or more H atoms are optionally replaced by F,
$R^3$ and/or $R^4$ are independently of each other selected from the group consisting of aryl, heteroaryl, aryloxy, heteroaryloxy, each of which is optionally alkylated or alkoxylated and has 4 to 30 ring atoms,
$R^3$ and/or $R^4$ are independently of each other selected from the group consisting of alkyl, alkoxy, alkylcarbonyl, alkoxycarbonyl and alkylcarbonyloxy, all of which are straight-chain or branched, are optionally fluorinated, and have from 1 to 30 C atoms, and aryl, aryloxy, heteroaryl and heteroaryloxy, all of which are optionally alkylated or alkoxylated and have 4 to 30 ring atoms, R³ and/or R⁴ denote independently of each other F, Cl, Br, I, CN, R⁷, —C(O)—R⁷, —C(O)—O—R⁷, or —O—C(O)—R⁷, wherein R⁷ is straight-chain, branched or cyclic alkyl with 1 to 30 C atoms, in which one or more non-adjacent C atoms are optionally replaced by —O—, —S—, —C(O)—, —C(O)—O—, —O—C(O)—, —O—C(O)—O—, —CR⁰=CR⁰⁰— or —C≡C— and in which one or more H atoms are optionally replaced by F, Cl, Br, I or CN, or R³ and/or R⁴ denote independently of each other aryl, aryloxy, heteroaryl or heteroaryloxy having 4 to 30 ring atoms which is unsubstituted or which is substituted by one or more halogen atoms or by one or more groups R⁷, —C(O)—R⁷, —C(O)—O—R⁷, or —O—C(O)—R⁷ as defined above, R⁷ is primary alkyl with 1 to 30 C atoms, very preferably with 1 to 15 C atoms, secondary alkyl with 3 to 30 C atoms, or tertiary alkyl with 4 to 30 C atoms, wherein in all these groups one or more H atoms are optionally replaced by F, R⁰ and R⁰⁰ are selected from H or $C_1$-$C_{10}$-alkyl, R⁵ and R⁶ are selected from H, halogen, —CH₂Cl, —CHO, —CH=CH₂—SiR'R''R''', —SnR'R''R''', —BR'R'', —B(OR')(OR''), —B(OH)₂, P-Sp, $C_1$-$C_{20}$-alkyl, $C_1$-$C_{20}$-alkoxy, $C_2$-$C_{20}$-alkenyl, $C_1$-$C_{20}$-fluoroalkyl and optionally substituted aryl or heteroaryl, R⁵ and R⁶ are, preferably independently of each other, selected from the group consisting of Cl, Br, I, O-tosylate, O-triflate, O-mesylate, O-nonaflate, —SiMe₂F, —SiMeF₂, —O—SO₂Z¹, —B(OZ²)₂, —CZ³=C(Z⁴)₂, —C≡CH, C≡CSi(Z¹)₃, —ZnX⁰ and —Sn(Z⁴)₃, wherein X⁰ is halogen, $Z^{1-4}$ are selected from the group consisting of alkyl and aryl, each being optionally substituted, and two groups Z² may also form a cyclic group.

Preferred polymers of the present invention are selected from the following formulae:

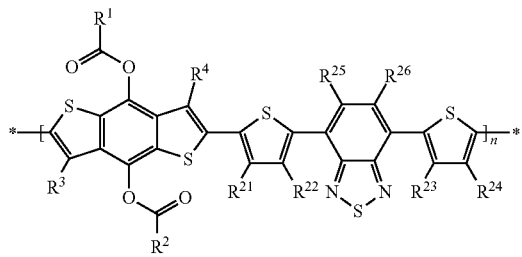

I1

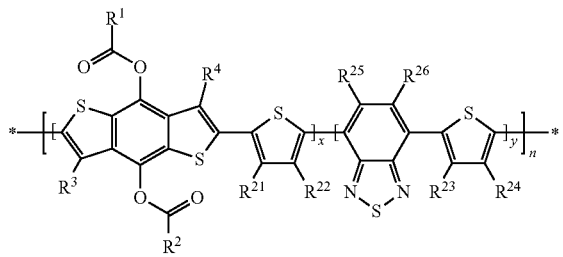

I2

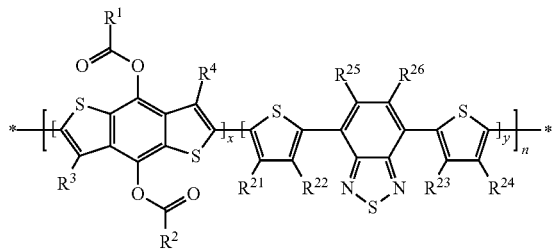

I3

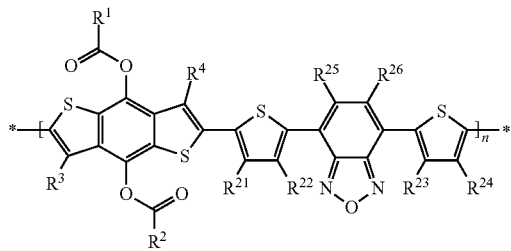

I4

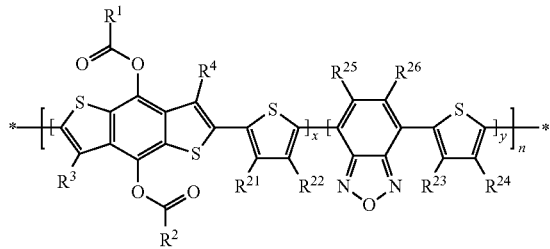

I5

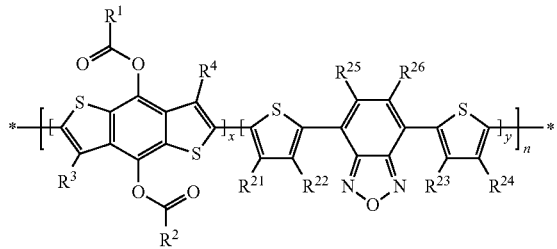

I6

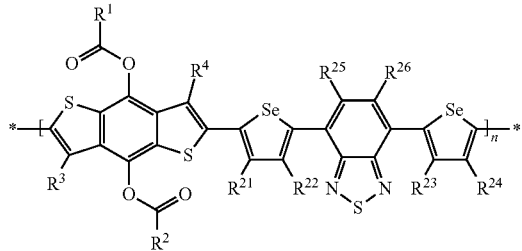

I7

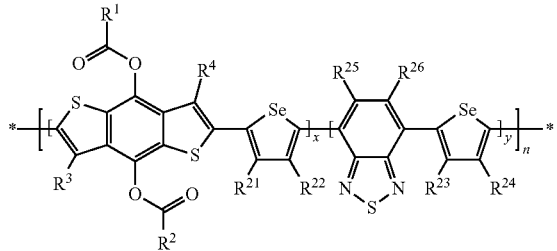

I8

-continued
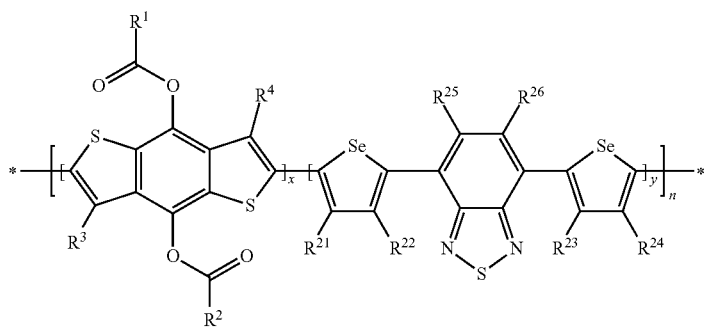
I9
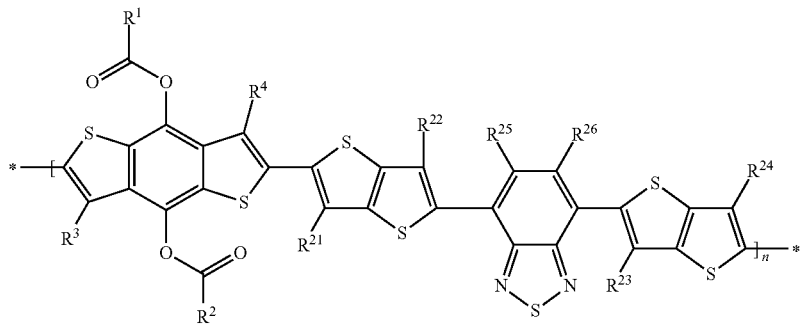
I10
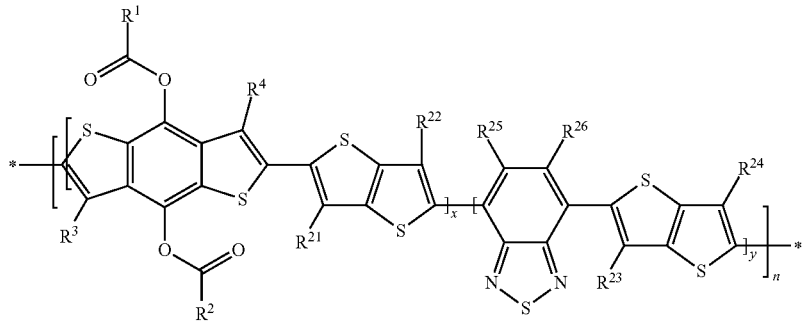
I11
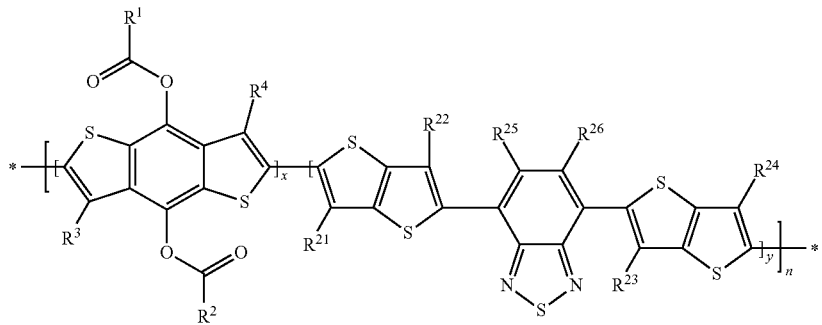
I12
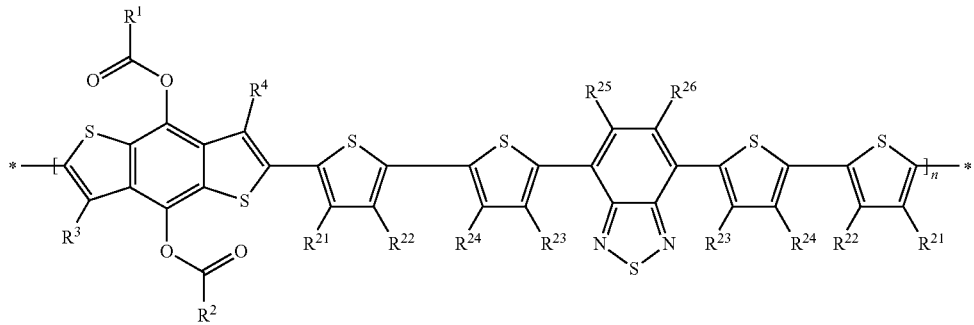
I13

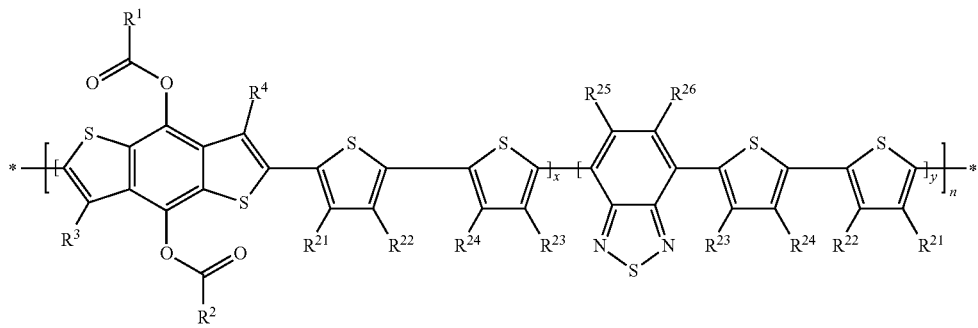

I14

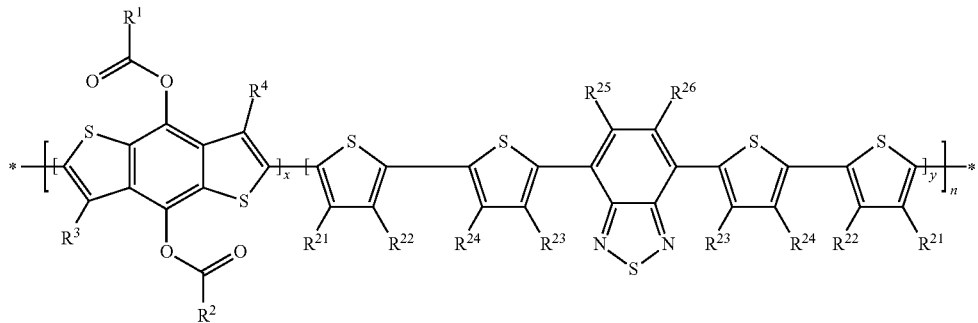

I15

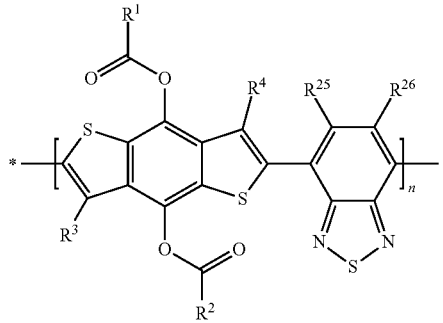

I16

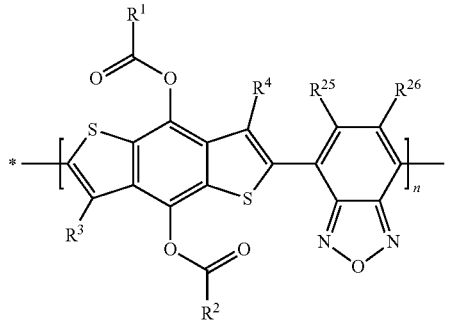

I17 wherein R¹, R², R³ and R⁴ have the meanings given in formula I or one of the preferred meanings given above and below, n, x and y have the meanings given in formula IV, and R²¹, R²², R²³, R²⁴, R²⁵ and R²⁶ have independently of each other one of the meanings of R³.

Preferred are polymers of formulae I1-I15 wherein $R^{22}$ and $R^{23}$ denote H. Further preferred are polymers of formulae I1-I15 wherein $R^{21}$, $R^{22}$, $R^{23}$ and $R^{24}$ denote H. Further preferred are polymers of formulae I1-I15 wherein $R^{25}$ and $R^{26}$ are different from H. Further preferred are polymers of formulae I1-I15 wherein $R^{21}$, $R^{22}$, $R^{23}$ and $R^{24}$ denote H and $R^{25}$ and $R^{26}$ are different from H. If $R^{25}$ and $R^{26}$ are different from H, they are preferably selected from alkyl, alkoxy, alkylcarbonyl, alkoxycarbonyl and alkylcarbonyloxy, all of which are straight-chain or branched, are optionally fluorinated, and have from 1 to 30 C atoms, and aryl, aryloxy, heteroaryl and heteroaryloxy, all of which are optionally alkylated or alkoxylated and have 4 to 30 ring atoms.

The polymers of the present invention can be synthesized according to or in analogy to methods that are known to the skilled person and are described in the literature. Other methods of preparation can be taken from the examples. For example, they can be suitably prepared by aryl-aryl coupling reactions, such as Yamamoto coupling, Suzuki coupling, Stille coupling, Sonogashira coupling, Heck coupling or Buchwald coupling. Suzuki coupling and Yamamoto coupling are especially preferred.

The monomers which are polymerised to form the repeat units of the polymers can be prepared according to methods which are known to the person skilled in the art.

Preferably the polymers are prepared from monomers of formula Ia or its preferred embodiments as described above and below.

Another aspect of the invention is a process for preparing a polymer by coupling one or more identical or different monomeric units of formula I or monomers of formula Ia with each other and/or with one or more comonomers in a polymerisation reaction, preferably in an aryl-aryl coupling reaction.

Suitable and preferred comonomers are selected from the following formulae $$R^5\text{-}(Ar^1)_a\text{-}A^1\text{-}(Ar^2)_c\text{—}R^6 \qquad\qquad C$$

$$R^5\text{-}Ar^1\text{—}R^6 \qquad\qquad D$$

$$R^5\text{-}Ar^3\text{—}R^6 \qquad\qquad E$$

wherein Ar¹, Ar², Ar³, a and c have one of the meanings of formula II or one of the preferred meanings given above and below, $A^1$ has one of the meanings of formula III or one of the preferred meanings given above and below, and $R^5$ and $R^6$ have one of meanings of formula V or one of the preferred meanings given above and below.

Very preferred is a process for preparing a polymer by coupling one or more monomers selected from formula VI or formulae VI1-VI4 with one or more monomers of formula C, and optionally with one or more monomers selected from formula D and E, in an aryl-aryl coupling reaction.

For example, a first preferred embodiment of the present invention relates to a process of preparing a polymer by coupling a monomer of formula VI1

$$R^5\text{-}Ar^1\text{—}U\text{-}Ar^2\text{—}R^6 \qquad \text{VI1}$$

with a monomer of formula C1

$$R^5\text{-}A^1\text{-}R^6 \qquad \text{C1}$$

in an aryl-aryl coupling reaction.

A second preferred embodiment of the present invention relates to a process of preparing a polymer by coupling a monomer of formula VI2

$$R^5\text{—}U\text{—}R^6 \qquad \text{VI2}$$

with a monomer of formula C2

$$R^5\text{-}Ar^1\text{-}A^1\text{-}Ar^2\text{—}R^6 \qquad \text{C2}$$

in an aryl-aryl coupling reaction.

A third preferred embodiment of the present invention relates to a process of preparing a polymer by coupling a monomer of formula VI2

$$R^5\text{—}U\text{—}R^6 \qquad \text{VI2}$$

with a monomer of formula C1

$$R^5\text{-}A^1\text{-}R^6 \qquad \text{C1}$$

and a monomer of formula D1

$$R^5\text{-}Ar^1\text{—}R^6 \qquad \text{D1}$$

in an aryl-aryl coupling reaction.

Preferred aryl-aryl coupling methods used in the processes described above and below are Yamamoto coupling, Kumada coupling, Negishi coupling, Suzuki coupling, Stille coupling, Sonogashira coupling, Heck coupling, C—H activation coupling, Ullmann coupling or Buchwald coupling. Especially preferred are Suzuki coupling, Negishi coupling, Stille coupling and Yamamoto coupling. Suzuki coupling is described for example in WO 00/53656 A1. Negishi coupling is described for example in *J. Chem. Soc., Chem. Commun.*, 1977, 683-684. Yamamoto coupling is described in for example in T. Yamamoto et al., *Prog. Polym. Sci.*, 1993, 17, 1153-1205, or WO 2004/022626 A1, and Stille coupling is described for example in Z. Bao et al., *J. Am. Chem. Soc.*, 1995, 117, 12426-12435. For example, when using Yamamoto coupling, monomers having two reactive halide groups are preferably used. When using Suzuki coupling, compounds of formula II having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used.

Preferred catalysts, especially for Suzuki, Negishi or Stille coupling, are selected from Pd(0) complexes or Pd(II) salts. Preferred Pd(0) complexes are those bearing at least one phosphine ligand such as Pd(Ph$_3$P)$_4$. Another preferred phosphine ligand is tris(ortho-tolyl)phosphine, i.e. Pd(o-Tol$_3$P)$_4$. Preferred Pd(II) salts include palladium acetate, i.e. Pd(OAc)$_2$. Alternatively the Pd(0) complex can be prepared by mixing a Pd(0) dibenzylideneacetone complex e.g. tris(dibenzylideneacetone)dipalladium(0) bis(dibenzylideneacetone)palladium(0), or Pd(II) salts e.g. palladium acetate, with a phosphine ligand e.g. triphenylphosphine, tris(ortho-tolyl)phosphine or tri(tert-butyl)phosphine. Suzuki polymerisation is performed in the presence of a base, for example sodium carbonate, potassium carbonate, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl)nickel(0).

Suzuki and Stille polymerisation may be used to prepare homopolymers as well as statistical, alternating and block random copolymers. Statistical or block copolymers can be prepared for example from the above monomers of formula VI or its subformulae, wherein one of the reactive groups $R^5$ and $R^6$ is halogen and the other reactive group is a boronic acid, boronic acid derivative group or and alkylstannane. The synthesis of statistical, alternating and block copolymers is described in detail for example in WO 03/048225 A2 or WO 2005/014688 A2.

As alternatives to halogens as described above, leaving groups of formula —O—SO$_2$Z$^1$ can be used wherein $Z^1$ is as described above. Particular examples of such leaving groups are tosylate, mesylate and triflate.

Especially suitable and preferred synthesis methods of the repeating units, monomers, and polymers of formula I, II, III, IV, V and VI are illustrated in the synthesis schemes shown hereinafter, wherein $R^{3,4}$ and $Ar^{1,2}$ are as defined in formula I and II, and R is an alkyl group.

The synthesis of the 4,8-bis(ester)benzo[1,2-b;4,5-b']dithiophene dibromide monomer is shown below in Scheme 1. The synthesis of the ketone educt has been described in the literature, e.g. in WO 2008/011957 A1.

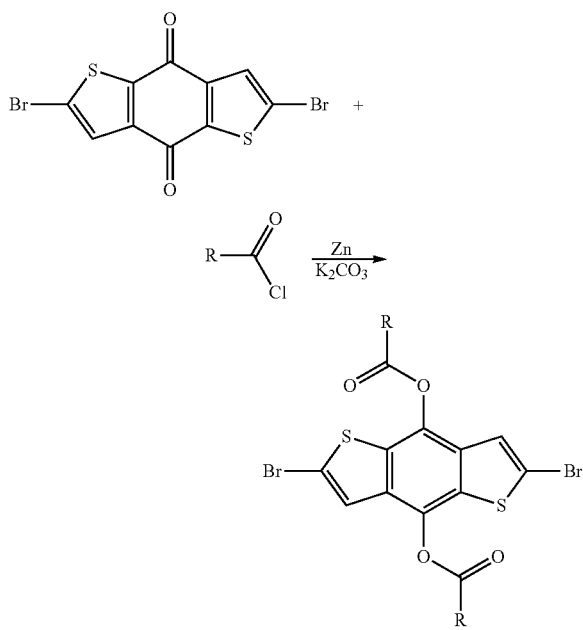

Scheme 1

A synthesis scheme for the alternated co-polymerisation of 4,8-bis(ester)benzo[1,2-b;4,5-b']dithiophene is shown in Scheme 2.

Scheme 2

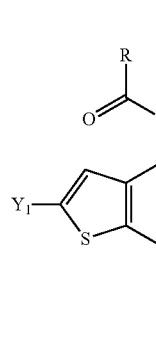

+ Y$_2$—Ar—Y$_2$ →

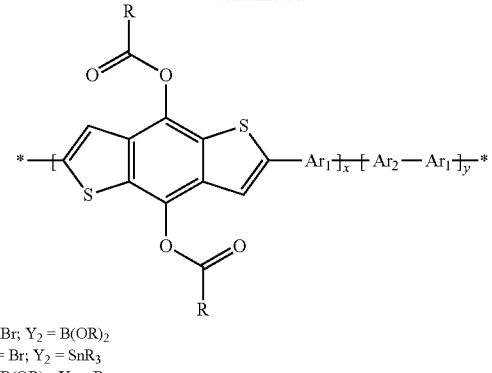

Y$_1$ = Br; Y$_2$ = B(OR)$_2$
Y$_1$ = Br; Y$_2$ = SnR$_3$
Y$_1$ = B(OR)$_2$; Y$_2$ = Br

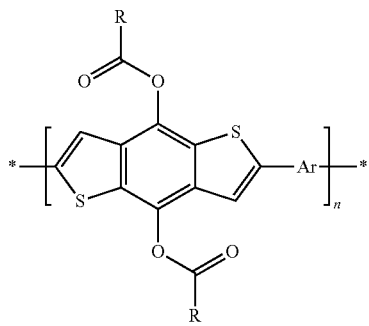

Y$_1$ = Br; Y$_2$ = B(OR)$_2$
Y$_1$ = Br; Y$_2$ = SnR$_3$
Y$_1$ = B(OR)$_2$; Y$_2$ = Br

A synthesis scheme for the statistical block co-polymerisation of the 4,8-bis(ester)benzo[1,2-b;4,5-b']dithiophene is shown in Scheme 3.

Scheme 3

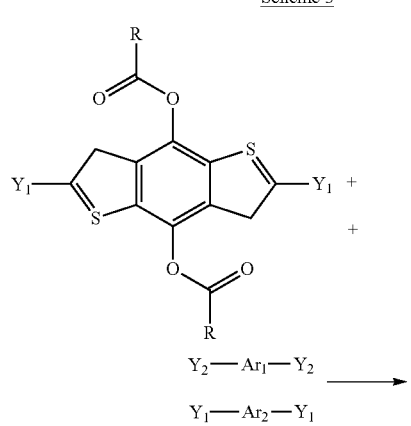

Y$_2$—Ar$_1$—Y$_2$
+
Y$_1$—Ar$_2$—Y$_1$
→

The novel methods of preparing monomers and polymers as described above and below are another aspect of the invention.

The compounds and polymers according to the present invention can also be used in mixtures or polymer blends, for example together with monomeric compounds or together with other polymers having charge-transport, semi-conducting, electrically conducting, photoconducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more small molecules, polymers, mixtures or polymer blends as described above and below and one or more organic solvents.

Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetra-methyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, N,N-dimethylformamide, 2-chloro-6-fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylanisole, 3-methylanisole, 4-fluoro-3-methylanisole, 2-fluorobenzonitrile, 4-fluoroveratrol, 2,6-dimethylanisole, 3-fluorobenzo-nitrile, 2,5-dimethylanisole, 2,4-dimethylanisole, benzonitrile, 3,5-dimethyl-anisole, N,N-dimethylaniline, ethyl benzoate, 1-fluoro-3,5-dimethoxy-benzene, 1-methylnaphthalene, N-methylpyrrolidinone, 3-fluorobenzo-trifluoride, benzotrifluoride, dioxane, trifluoromethoxy-benzene, 4-fluorobenzotrifluoride, 3-fluoropyridine, toluene, 2-fluoro-toluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chloro-benzene, o-dichlorobenzene, 2-chlorofluorobenzene, p-xylene, m-xylene, o-xylene or mixture of o-, m-, and p-isomers. Solvents with relatively low polarity are generally preferred. For inkjet printing solvents and solvent mixtures with high boiling temperatures are preferred. For spin coating alkylated benzenes like xylene and toluene are preferred.

Examples of especially preferred solvents include, without limitation, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, N,N-dimethylformamide, dimethylacetamide, dimethylsulfoxide, tetraline, decaline, indane, methyl benzoate, ethyl benzoate, mesitylene and/or mixtures thereof.

The concentration of the compounds or polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 1966, 38 (496), 296". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

The compounds and polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the compounds, polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Ink jet printing is particularly preferred when high resolution layers and devices needs to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the compounds or polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a compound or polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the compound or polymer, which reduces or prevents clogging of the jets and separation of the components during spraying. The solvent(s) may include those selected from the following list of examples: dodecylbenzene, 1-methyl-4-tert-butylbenzene, terpineol, limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymer blends and formulations according to the present invention can additionally comprise one or more further components or additives selected for example from surface-active compounds, lubricating agents, wetting agents, dispersing agents, hydrophobing agents, adhesive agents, flow improvers, defoaming agents, deaerators, diluents which may be reactive or non-reactive, auxiliaries, nanoparticles, colourants, dyes or pigments, furthermore, especially in case crosslinkable binders are used, catalysts, sensitizers, stabilizers, inhibitors, chain-transfer agents or co-reacting monomers.

The compounds and polymers to the present invention are useful as charge transport, semiconducting, electrically conducting, photoconducting or light emitting materials in optical, electrooptical, electronic, electroluminescent or photoluminescent components or devices. In these devices, the polymers of the present invention are typically applied as thin layers or films.

Thus, the present invention also provides the use of the semiconducting compound, polymer, polymers blend, formulation or layer in an electronic device. The formulation may be used as a high mobility semiconducting material in various devices and apparatus. The formulation may be used, for example, in the form of a semiconducting layer or film. Accordingly, in another aspect, the present invention provides a semiconducting layer for use in an electronic device, the layer comprising a compound, polymer, polymer blend or formulation according to the invention. The layer or film may be less than about 30 microns. For various electronic device applications, the thickness may be less than about 1 micron thick. The layer may be deposited, for example on a part of an electronic device, by any of the aforementioned solution coating or printing techniques.

The invention additionally provides an electronic device comprising a compound, polymer, polymer blend, formulation or organic semiconducting layer according to the present invention. Especially preferred devices are OFETs, TFTs, ICs, logic circuits, capacitors, RFID tags, OLEDs, OLETs, OPEDs, OPVs, OPDs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns.

Especially preferred electronic device are OFETs, OLEDs and OPV devices, in particular bulk heterojunction (BHJ) OPV devices and OPD devices. In an OFET, for example, the active semiconductor channel between the drain and source may comprise the layer of the invention. As another example, in an OLED device, the charge (hole or electron) injection or transport layer may comprise the layer of the invention.

For use in OPV or OPD devices the polymer according to the present invention is preferably used in a formulation that comprises or contains, more preferably consists essentially of, very preferably exclusively of, a p-type (electron donor) semiconductor and an n-type (electron acceptor) semiconductor. The p-type semiconductor is constituted by a polymer according to the present invention. The n-type semiconductor can be an inorganic material such as zinc oxide ($ZnO_x$), zinc tin oxide (ZTO), titan oxide ($TiO_x$), molybdenum oxide ($MoO_x$), nickel oxide ($NiO_x$), or cadmium selenide (CdSe), or an organic material such as graphene or a fullerene or substituted fullerene, for example an indene-$C_{60}$-fullerene bisaduct like ICBA, or a (6,6)-phenyl-butyric acid methyl ester derivatized methano $C_{60}$ fullerene, also known as "PCBM-$C_{60}$" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a $C_{61}$ fullerene group, a $C_{70}$ fullerene group, or a $C_{71}$ fullerene group, or an organic polymer (see for example Coakley, K. M. and McGehee, M. D. *Chem. Mater.* 2004, 16, 4533).

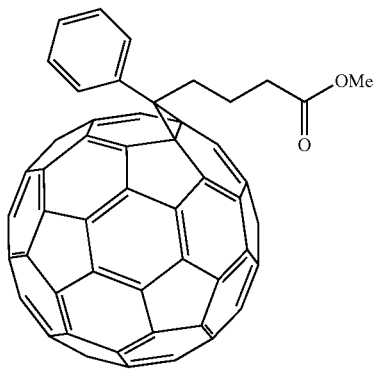

$C_{60}$PCBM

Preferably the polymer according to the present invention is blended with an n-type semiconductor such as a fullerene or substituted fullerene, like for example PCBM-$C_{60}$, PCBM-$C_{70}$, PCBM-$C_{61}$, PCBM-$C_{71}$, bis-PCBM-$C_{61}$, bis-PCBM-$C_{71}$, ICBA (1',1'',4',4''-tetrahydro-di[1,4]methanonaphthaleno[1,2:2',3';56,60:2'',3''][5,6]fullerene-C60-Ih), graphene, or a metal oxide, like for example, $ZnO_x$, $TiO_x$, ZTO, $MoO_x$, $NiO_x$ to form the active layer in an OPV or OPD device. The device preferably further comprises a first transparent or semi-transparent electrode on a transparent or semi-transparent substrate on one side of the active layer, and a second metallic or semi-transparent electrode on the other side of the active layer.

Further preferably the OPV or OPD device comprises, between the active layer and the first or second electrode, one or more additional buffer layers acting as hole transporting layer and/or electron blocking layer, which comprise a material such as metal oxide, like for example, ZTO, $MoO_x$, $NiO_x$ a conjugated polymer electrolyte, like for example PEDOT:PSS, a conjugated polymer, like for example polytriarylamine (PTAA), an organic compound, like for example N,N'-diphenyl-N,N'-bis(1-naphthyl)(1,1'-biphenyl)-4,4' diamine (NPB), N,N'-diphenyl-N,N'-(3-methylphenyl)-1,1'-biphenyl-4,4'-diamine (TPD), or alternatively as hole blocking layer and/or electron transporting layer, which comprise a material such as metal oxide, like for example, $ZnO_x$, $TiO_x$, a salt, like for example LiF, NaF, CsF, a conjugated polymer electrolyte, like for example poly[3-(6-trimethylammoniumhexyl)thiophene], poly(9,9-bis(2-ethylhexyl)-fluorene]-b-poly[3-(6-trimethylammoniumhexyl)thiophene], or poly [(9,9-bis(3'-(N,N-dimethylamino)propyl)-2,7-fluorene)-alt-2,7-(9,9-dioctylfluorene)] or an organic compound, like for example tris(8-quinolinolato)-aluminium(III) ($Alq_3$), 4,7-diphenyl-1,10-phenanthroline.

In a blend or mixture of a polymer according to the present invention with a fullerene or modified fullerene, the ratio polymer:fullerene is preferably from 5:1 to 1:5 by weight, more preferably from 1:1 to 1:3 by weight, most preferably 1:1 to 1:2 by weight. A polymeric binder may also be included, from 5 to 95% by weight. Examples of binder include polystyrene (PS), polypropylene (PP) and polymethylmethacrylate (PMMA).

To produce thin layers in BHJ OPV devices the compounds, polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, dip coating, curtain coating, brush coating, slot dye coating or pad printing. For the fabrication of OPV devices and modules area printing method compatible with flexible substrates are preferred, for example slot dye coating, spray coating and the like.

Suitable solutions or formulations containing the blend or mixture of a polymer according to the present invention with a $C_{60}$ or $C_{70}$ fullerene or modified fullerene like PCBM must be prepared. In the preparation of formulations, suitable solvent must be selected to ensure full dissolution of both component, p-type and n-type and take into account the boundary conditions (for example rheological properties) introduced by the chosen printing method.

Organic solvent are generally used for this purpose. Typical solvents can be aromatic solvents, halogenated solvents or chlorinated solvents, including chlorinated aromatic solvents. Examples include, but are not limited to chlorobenzene, 1,2-dichlorobenzene, chloroform, 1,2-dichloroethane, dichloromethane, carbon tetrachloride, toluene, cyclohexanone, ethylacetate, tetrahydrofuran, anisole, morpholine, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and combinations thereof.

The OPV device can for example be of any type known from the literature (see e.g. Waldauf et al., *Appl. Phys. Lett.*, 2006, 89, 233517).

A first preferred OPV device according to the invention comprises the following layers (in the sequence from bottom to top):
  optionally a substrate,
  a high work function electrode, preferably comprising a metal oxide, like for example ITO, serving as anode,
  an optional conducting polymer layer or hole transport layer, preferably comprising an organic polymer or polymer blend, for example of PEDOT:PSS (poly(3,4-ethylenedioxythiophene): poly(styrene-sulfonate), or TBD (N,N'-dyphenyl-N—N'-bis(3-methylphenyl)-1,1' biphenyl-4,4'-diamine) or NBD (N,N'-dyphenyl-N—N'-bis(1-napthylphenyl)-1,1' biphenyl-4,4'-diamine),
  a layer, also referred to as "active layer", comprising a p-type and an n-type organic semiconductor, which can exist for example as a p-type/n-type bilayer or as distinct p-type and n-type layers, or as blend or p-type and n-type semiconductor, forming a BHJ,
  optionally a layer having electron transport properties, for example comprising LiF,
  a low work function electrode, preferably comprising a metal like for example aluminum, serving as cathode,
  wherein at least one of the electrodes, preferably the anode, is transparent to visible light, and
  wherein the p-type semiconductor is a polymer according to the present invention.

A second preferred OPV device according to the invention is an inverted OPV device and comprises the following layers (in the sequence from bottom to top):
  optionally a substrate,
  a high work function metal or metal oxide electrode, comprising for example ITO, serving as cathode,
  a layer having hole blocking properties, preferably comprising a metal oxide like TiO$_x$ or Zn$_x$,
  an active layer comprising a p-type and an n-type organic semiconductor, situated between the electrodes, which can exist for example as a p-type/n-type bilayer or as distinct p-type and n-type layers, or as blend or p-type and n-type semiconductor, forming a BHJ,
  an optional conducting polymer layer or hole transport layer, preferably comprising an organic polymer or polymer blend, for example of PEDOT:PSS or TBD or NBD,
  an electrode comprising a high work function metal like for example silver, serving as anode,
  wherein at least one of the electrodes, preferably the cathode, is transparent to visible light, and
  wherein the p-type semiconductor is a polymer according to the present invention.

In the OPV devices of the present invention the p-type and n-type semiconductor materials are preferably selected from the materials, like the polymer/fullerene systems, as described above.

When the active layer is deposited on the substrate, it forms a BHJ that phase separates at nanoscale level. For discussion on nanoscale phase separation see Dennler et al, *Proceedings of the IEEE*, 2005, 93 (8), 1429 or Hoppe et al, *Adv. Func. Mater*, 2004, 14(10), 1005. An optional annealing step may be then necessary to optimize blend morpohology and consequently OPV device performance.

Another method to optimize device performance is to prepare formulations for the fabrication of OPV(BHJ) devices that may include high boiling point additives to promote phase separation in the right way. 1,8-Octanedithiol, 1,8-diiodooctane, nitrobenzene, chloronaphthalene, and other additives have been used to obtain high-efficiency solar cells. Examples are disclosed in J. Peet, et al, *Nat. Mater.*, 2007, 6, 497 or Fréchet et al. *J. Am. Chem. Soc.*, 2010, 132, 7595-7597.

The compounds, polymers, formulations and layers of the present invention are also suitable for use in an OFET as the semiconducting channel. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a compound, polymer, polymer blend, formulation or organic semiconducting layer according to the present invention. Other features of the OFET are well known to those skilled in the art.

OFETs where an OSC material is arranged as a thin film between a gate dielectric and a drain and a source electrode, are generally known, and are described for example in U.S. Pat. No. 5,892,244, U.S. Pat. No. 5,998,804, U.S. Pat. No. 6,723,394 and in the references cited in the background section. Due to the advantages, like low cost production using the solubility properties of the compounds according to the invention and thus the processibility of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises:
  a source electrode,
  a drain electrode,
  a gate electrode,
  a semiconducting layer,
  one or more gate insulator layers,
  optionally a substrate.
wherein the semiconductor layer preferably comprises a compound, polymer, polymer blend or formulation as described above and below.

The OFET device can be a top gate device or a bottom gate device. Suitable structures and manufacturing methods of an OFET device are known to the skilled in the art and are described in the literature, for example in US 2007/0102696 A1.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a low permittivity (or dielectric contant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetry value, like stamps, tickets, shares, cheques etc.

Alternatively, the materials according to the invention can be used in OLEDs, e.g. as the active display material in a flat panel display applications, or as backlight of a flat panel display like e.g. a liquid crystal display. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Wüller et al, *Synth. Metals,* 2000, 111-112, 31-34, Alcala, *J. Appl. Phys.,* 2000, 88, 7124-7128 and the literature cited therein.

According to another use, the materials according to this invention, especially those showing photoluminescent properties, may be employed as materials of light sources, e.g. in display devices, as described in EP 0 889 350 A1 or by C. Weder et al., *Science,* 1998, 279, 835-837.

A further aspect of the invention relates to both the oxidised and reduced form of the compounds according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICI, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $CISO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)(SbF_6^-)$, $(NO_2^+)(SbCl_6^-)$, $(NO_2^+)(BF_4^-)$, $AgClO_4$, $H_2IrCl_6$, $La(NO_3)_3.6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

The compounds and formulations according to the present invention may also be suitable for use in organic plasmon-emitting diodes (OPEDs), as described for example in Koller et al., *Nat. Photonics,* 2008, 2, 684.

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913 A1.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, *Proc. Natl. Acad. Sci. U.S.A.,* 1999, 96, 12287; D. Wang, X. Gong, P. S. Heeger, F. Rininsland, G. C. Bazan and A. J. Heeger, *Proc. Natl. Acad. Sci. U.S.A.,* 2002, 99, 49; N. DiCesare, M. R. Pinot, K. S. Schanze and J. R. Lakowicz, *Langmuir,* 2002, 18, 7785; D. T. McQuade, A. E. Pullen, T. M. Swager, *Chem. Rev.,* 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius. The values of the dielectric constant ∈ ("permittivity") refer to values taken at 20° C. and 1,000 Hz.

The invention will now be described in more detail by reference to the following examples, which are illustrative only and do not limit the scope of the invention.

Example 1

Tetradecanoic acid 2,6-dibromo-8-tetradecanoyloxy-benzo[1,2-b;4,5-b']dithiophen-4-yl ester

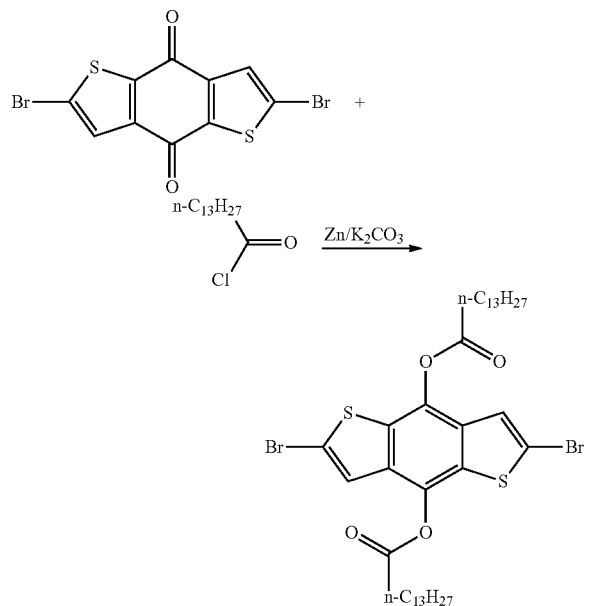

To a mixture of 2,6-dibromo-benzo[1,2-b;4,5-b']dithiophene-4,8-dione (3.1 g, 8.2 mmol), zinc (5.4 g, 82 mmol), potassium carbonate (11.3 g, 82 mmol) and tetrahydrofuran (200 cm³) is added tetradecanoyl chloride (27 cm³, 98 mmol) and the mixture heated at 70° C. for 2 hours. The warm mixture is filtered through a short pad of silica (dichloromethane). The solvent is removed in vacuo and the solid recrystallised several times from dichloromethane to give tetradecanoic acid 2,6-dibromo-8-tetradecanoyloxy-benzo[1,2-b;4,5-b']dithiophen-4-yl ester as a white solid (2.25 g, 34%). $^1$H NMR (300 MHz, CDCl$_3$) 0.84-0.92 (6H, m, CH$_3$), 1.22-1.59 (40H, m, CH$_2$), 1.80-1.92 (4H, m, CH$_2$), 2.72 (4H, t, CH$_2$, J 7.4), 7.18 (2H, s, ArH).

Poly{[2,5-[(thiophen-2-yl)-6-(tetradecanoic acid 8-tetradecanoyloxy-benzo[1,2-b;4,5-b']dithiophen-4-yl ester)]-co-[5,7-(thiophen-2-yl)-4-(5,6-dioctyloxy-benzo[1,2,5]thiadiazole)]}(1)

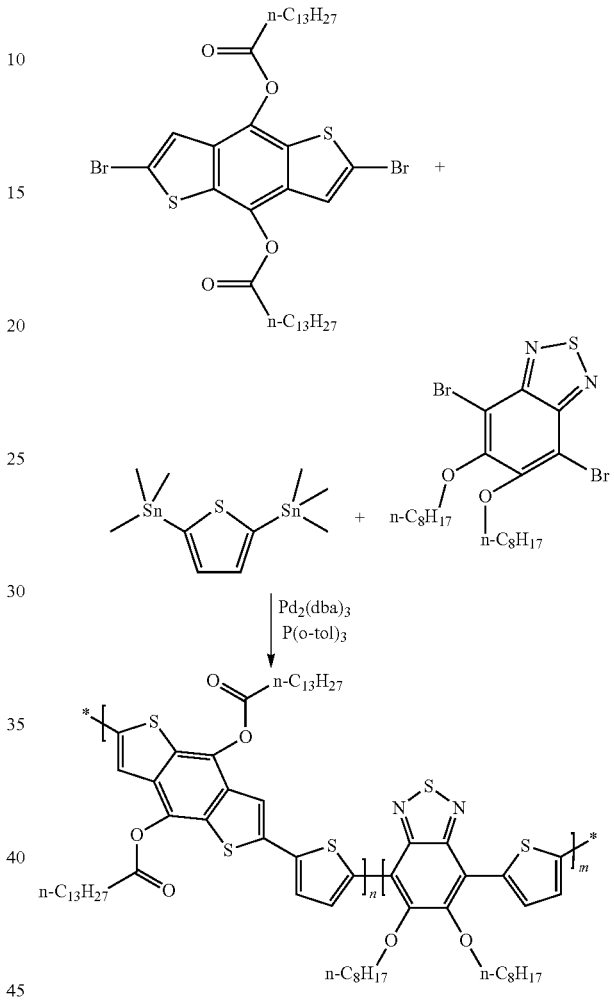

A solution of tetradecanoic acid 2,6-dibromo-8-tetradecanoyloxy-benzo[1,2-b;4,5-b']dithiophen-4-yl ester (480.5 mg, 0.600 mmol), 2,5-bis(trimethylstannyl)thiophene (492.0 mg, 1.200 mmol), 4,7-dibromo-5,6-dioctyloxy-benzo[1,2,5]thiadiazole (330.0 mg, 0.600 mmol), tris(dibenzylideneacetone)dipalladium(0) (22 mg, 0.020 mmol), tri(o-tolyl)phosphine (29 mg, 0.096 mmol) in chlorobenzene (7.5 cm³) is prepared and degassed with N$_2$ for 5 minutes. The reaction mixture is heated in a microwave reactor (Intitiator, Biotage AB) at 140° C. (1 minute), 160° C. (1 minute), and 180° C. (30 minutes). The reaction mixture is precipitated into methanol (100 cm³) and stirred for 10 minutes. The crude polymer collected by filtration and washed with methanol (100 cm³). The polymer is washed via Soxhlet extraction with acetone, 40-60 petrol and then cyclohexane before extraction into chloroform. The chloroform extract is precipitated from methanol and the polymer collected by filtration, washed with methanol, and dried under vacuum to yield poly{[2,5-(thiophen-2-yl)-6-(tetradecanoic acid 8-tetradecanoyloxy-benzo[1,2-b;4,5-b']dithiophen-4-yl ester)]-co-[5,7-(thiophen-2-yl)-4-(5,6-dioctyloxy-benzo[1,2,5]thiadiazole)]}(1) as a black solid (0.620 g, 87%). GPC (1,2,4-trichlorobenzene, 140° C.): M$_w$=57,000 g/mol, M$_n$=30,700 g/mol.

Example 2

Poly{[2,5-(thieno[3,2-b]thiophen-2-yl)-6-(tetradecanoic acid 8-tetradecanoyloxy-benzo[1,2-b;4,5-b']dithiophen-4-yl ester)]-co-[5,7-(thieno[3,2-b]thiophen-2-yl)-4-(5,6-dioctyloxy-benzo[1,2,5]thiadiazole)]}(2)

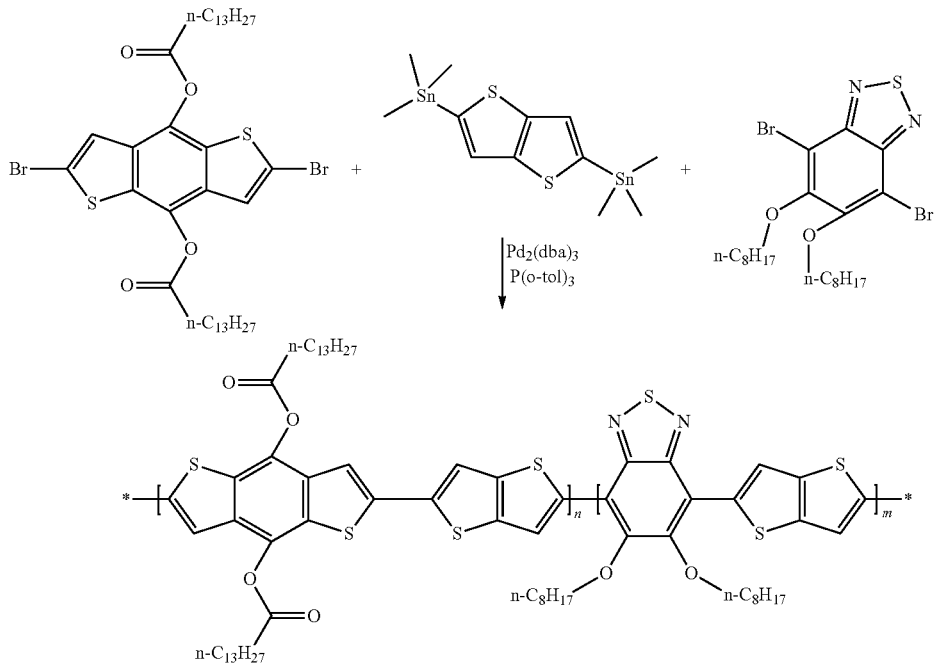

A solution of tetradecanoic acid 2,6-dibromo-8-tetradecanoyloxy-benzo[1,2-b;4,5-b']dithiophen-4-yl ester (480.5 mg, 0.600 mmol), 2,5-bis(trimethylstannyl)thieno[3,2-b]thiophene (559.0 mg, 1.200 mmol), 4,7-dibromo-5,6-dioctyloxy-benzo[1,2,5]thiadiazole (330.0 mg, 0.600 mmol), tris(dibenzylideneacetone)dipalladium(0) (22 mg, 0.020 mmol), tri(o-tolyl)phosphine (29 mg, 0.096 mmol) in chlorobenzene (7.5 cm³) is prepared and degassed with $N_2$ for 5 minutes. The reaction mixture is heated in a microwave reactor (Intitiator, Biotage AB) at 140° C. (1 minute), 160° C. (1 minute), and 180° C. (30 minutes). The reaction mixture is precipitated into methanol (100 cm³) and stirred for 10 minutes. The crude polymer collected by filtration and washed with methanol (100 cm³). The polymer is washed via Soxhlet extraction with acetone, 40-60 petrol, cyclohexane and then chloroform before extraction into chlorobenzene. The chlorobenzene extract is precipitated from methanol and the polymer collected by filtration, washed with methanol, and dried under vacuum to yield poly{[2,5-(thieno[3,2-b]thiophen-2-yl)-6-(tetradecanoic acid 8-tetradecanoyloxy-benzo[1,2-b;4,5-b']dithiophen-4-yl ester)]-co-[5,7-(thieno[3,2-b]thiophen-2-yl)-4-(5,6-dioctyloxy-benzo[1,2,5]thiadiazole)]}(2) as a black solid (0.200 g, 26%). GPC (1,2,4-trichlorobenzene, 140° C.): $M_w$=29,700 g/mol, $M_n$=10,200 g/mol.

Example 3

Poly{[2,6-(tetradecanoic acid 8-tetradecanoyloxy-benzo[1,2-b;4,5-b']dithiophen-4-yl ester)]-alt-[4,7-benzo[1,2,5]thiadiazole)]}(3)

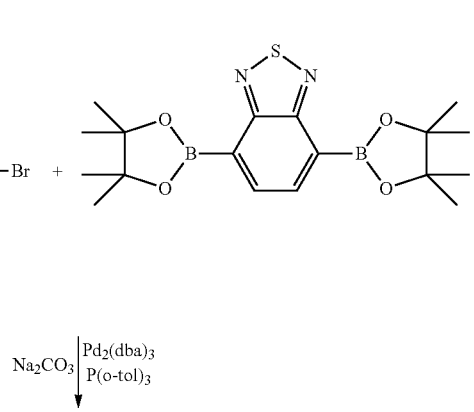

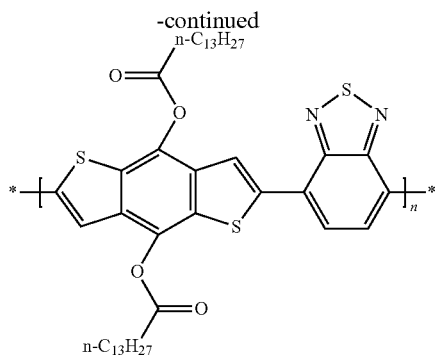

To a mixture of tetradecanoic acid 2,6-dibromo-8-tetradecanoyloxy-benzo[1,2-b;4,5-b']dithiophen-4-yl ester (480.5 mg, 0.600 mmol), 4,7-dibromo-benzo[1,2,5]thiadiazole (232.9 mg, 0.600 mmol), tris(dibenzylideneacetone)dipalladium(0) (11 mg, 0.012 mmol), tri(o-tolyl)phosphine (15 mg, 0.048 mmol) and toluene (12 cm$^3$) is added aliquat 336 (50 mg) and the mixture degassed with N$_2$ for 60 minutes. To the mixture is then added a degassed (N$_2$ for 40 minutes) solution of aqueous sodium carbonate (0.90 cm$^3$, 2.0 M) and the mixture degassed with N$_2$ for 5 minutes. The reaction mixture is placed in a pre-heated oil bath and heated at reflux for 30 minutes. The reaction mixture is allowed to cool and is precipitated into methanol (100 cm$^3$) and stirred for 10 minutes. The crude polymer collected by filtration and washed with methanol (20 cm$^3$), water (50 cm$^3$) and methanol (50 cm$^3$). The polymer is washed via Soxhlet extraction with acetone, 40-60 petrol, cyclohexane and then chloroform before extraction into chlorobenzene. The chlorobenzene extract is precipitated from methanol and the polymer collected by filtration, washed with methanol, and dried under vacuum to yield poly{2,6-(tetradecanoic acid 8-tetradecanoyloxy-benzo[1,2-b;4,5-b']dithiophen-4-yl ester)]-alt-[4,7-benzo[1,2,5]thiadiazole)]}(3) as a black solid (0.193 g, 40%). GPC (1,2,4-trichlorobenzene, 140° C.): M$_w$=14,400 g/mol, M$_n$=7,800 g/mol.

Example 4

Nonanoic acid 2,6-dibromo-8-nonanoyloxy-benzo[1,2-b;4,5-b']dithiophen-4-yl ester

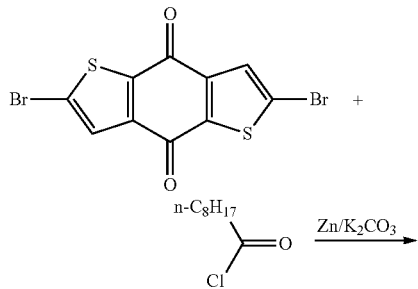

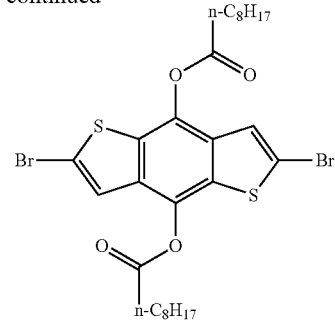

To a mixture of 2,6-dibromo-benzo[1,2-b;4,5-b']dithiophene-4,8-dione (1.68 g, 4.4 mmol), zinc (2.91 g, 44 mmol), potassium carbonate (6.1 g, 44 mmol) and tetrahydrofuran (100 cm$^3$) is added nonanoyl chloride (8.0 cm$^3$, 44 mmol) and the mixture heated at 70° C. for 25 minutes and then rapidly cooled in an ice-bath for 5 minutes. The mixture is filtered through a short pad of silica (dichloromethane). The solvent is removed in vacuo and the crude is purified by column chromatography (gradient of 40-60 petrol to 1:1 40-60 petrol:dichloromethane). The product from the column is further purified by repeated recrystallisation (acetonitrile:tetrahydrofuran) or (dichloromethane) to give nonanoic acid 2,6-dibromo-8-nonanoyloxy-benzo[1,2-b;4,5-b']dithiophen-4-yl ester as a white solid (440 mg, 15%). $^1$H NMR (300 MHz, CDCl$_3$) 0.86-0.96 (6H, m, CH$_3$), 1.25-1.55 (20H, m, CH$_2$), 1.86 (4H, quin, CH$_2$, J 7.5), 2.72 (4H, t, CH$_2$, J 7.4), 7.18 (2H, s, ArH).

Poly{2,5-[(thiophen-2-yl)-6-(nonanoic acid 8-tetra-decanoyloxy-benzo[1,2-b;4,5-b']dithiophen-4-yl ester)-co-5,7-(thiophen-2-yl)-4-(5,6-dioctyloxy-benzo[1,2,5]thiadiazole)}(4) loxy-benzo[1,2-b;4,5-b']dithiophen-4-yl ester)-co-5,7-(thiophen-2-yl)-4-(5,6-dioctyloxy-benzo[1,2,5]thiadiazole)}(4) as a black solid (60 mg, 16%). GPC (1,2,4-trichlorobenzene, 140° C.): $M_w$=47,000 g/mol, $M_n$=74,600 g/mol.

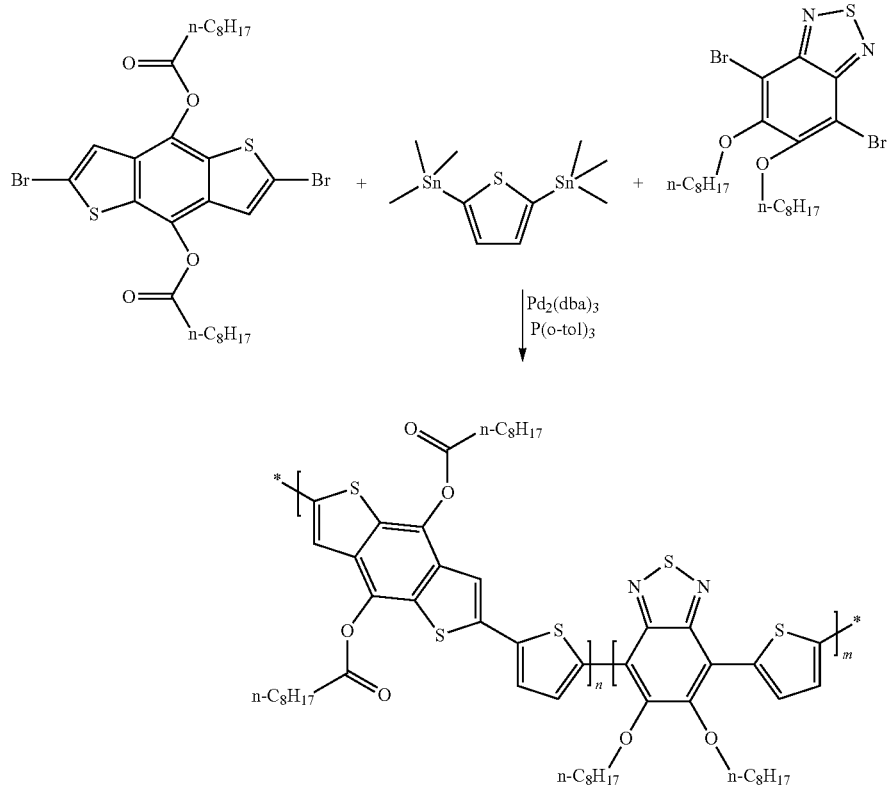

A solution of nonanoic acid 2,6-dibromo-8-tetradecanoyloxy-benzo[1,2-b;4,5-b']dithiophen-4-yl ester (123.4 mg, 0.184 mmol), 2,5-bis(trimethylstannyl)thiophene (150.5 mg, 0.367 mmol), 4,7-dibromo-5,6-dioctyloxy-benzo[1,2,5]thiadiazole (101.1 mg, 0.184 mmol), tris(dibenzylideneacetone)dipalladium(0) (6.7 mg, 0.007 mmol), tri(o-tolyl)phosphine (8.9 mg, 0.03 mmol) in chlorobenzene (2.3 cm³) is prepared and degassed with $N_2$ for 5 minutes. The reaction mixture is heated in a microwave reactor (Intitiator, Biotage AB) at 140° C. (1 minute), 160° C. (1 minute) and 180° C. (30 minutes). The mixture allowed to cool to 65° C. and bromobenzene (0.08 cm³) is added. The reaction mixture is heated in a microwave reactor (Intitiator, Biotage AB) at 170° C. (10 minutes). The mixture allowed to cool to 65° C. and tributylstannylbenzene (0.36 cm³) is added. The reaction mixture is heated in a microwave reactor (Intitiator, Biotage AB) at 170° C. (10 minutes). The reaction mixture is precipitated into methanol (100 cm³) and stirred for 10 minutes. The crude polymer collected by filtration and washed with methanol (100 cm³). The polymer is washed via Soxhlet extraction with acetone, 40-60 petrol, 80-100 petrol, cyclohexane and then chloroform before extraction into chlorobenzene. The chlorobenzene extract is precipitated from methanol and the polymer collected by filtration, washed with methanol, and dried under vacuum to yield poly{2,5-[(thiophen-2-yl)-6-(nonanoic acid 8-tetradecanoy- Example 5

2-Heptyl-undecanoic acid 2,6-dibromo-8-(2-heptyl-undecanoyloxy)-benzo[1,2-b;4,5-b']dithiophen-4-yl ester

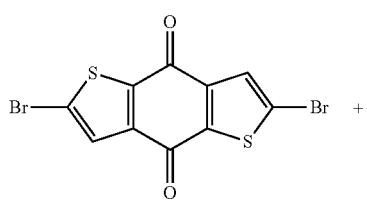

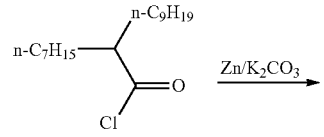

-continued

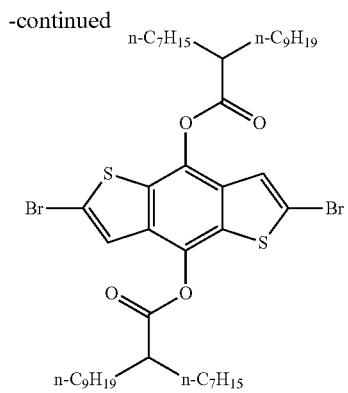

To a mixture of 2,6-dibromo-benzo[1,2-b;4,5-b']dithiophene-4,8-dione (1.0 g, 2.6 mmol), zinc (1.7 g, 26 mmol), potassium carbonate (3.6 g, 26 mmol) and tetrahydrofuran (60 cm³) is added 2-heptyl-undecanoyl chloride (8.0 g, 26 mmol) and the mixture heated at 70° C. for 2 hours. The warm mixture is filtered through a short pad of silica (dichloromethane) and the mixture washed with water (100 cm³). The organics are dried over anhydrous magnesium sulfate, filtered and the solvent removed in vacuo. The crude is purified by column chromatography (gradient of 40-60 petrol to dichloromethane) followed by repeated recrystallisation (methanol:tetrahydrofuran) to give 2-heptyl-undecanoic acid 2,6-dibromo-8-(2-heptyl-undecanoyloxy)-benzo[1,2-b;4,5-b']dithiophen-4-yl ester as a white solid (867 mg, 36%). ¹H NMR (300 MHz, CDCl₃) 0.84-0.95 (12H, m, CH₃), 1.23-1.58 (48H, m, CH₂), 1.62-1.75 (4H, m, CH₂), 1.79-1.94 (4H, m, CH₂), 2.69-2.81 (2H, m, CH), 7.16 (2H, s, ArH).

Poly{2,5-[(4,8-didodecyl-benzo[1',2'-b;4',5'-b']dithiophen-2'-yl)-6-(2-heptyl-undecanoic acid 8-(2-heptyl-undecanoyloxy)-benzo[1,2-b;4,5-b']dithiophen-4-yl ester)-co-6,7-(4,8-didodecyl-benzo[1',2'-b;4',5'-b']dithiophen-2'-yl)-4-(benzo[1,2,5]thiadiazole)}(5)

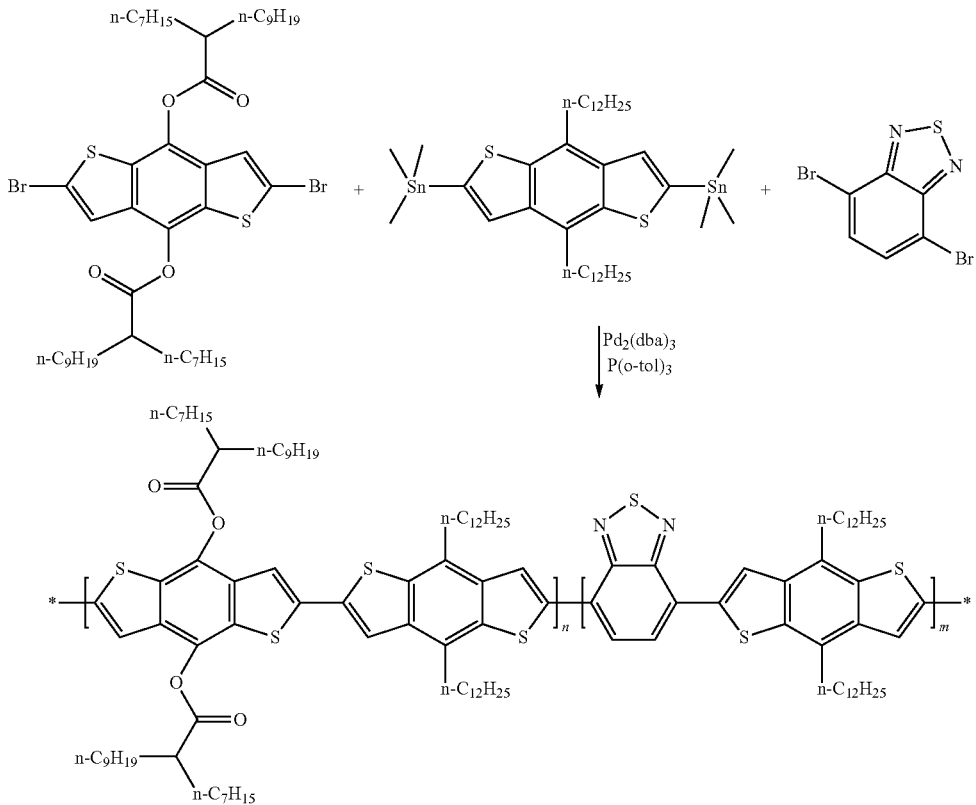

A solution of 2-heptyl-undecanoic acid 2,6-dibromo-8-(2-heptyl-undecanoyloxy)-benzo[1,2-b;4,5-b']dithiophen-4-yl ester (319.6 mg, 0.350 mmol), 4,8-didodecyl-2,6-bis-trimethylstannanyl-benzo[1,2-b;4,5-b']dithiophene (596.8 mg, 0.700 mmol), 4,7-dibromo-benzo[1,2,5]thiadiazole (102.9 mg, 0.350 mmol), tris(dibenzylideneacetone)dipalladium(0) (12.8 mg, 0.014 mmol), tri(o-tolyl)phosphine (17.0 mg, 0.056 mmol) in chlorobenzene (7.0 cm³) is prepared and degassed with N₂ for 5 minutes. The reaction mixture is heated in a microwave reactor (Intitiator, Biotage AB) at 140° C. (1 minute), 160° C. (1 minute) and 180° C. (30 minutes). The reaction mixture is precipitated into methanol (100 cm³) and stirred for 10 minutes. The crude polymer collected by filtration and washed with methanol (100 cm³). The polymer is washed via Soxhlet extraction with acetone, 40-60 petrol, 80-100 petrol and then cyclohexane before extraction into chloroform. The chloroform extract is precipitated from methanol and the polymer collected by filtration, washed with methanol, and dried under vacuum to yield poly{2,5-[(4,8-didodecyl-benzo[1',2'-b;4',5'-b']dithiophen-2'-yl)-6-(2-heptyl-undecanoic acid 2,6-dibromo-8-(2-heptyl-undecanoyloxy)-benzo[1,2-b;4,5-b']dithiophen-4-yl ester)-co-6,7-(4,8-didodecyl-benzo[1',2'-b;4',5'-b']dithiophen-2'-yl)-4-(benzo[1,2,5]thiadiazole)}(5) as a black solid (660 mg, 95%). GPC (1,2,4-trichlorobenzene, 140° C.): $M_w$=82,700 g/mol, $M_n$=32,100 g/mol.

Example 6

Poly{[2,6-(2-heptyl-undecanoic acid 8-(2-heptyl-undecanoyloxy)-benzo[1,2-b;4,5-b']dithiophen-4-yl ester)]-alt-[4,7-benzo[1,2,5]thiadiazole)]}(6)

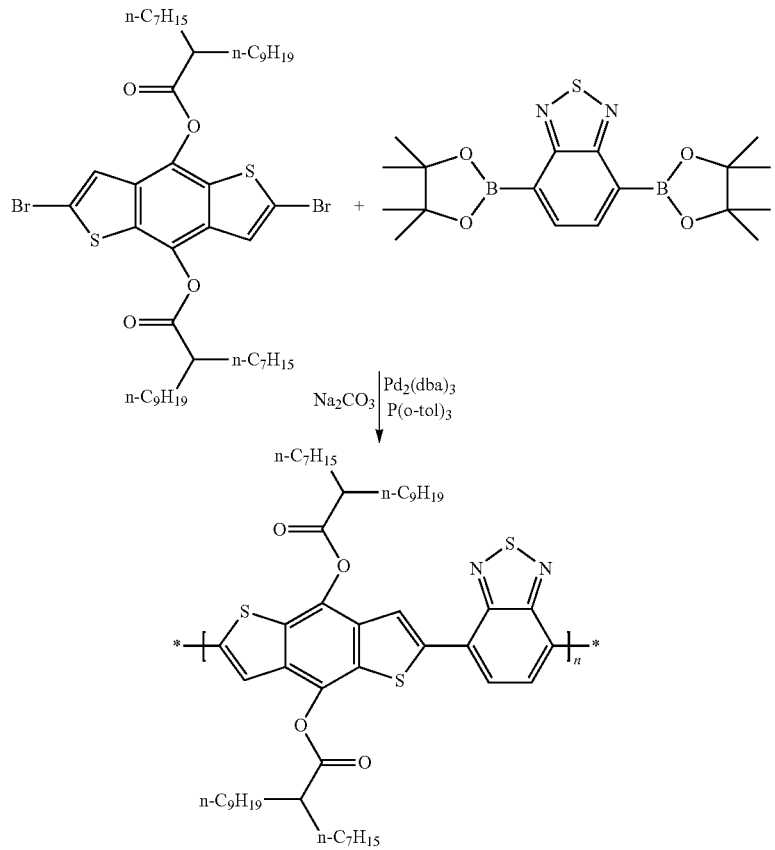

To a mixture of 2-heptyl-undecanoic acid 2,6-dibromo-8-(2-heptyl-undecanoyloxy)-benzo[1,2-b;4,5-b']dithiophen-4-yl ester (273.9 mg, 0.300 mmol), 4,7-dibromo-benzo[1,2,5]thiadiazole (116.4 mg, 0.300 mmol), tris(dibenzylideneacetone)dipalladium(0) (5.5 mg, 0.006 mmol), tri(o-tolyl)phosphine (7.3 mg, 0.024 mmol) and toluene (8 cm³) is added aliquat 336 (50 mg) and the mixture degassed with $N_2$ for 60 minutes. To the mixture is then added a degassed ($N_2$ for 40 minutes) solution of aqueous sodium carbonate (0.45 cm³, 2.0 M) and the mixture degassed with $N_2$ for 5 minutes. The reaction mixture is heated at 110° C. for 41 hours. The reaction mixture is allowed to cool and is precipitated into methanol (100 cm³) and stirred for 10 minutes. The crude polymer collected by filtration and washed with methanol (20 cm³), water (50 cm³) and methanol (50 cm³). The polymer is washed via Soxhlet extraction with acetone, 40-60 petrol, 80-100 petrol and cyclohexane before extraction into chloroform. The chloroform extract is precipitated from methanol and the polymer collected by filtration, washed with methanol, and dried under vacuum to yield poly{[2,6-(2-heptyl-undecanoic acid 8-(2-heptyl-undecanoyloxy)-benzo[1,2-b;4,5-b']dithiophen-4-yl ester)]-alt-[4,7-benzo[1,2,5]thiadiazole)]}(6) as a black solid (0.180 g, 68%). GPC (chlorobenzene, 50° C.): $M_w$=42,400 g/mol, $M_n$=14,700 g/mol.

Example 7

Photovoltaic Cell Fabrication and Measurement

Organic photovoltaic (OPV) devices were fabricated on ITO-glass substrates (13/sq.) purchased from LUMTEC Corporation. Substrates were cleaned using common solvents (acetone, iso-propanol, deionized-water) in an ultrasonic bath prior to a conventional photolithography process that was carried out to define the bottom electrodes (anodes). A conducting polymer poly(ethylene dioxythiophene) doped with poly(styrene sulfonic acid) [Clevios VPAI 4083 (N.C. Starck)] was mixed in a 1:1 ratio with deionized-water. This solution was sonicated for 20 minutes to ensure proper mixing and filtered using a 0.2 μm filter before spin-coating to achieve a thickness of 20 nm. Substrates were exposed to ozone prior to the spin-coating process to ensure good wetting properties. Films were then annealed at 130° C. for 30 minutes in a nitrogen atmosphere where they were kept for the remainder of the process. Active material (i.e. polymer+PCBM) solutions were prepared at the concentration and components ratio stated in the examples and stirred overnight. Thin films were either spin-coated or blade-coated in a nitrogen atmosphere to achieve active layer thicknesses between 100 and 250 nm as measured using a profilometer. A short drying period followed to ensure removal of any residual solvent. Typically, spin-coated films were dried at 23° C. for 10 minutes and blade-coated films were dried at 70° C. for 2 minutes on a hotplate. For the last step of the device fabrication, Ca (30 nm)/Al (200 nm) cathodes were thermally evaporated through a shadow mask to define the cells. Samples were measured at 23° C. under the irradiation of 1 Sun using a Solar Simulator (Newport Ltd, Model 91160) as the light source and using a calibrated Si-cell as the reference.

OPV device characteristics for blends of polymers (1), (2), (3), (4) and (5) with $C_{61}$ PCBM under irradiation of 1 Sun are shown in Table 1.

TABLE 1

Photovoltaic cell characteristics.

| Polymer | Polymer: $C_{61}$PCBM ratio | Concentration (mg/cm³) | η (%) | FF | $V_{oc}$ (mV) | $J_{sc}$ (mA/cm²) |
|---|---|---|---|---|---|---|
| (1) | 1:1 | 30 | 2.92 | 55 | 816 | −6.45 |
|  | 1:1.5 | 30 | 3.27 | 62 | 811 | −6.46 |
|  | 1:2 | 30 | 3.24 | 64 | 808 | −6.24 |
|  | 1:3 | 30 | 2.93 | 67 | 803 | −5.50 |
|  | 1:2 | 20 | 3.29 | 64 | 817 | −6.35 |
|  | 1:2 | 40 | 3.79 | 56 | 805 | −8.36 |
| (2) | 1:1 | 20 | 0.54 | 41 | 601 | −2.18 |
|  | 1:1.5 | 20 | 0.60 | 41 | 594 | −2.46 |
|  | 1:2 | 20 | 0.63 | 46 | 599 | −2.28 |
|  | 1:3 | 20 | 0.62 | 47 | 582 | −2.27 |
|  | 1:2 | 15 | 0.72 | 40 | 585 | −3.05 |
|  | 1:2 | 30 | 0.73 | 45 | 594 | −2.74 |
| (3) | 1:2 | 20 | 0.40 | 30 | 735 | −1.86 |
| (4) | 1:1 | 30 | 1.25 | 34 | 748 | −4.91 |
|  | 1:1.5 | 30 | 1.62 | 39 | 728 | −5.76 |
|  | 1:2 | 30 | 1.62 | 39 | 718 | −5.84 |
|  | 1:3 | 30 | 1.66 | 40 | 702 | −5.94 |
|  | 1:2 | 40 | 1.62 | 441 | 711 | −5.59 |
| (5) | 1:1 | 30 | 1.89 | 51 | 880 | −4.18 |
|  | 1:1.5 | 30 | 1.98 | 53 | 870 | −4.27 |
|  | 1:2 | 30 | 1.99 | 55 | 879 | −4.14 |
|  | 1:3 | 30 | 1.85 | 60 | 900 | −3.43 |
|  | 1:2 | 20 | 1.71 | 60 | 910 | −3.15 |
|  | 1:2 | 40 | 2.28 | 50 | 882 | −5.13 |

The invention claimed is:

1. A polymer comprising one or more divalent units of formula I

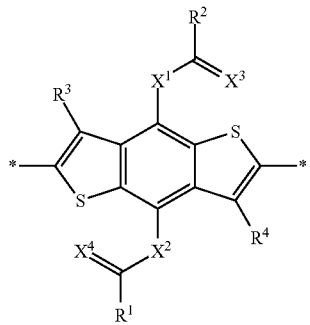

I wherein
$X^1$, $X^2$, $X^3$, $X^4$ denote independently of each other, and on each occurrence identically or differently O or S,
$R^1$, $R^2$ denote independently of each other, a straight-chain or branched alkyl with 1 to 20 C atoms, which is unsubstituted or substituted by one or more F atoms, and
$R^3$, $R^4$ denote independently of each other, and on each occurrence identically or differently, H, halogen, or an optionally substituted carbyl or hydrocarbyl group, wherein one or more C atoms are each optionally replaced by a hetero atom.

2. The polymer according to claim 1, wherein $R^3$ and $R^4$ are each, independently, selected from straight-chain, branched or cyclic alkyl with 1 to 30 C atoms in which one or more non-adjacent C atoms are each optionally replaced by —O—, —S—, —C(O)—, —C(S)—, —C(O)—O—, —C(S)—O—, —C(S)—S—, —C(O)—S—, —O—C(O)—, —O—C(S)—, —S—C(S)—, —S—C(O)—, —CH=CH— or —C≡C—, and which are unsubstituted or substituted by F, Cl, Br, I or CN.

3. The polymer according to claim 1, wherein $X^1$ and $X^2$ are O or S, and $X^3$ and $X^4$ are O.

4. The polymer according to claim 1, wherein $R^1$ and $R^2$ independently of each other are straight-chain alkyl with 1 to 20 C atoms which is unsubstituted or substituted by one or more F atoms.

5. The polymer according to claim 1, wherein said polymer comprises one or more units of formula II

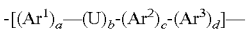

II wherein
U is a unit of formula I,
$Ar^1$, $Ar^2$, $Ar^3$ are, on each occurrence identically or differently, and independently of each other, aryl or heteroaryl that is different from U, and is optionally substituted, by one or more groups $R^S$,
$R^S$ is on each occurrence identically or differently F, Br, Cl, —CN, —NC, —NCO, —NCS, —OCN, —SCN, —C(O)NR⁰R⁰⁰, —C(O)X⁰, —C(O)R⁰, —C(O)OR⁰, —NH₂, —NR⁰R⁰⁰, —SH, —SR⁰, —SO₃H, —SO₂R⁰, —OH, —NO₂, —CF₃, —SF₅, optionally substituted silyl, carbyl or hydrocarbyl with 1 to 40 C atoms that is optionally substituted and optionally comprises one or more hetero atoms, or is P-Sp-,
$R^0$ and $R^{00}$ are independently of each other H or optionally substituted $C_{1-40}$ carbyl or hydrocarbyl,
P is a polymerizable or crosslinkable group,
Sp is a spacer group or a single bond,
$X^0$ is halogen,
a, b, c are on each occurrence identically or differently 0, 1 or 2, and
d is on each occurrence identically or differently 0 or an integer from 1 to 10,
wherein the polymer comprises at least one repeating unit of formula II wherein b is at least 1.

6. The polymer according to claim 1, wherein said polymer additionally comprises one or more repeating units of formula III

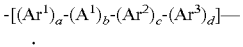

III wherein
U is a unit of formula I,
$Ar^2$, $Ar^3$ are, on each occurrence identically or differently, and independently of each other, aryl or heteroaryl that is different from U, and is optionally substituted by one or more groups $R^S$,
$A^1$ is an aryl or heteroaryl group that is different from U and $Ar^{2-3}$, has 5 to 30 ring atoms, and is optionally substituted by one or more groups $R^S$,
$R^S$ is on each occurrence identically or differently F, Br, Cl, —CN, —NC, —NCO, —NCS, —OCN, —SCN, —C(O)NR⁰R⁰⁰, C(O)X⁰, —C(O)R⁰, —C(O)OR⁰, —NH₂, —NR⁰R⁰⁰, —SH, —SR⁰, —SO₃H, —SO₂R⁰, —OH, —NO₂, —CF₃, —SF₅, optionally substituted silyl, carbyl or hydrocarbyl with 1 to 40 C atoms that is optionally substituted and optionally comprises one or more hetero atoms, or is P-Sp-, R⁰ and R⁰⁰ are independently of each other H or optionally substituted $C_{1-40}$ carbyl or hydrocarbyl, P is a polymerizable or crosslinkable group, Sp is a spacer group or a single bond, $X^0$ is halogen, a, b, c are on each occurrence identically or differently 0, 1 or 2, and d is on each occurrence identically or differently 0 or an integer from 1 to 10, wherein the polymer comprises at least one repeating unit of formula III wherein b is at least 1.

7. The polymer according to claim 1, wherein said polymer is of formula IV:

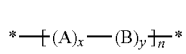    IV wherein

A is a unit of formula I or is a unit of the following formula II,

    II

B is a unit that is different from A and comprises one or more aryl or heteroaryl groups that are optionally substituted, x is >0 and ≤1, y is ≥0 and <1, x+y is 1, n is an integer >1, U is a unit of formula I, $Ar^1$, $Ar^2$, $Ar^3$ are, on each occurrence identically or differently, and independently of each other, aryl or heteroaryl that is different from U, and is optionally substituted by one or more groups $R^S$, $R^S$ is on each occurrence identically or differently F, Br, Cl, —CN, —NC, —NCO, —NCS, —OCN, —SCN, —C(O)NR⁰R⁰⁰, —C(O)X⁰, —C(O)R⁰, —C(O)OR⁰, —NH₂, —NR⁰R⁰⁰, —SH, —SR⁰, —SO₃H, —SO₂R⁰, —OH, —NO₂, —CF₃, —SF₅, optionally substituted silyl, carbyl or hydrocarbyl with 1 to 40 C atoms that is optionally substituted and optionally comprises one or more hetero atoms, or is P-Sp-, R⁰ and R⁰⁰ are independently of each other H or optionally substituted $C_{1-40}$ carbyl or hydrocarbyl, P is a polymerizable or crosslinkable group, Sp is a spacer group or a single bond, $X^0$ is halogen, preferably F, Cl or Br, a, b, c are on each occurrence identically or differently 0, 1 or 2, and d is on each occurrence identically or differently 0 or an integer from 1 to 10.

8. The polymer according to claim 1, wherein said polymer is selected from the following formulae

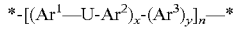    IVa

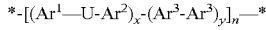    IVb

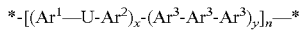    IVc

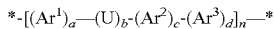    IVd

    IVe wherein

U is a unit of formula I, $Ar^1$, $Ar^2$, $Ar^3$ are, on each occurrence identically or differently, and independently of each other, aryl or heteroaryl that is different from U, and is optionally substituted by one or more groups $R^S$, $R^S$ is on each occurrence identically or differently F, Br, Cl, —CN, —NC, —NCO, —NCS, —OCN, —SCN, —C(O)NR⁰R⁰⁰, —C(O)X⁰, —C(O)R⁰, —C(O)OR⁰, —NH₂, —NR⁰R⁰⁰, —SH, —SR⁰, —SO₃H, —SO₂R⁰, —OH, —NO₂, —CF₃, —SF₅, optionally substituted silyl, carbyl or hydrocarbyl with 1 to 40 C atoms that is optionally substituted and optionally comprises one or more hetero atoms, or is P-Sp-, R⁰ and R⁰⁰ are independently of each other H or optionally substituted $C_{1-40}$ carbyl or hydrocarbyl, P is a polymerizable or crosslinkable group, Sp is a spacer group or a single bond, $X^0$ is halogen, preferably F, Cl or Br, a, b, c are on each occurrence identically or differently 0, 1 or 2, d is on each occurrence identically or differently 0 or an integer from 1 to 10, x is >0 and ≤1, y is ≥0 and <1, x+y is 1, and n is an integer >1, wherein these polymers can be alternating or random copolymers, and wherein in formula IVd and IVe in at least one of the repeating units [(Ar¹)ₐ—(U)ᵦ-(Ar²)ᵧ-(Ar³)ₐ] and in at least one of the repeating units [(Ar¹)ₐ-(A¹)ᵦ-(Ar²)ᵧ-(Ar³)ₐ] b is at least 1.

9. The polymer according to claim 7, wherein said polymer is of formula V $R^5$-chain-$R^6$    V wherein "chain" is a polymer chain of formula IV as defined in claim 7, $R^5$ and $R^6$ denote independently of each other H, F, Br, Cl, I, —CH₂Cl, —CHO, —CR'=CR"₂, —SiR'R"R"', —SiR'X'X", —SiR'R"X', —SnR'R"R"', —BR'R", —B(OR')(OR"), —B(OH)₂, —O—SO₂—R', —C≡CH, —C≡C—SiR'₃, —ZnX', P-Sp- or an endcap group, P is a polymerizable or crosslinkable group, Sp is a spacer group or a single bond, X' and X" denote halogen, and R', R" and R"' are independently of each other H or optionally substituted $C_{1-40}$ carbyl or hydrocarbyl, and two of R', R" and R"' may also form a ring together with the hetero atom to which they are attached.

10. The polymer according to claim 5, wherein one or more of $Ar^1$, $Ar^2$ and $Ar^3$ denote aryl or heteroaryl selected from the following formulae

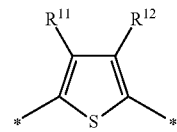    (D1)

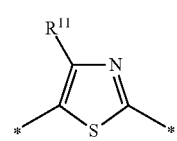    (D2)

-continued
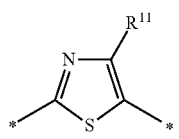 (D3)
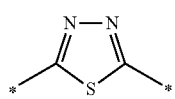 (D4)
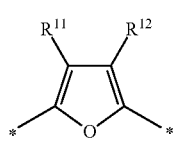 (D5)
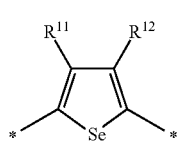 (D6)
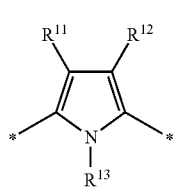 (D7)
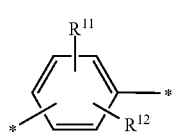 (D8)
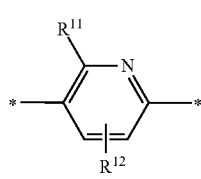 (D9)
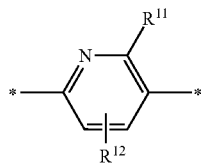 (D10)
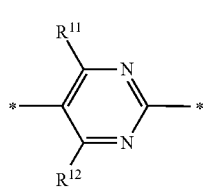 (D11)
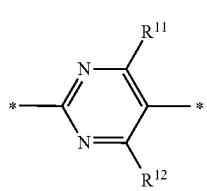 (D12)
-continued
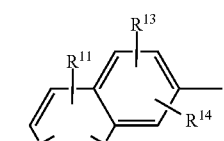 (D13)
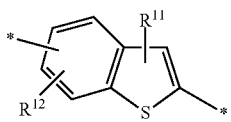 (D14)
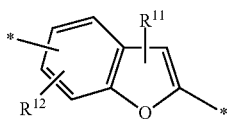 (D15)
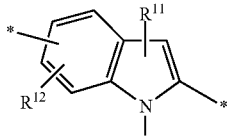 (D16)
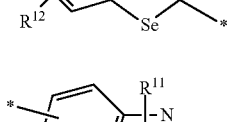 (D17)
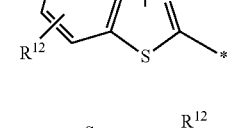 (D18)
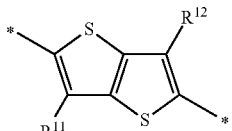 (D19)
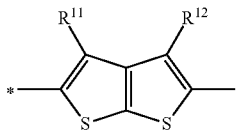 (D20)
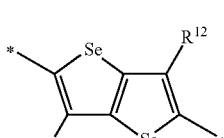 (D21)
(D22)

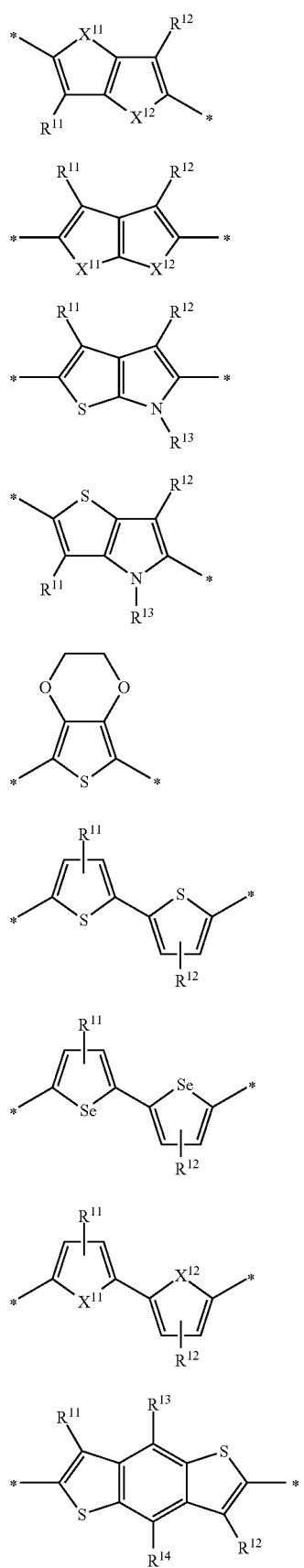
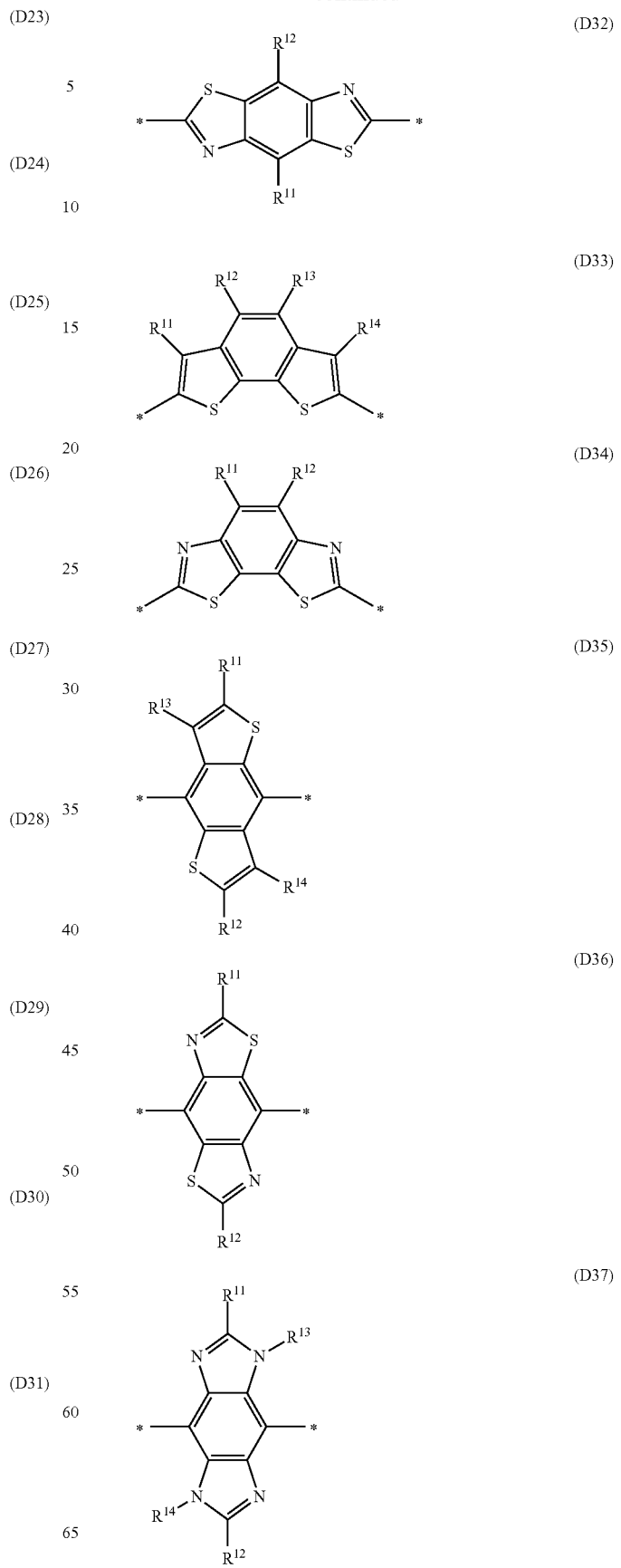

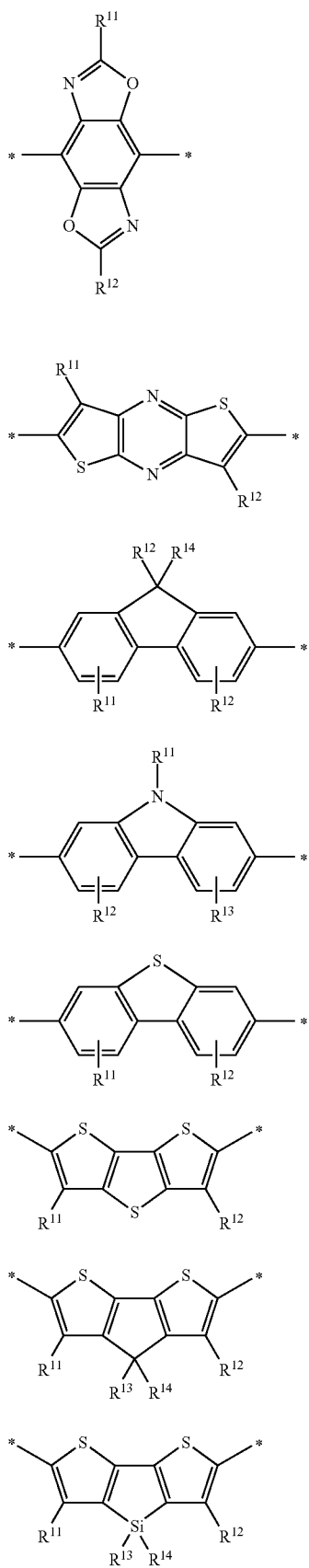
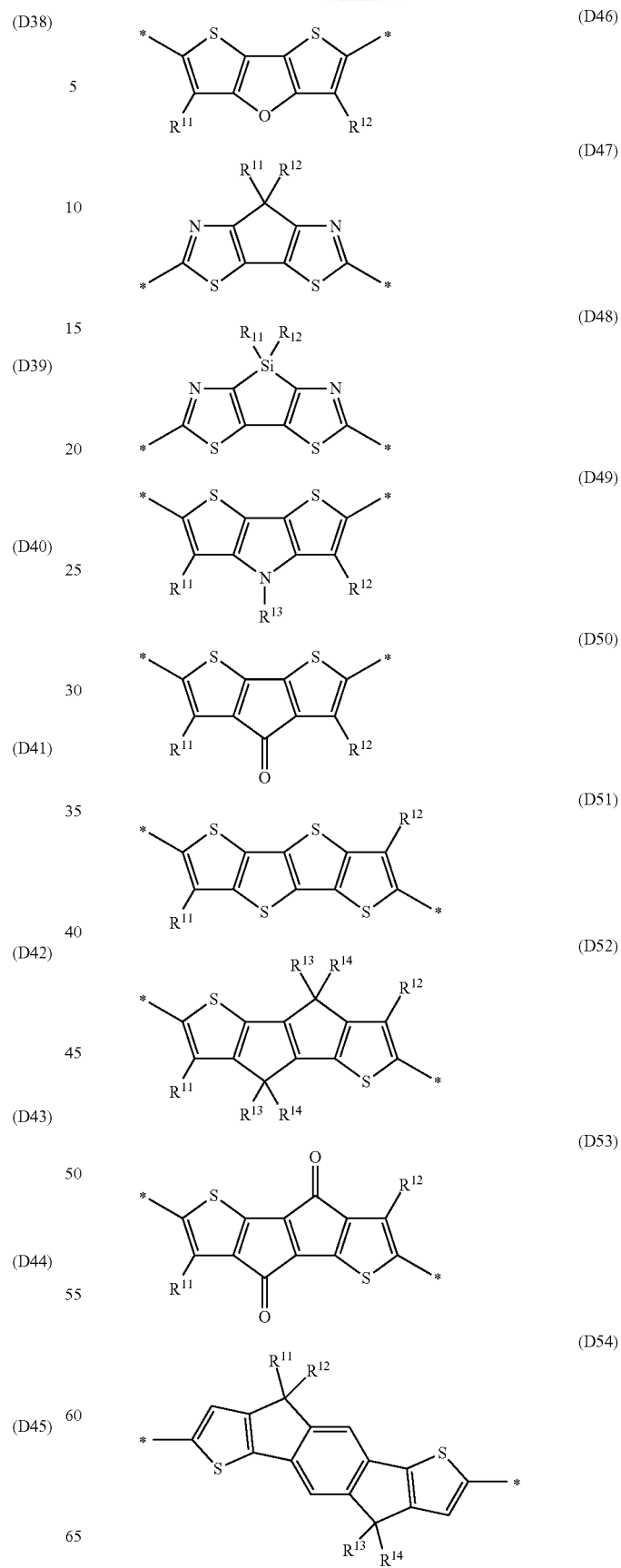

(D55) 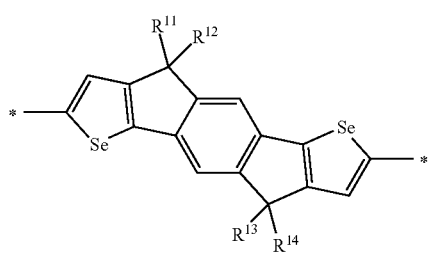
(D56) 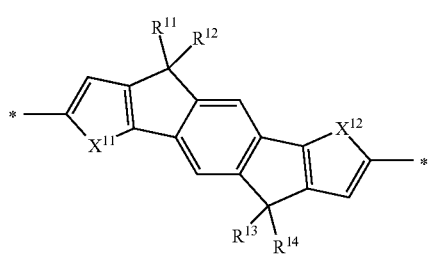
(D57) 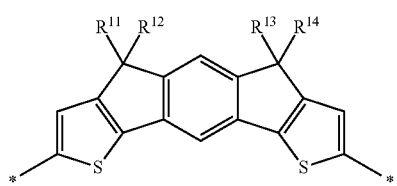
(D58) 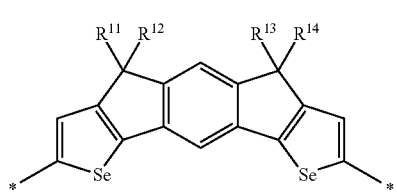
(D59) 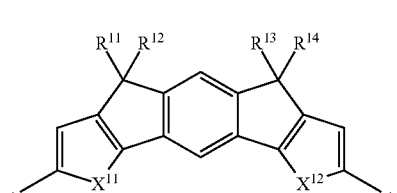
(D60) 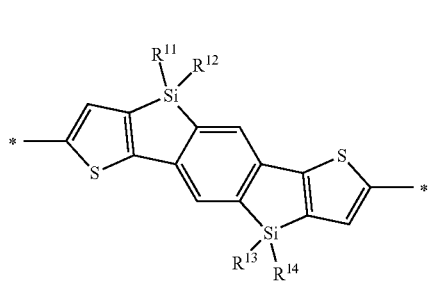
(D61) 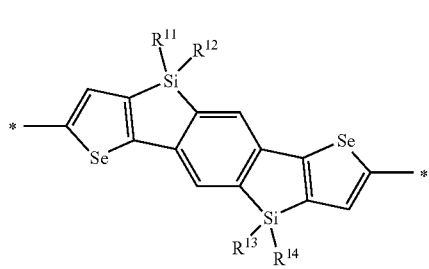
(D62) 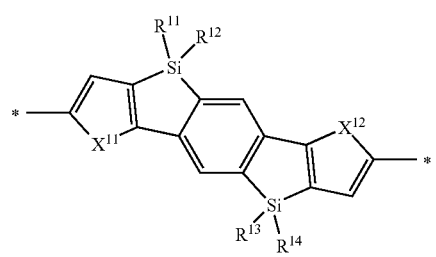
(D63) 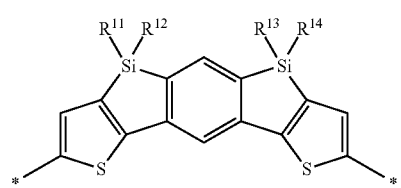
(D64) 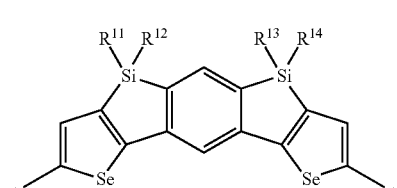
(D65) 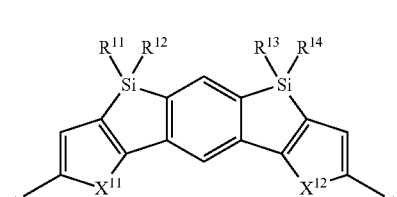
(D66) 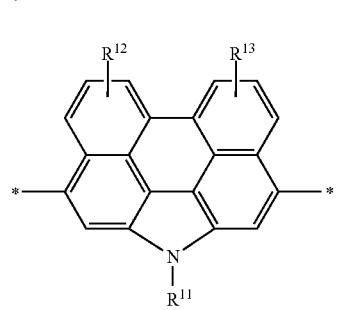
(D67) 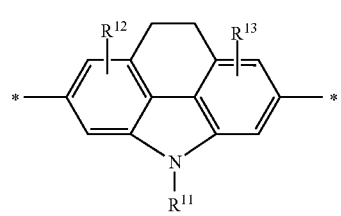
(D68) 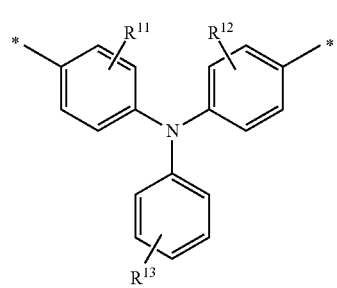

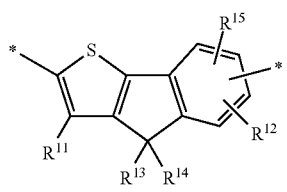 (D69)
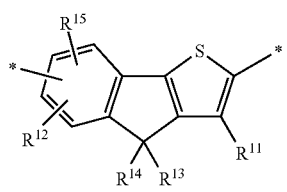 (D70)
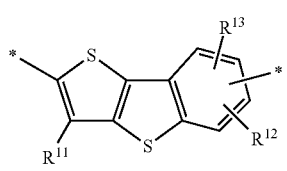 (D71)
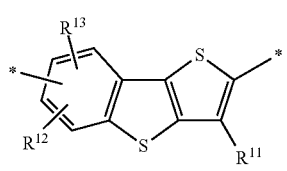 (D72)
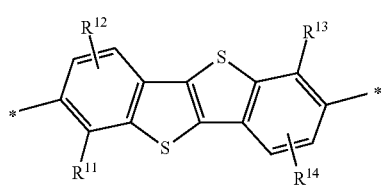 (D73)
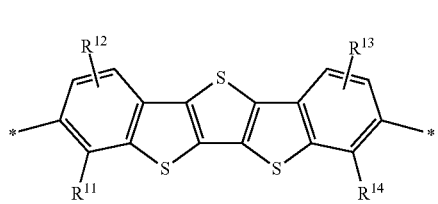 (D74)
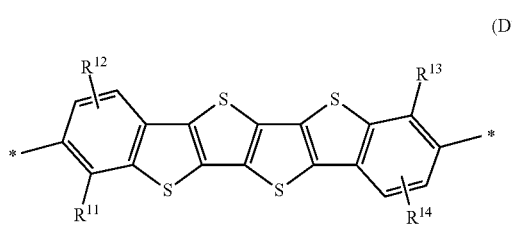 (D75)
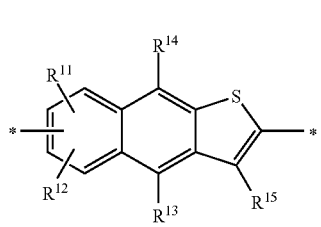 (D76)
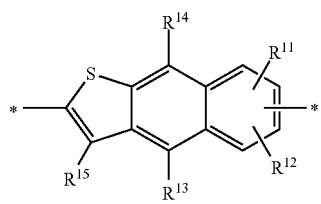 (D77)
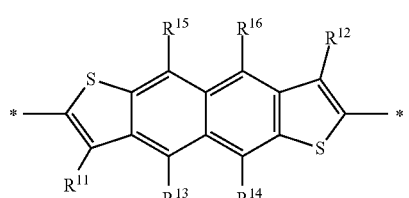 (D78)
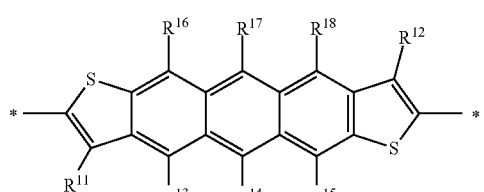 (D79)
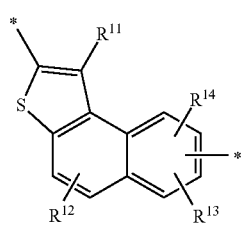 (D80)
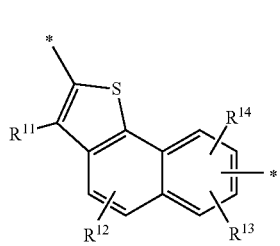 (D81)
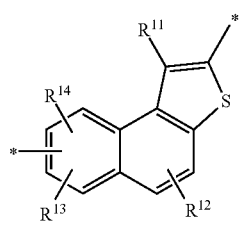 (D82)
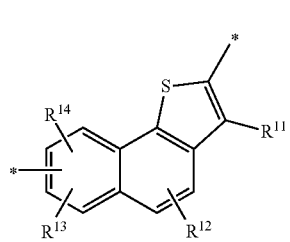 (D83)

(D84) 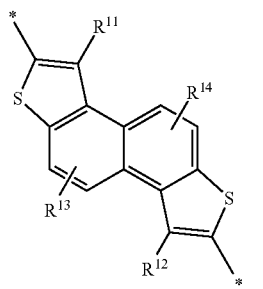
(D85) 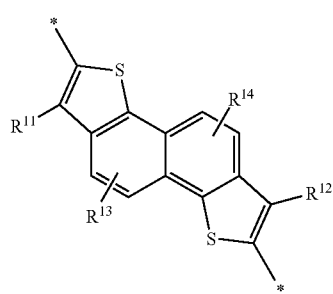
(D86) 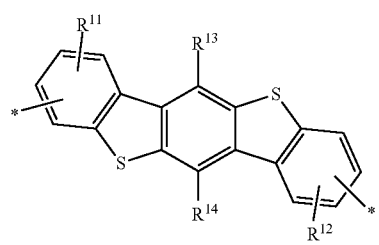
(D87) 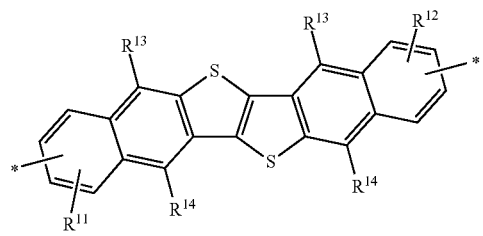
(D88) 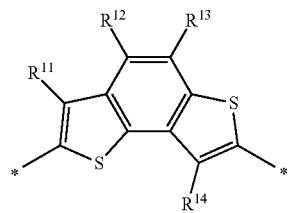
(D89) 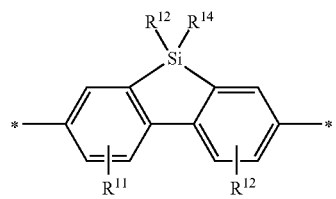
(D90) 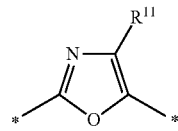
(D91) 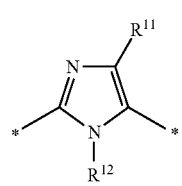
(D92) 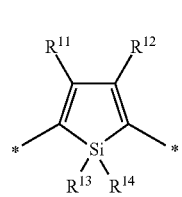
(D93) 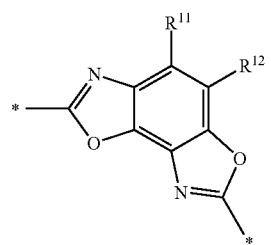
(D94) 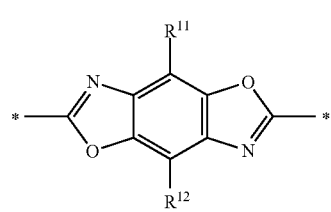
(D95) 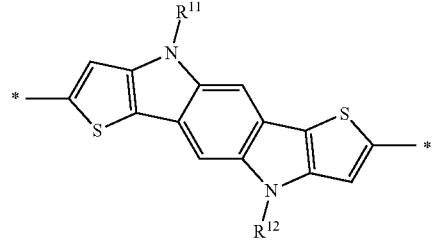
(D96) 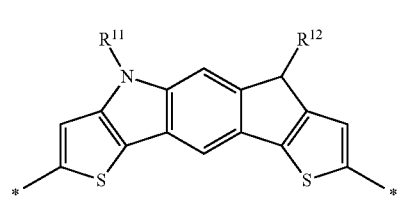

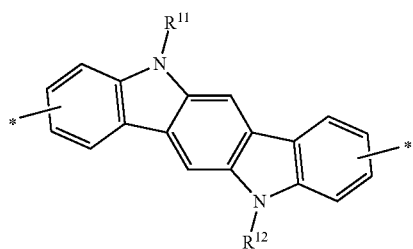
(D97)
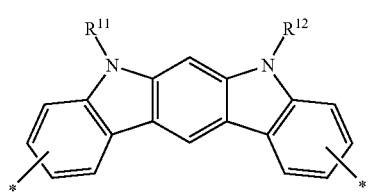
(D98)
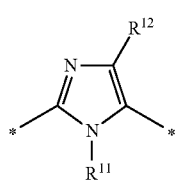
(D99)
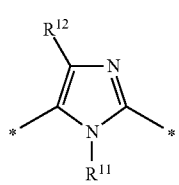
(D100)
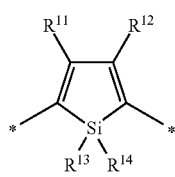
(D101)
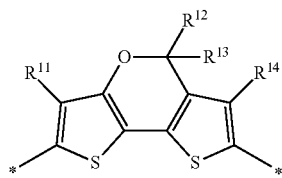
(D102)
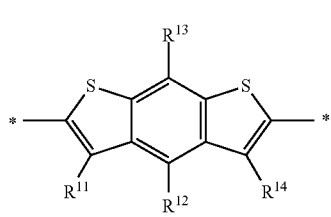
(D103)
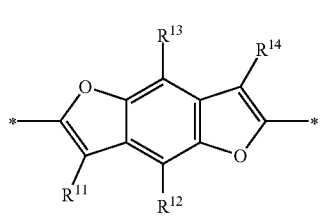
(D104)
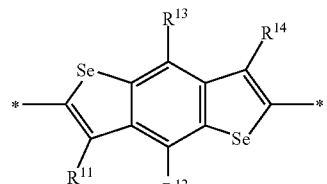
(D105)
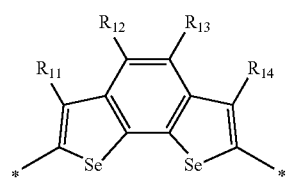
(D106)
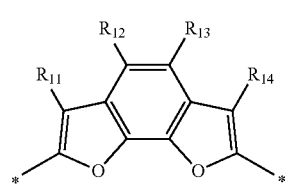
(D107)
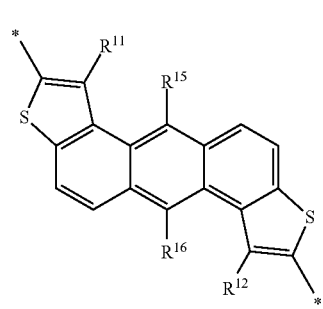
(D108)
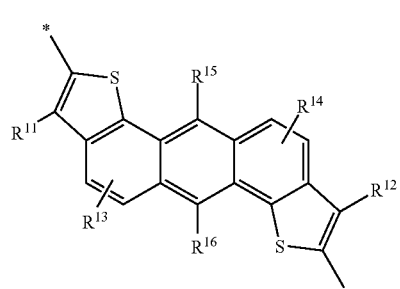
(D109)
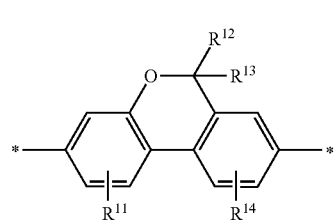
(D110)
wherein
one of $X^{11}$ and $X^{12}$ is S and the other is Se, and
$R^{11}$, $R^{12}$, $R^{13}$, $R^{14}$, $R^{15}$, $R^{16}$, $R^{17}$ and $R^{18}$ each denote independently of each other, and on each occurrence identically or differently, H, halogen, or an optionally substituted carbyl or hydrocarbyl group, wherein one or more C atoms each are optionally replaced by a hetero atom.

11. The polymer according to claim 5, wherein one or more of Ar³ and A¹ denote aryl or heteroaryl selected from following formulae
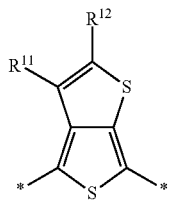
(A1)
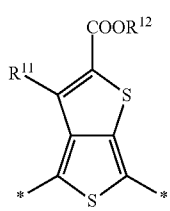
(A2)
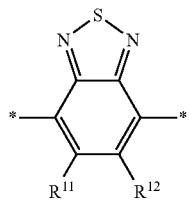
(A3)
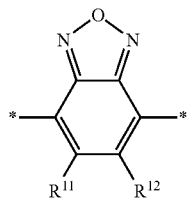
(A4)
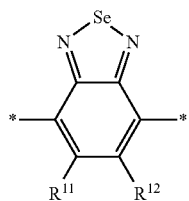
(A5)
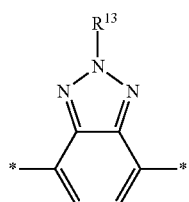
(A6)
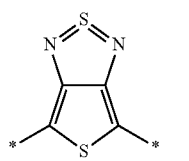
(A7)
-continued
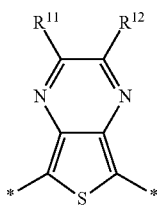
(A8)
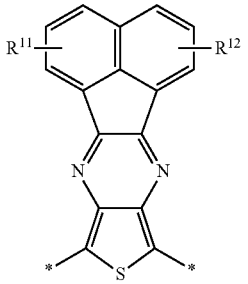
(A9)
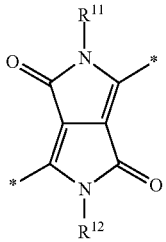
(A10)
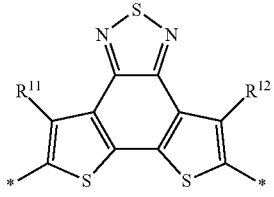
(A11)
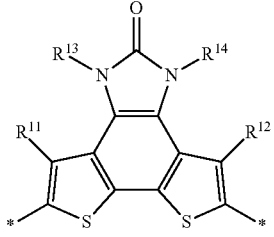
(A12)
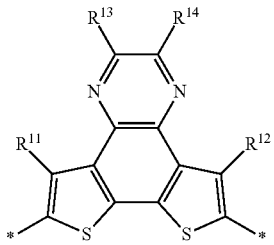
(A13)

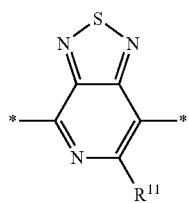 (A14)
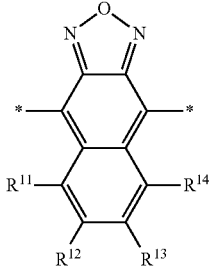 (A20)
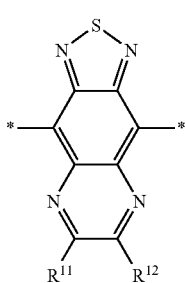 (A21)
(A15)
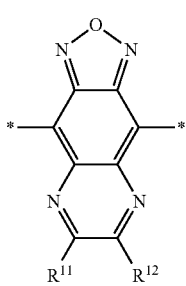 (A22)
(A16)
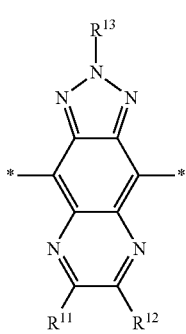 (A23)
(A17)
(A18)
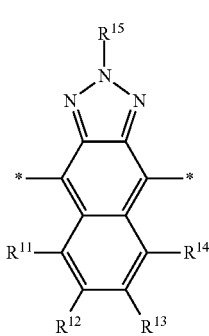 (A24)
(A19)

91
-continued
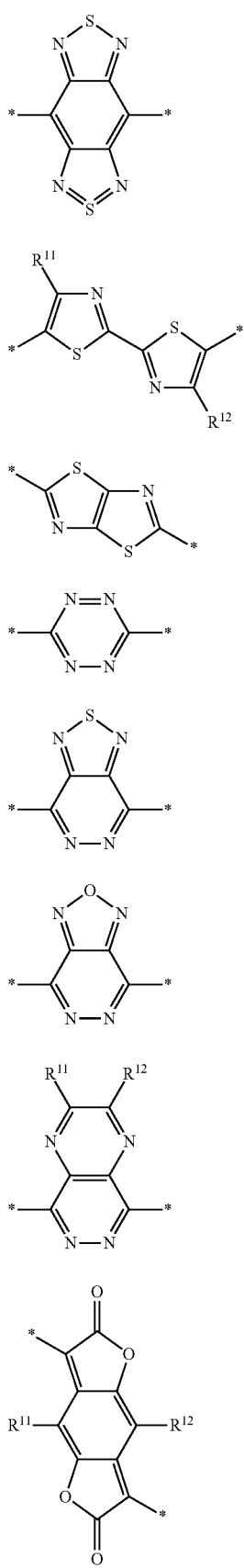
(A25)
(A26)
(A27)
(A28)
(A29)
(A30)
(A31)
(A32)
92
-continued
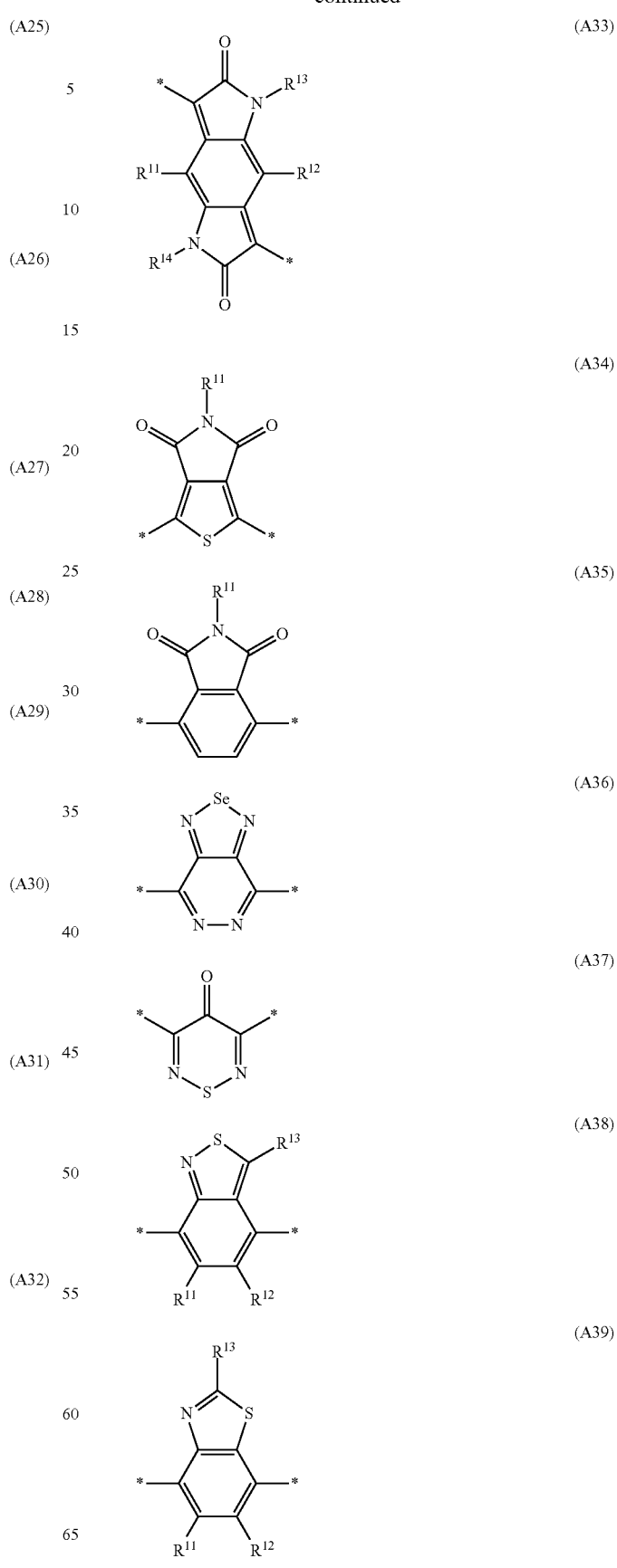
(A33)
(A34)
(A35)
(A36)
(A37)
(A38)
(A39)

-continued
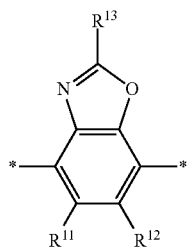
(A40)
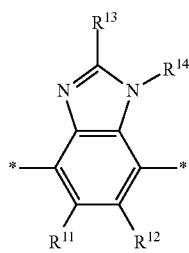
(A41)
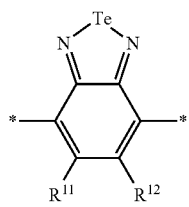
(A42)
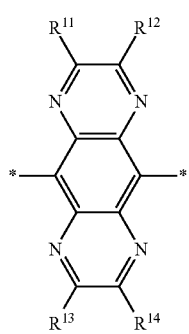
(A43)
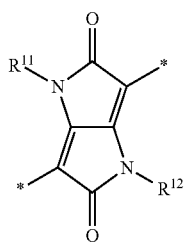
(A44)
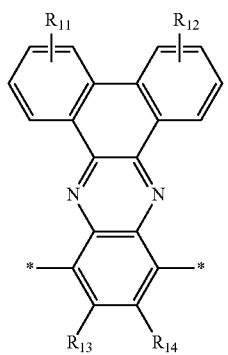
(A45)
-continued
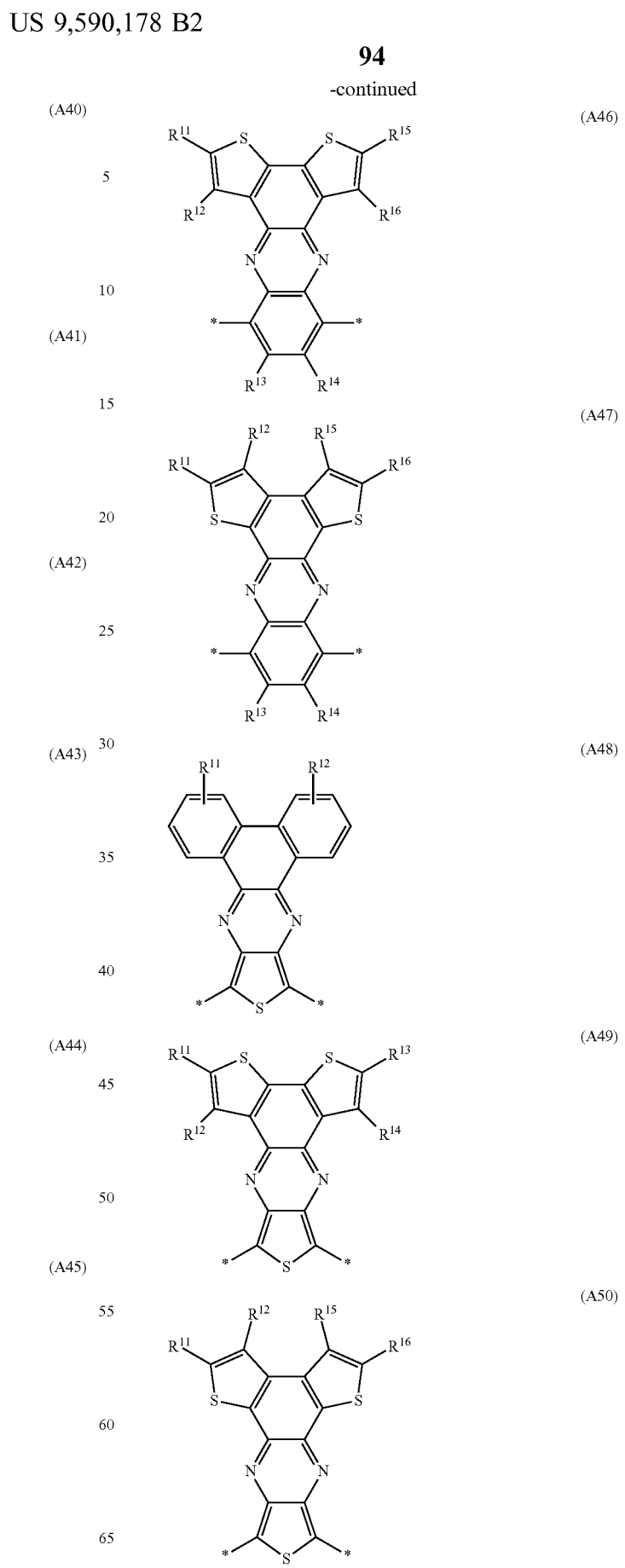

(A51) 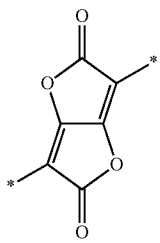

(A52) 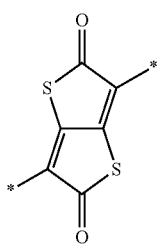

(A53) 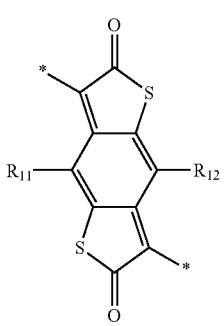

(A54) 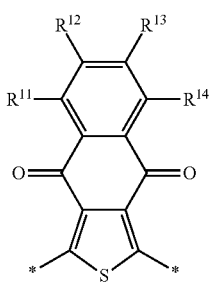

(A55) 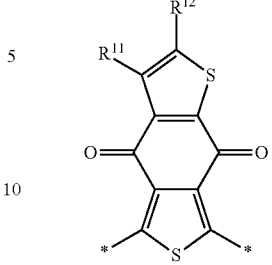

(A56) 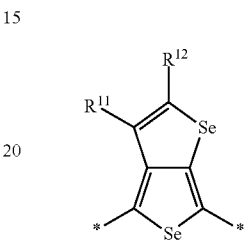

(A57) 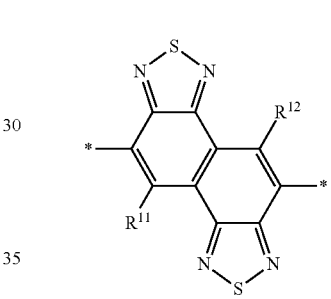

wherein one of $X^{11}$ and $X^{12}$ is S and the other is Se, and $R^{11}$, $R^{12}$, $R^{13}$, $R^{14}$ and $R^{15}$ each denote independently of each other, and on each occurrence identically or differently, H, halogen, or an optionally substituted carbyl or hydrocarbyl group, wherein one or more C atoms are each optionally replaced by a hetero atom.

12. The polymer according to claim 1, wherein said polymer is selected from the following formulae

I1

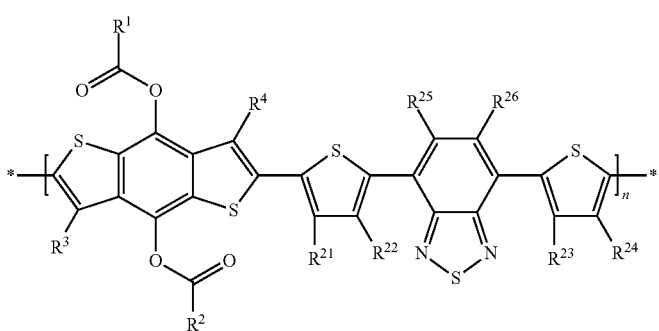

-continued
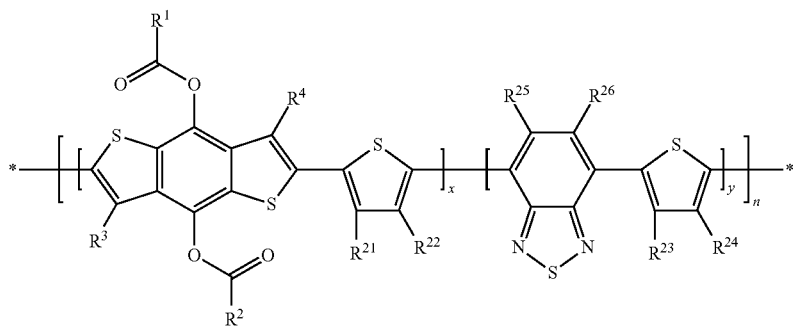
I2
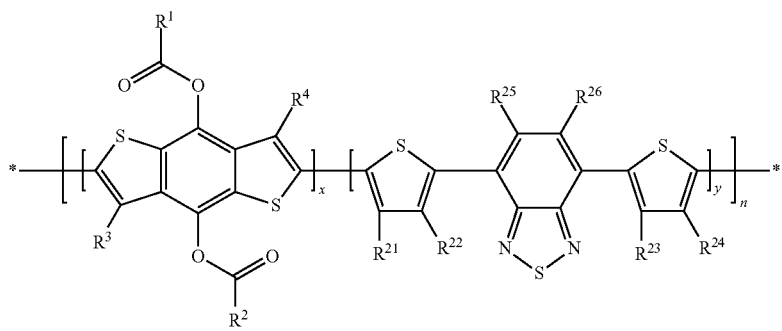
I3
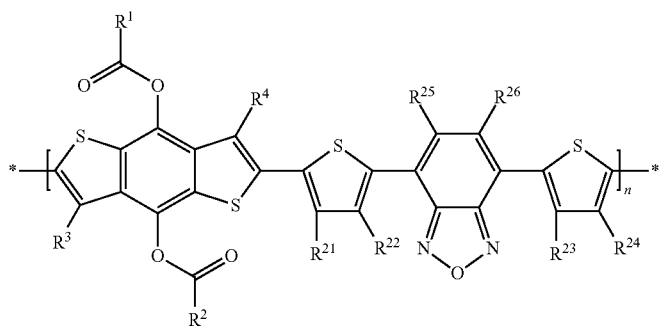
I4
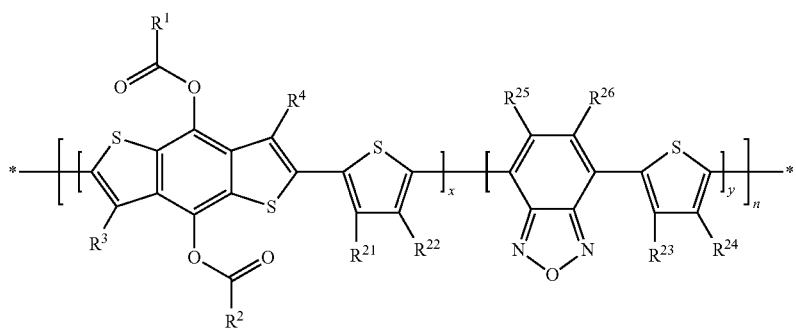
I5
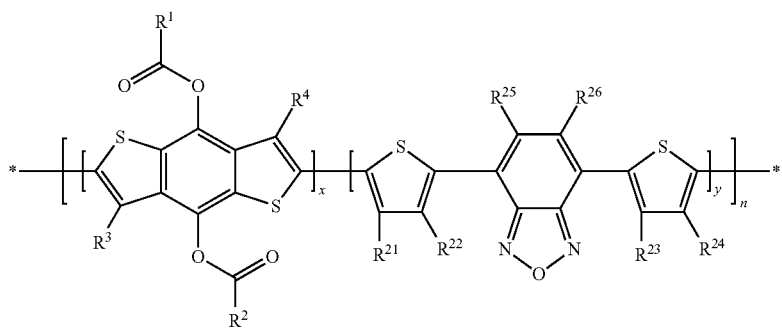
I6

-continued
I7
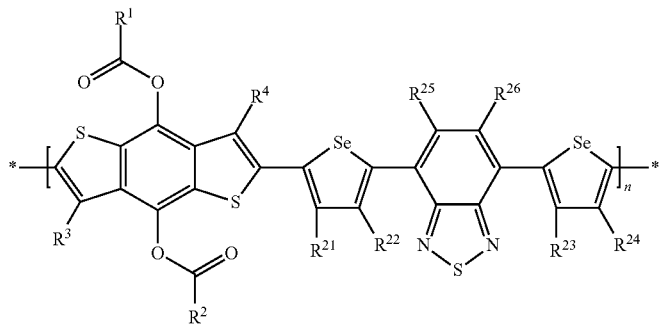
I8
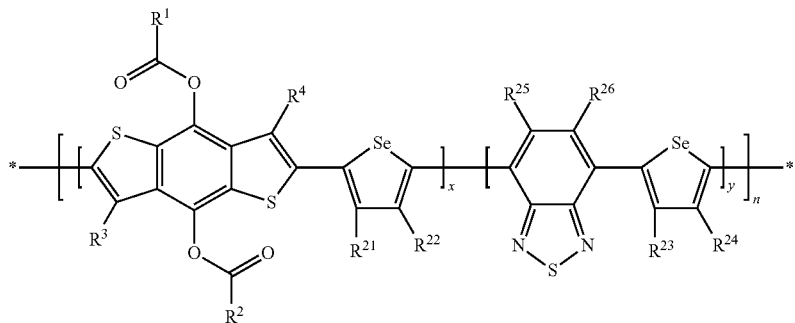
I9
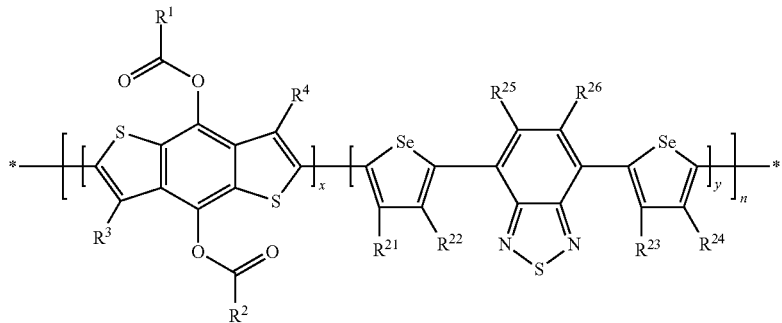
I10
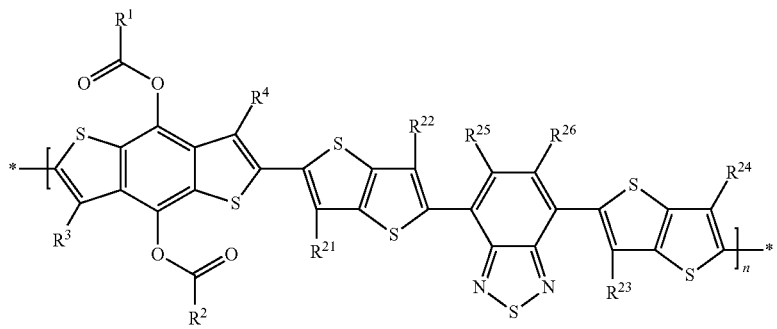
I11
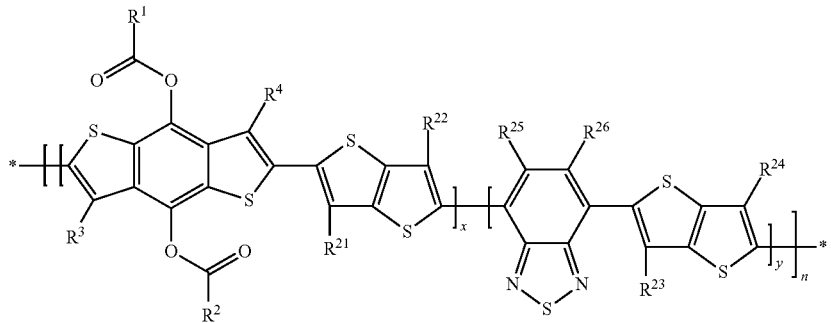

I12
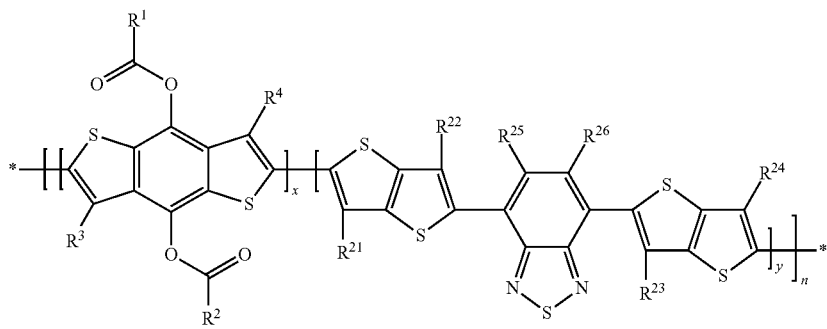
I13
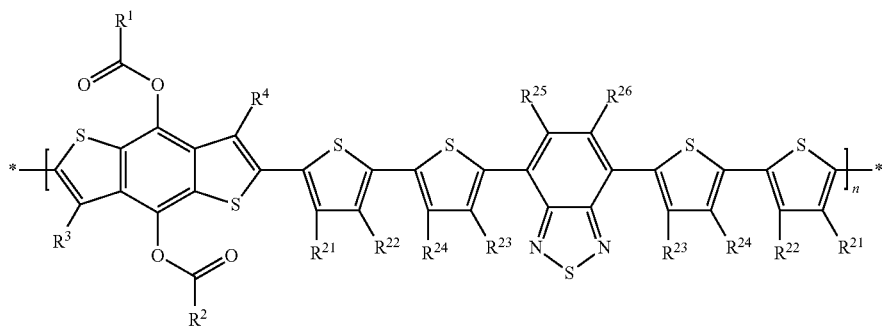
I14
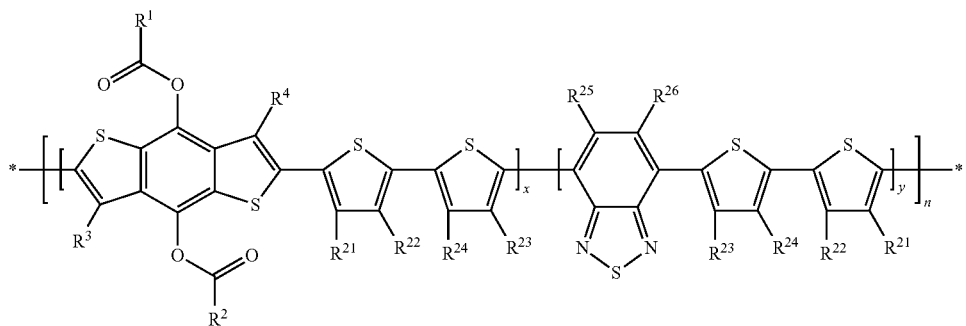
I15
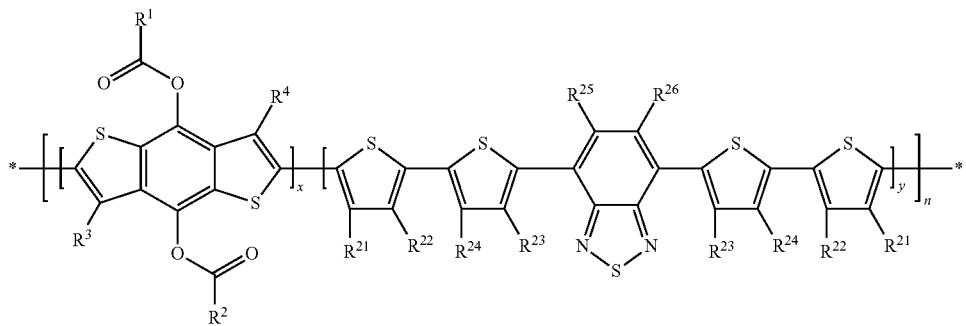
I16
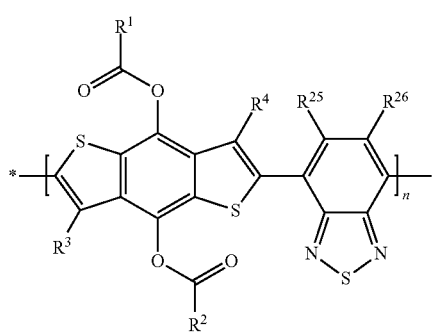
I17
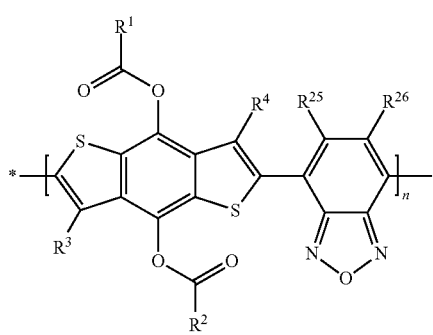

wherein
R$^1$, R$^2$, R$^3$ and R$^4$ are as defined
x is >0 and ≤1,
y is ≥0 and <1,
x+y is 1,
n is an integer >1, and
R$^{21}$, R$^{22}$, R$^{23}$, R$^{24}$, R$^{25}$ and R$^{26}$ each denote independently of each other, and on each occurrence identically or differently, H, halogen, or an optionally substituted carbyl or hydrocarbyl group, wherein one or more C atoms are each optionally replaced by a hetero atom.

13. A mixture or polymer blend comprising one or more compounds according to claim 1 and one or more compounds or polymers having semiconducting, charge transport, hole/electron transport, hole/electron blocking, electrically conducting, photoconducting or light emitting properties.

14. A mixture or polymer blend comprising one or more polymers according to claim 1 and one or more n-type organic semiconductor compounds.

15. The mixture or polymer blend according to claim 14, said one or more n-type organic semiconductor compounds are fullerene or substituted fullerene compounds.

16. A formulation comprising one or more polymers according to claim 1 and one or more solvents.

17. An optical, electrooptical, electronic, electroluminescent or photoluminescent device, a component of such a device, or an assembly comprising such a device or component, which contains a polymer according to claim 1 as charge transport, semiconducting, electrically conducting, photoconducting or light emitting material.

18. A charge transport, semiconducting, electrically conducting, photoconducting or light emitting material comprising a polymer according to claim 1.

19. An optical, electrooptical, electronic, electroluminescent or photoluminescent device, or a component thereof, or an assembly comprising it, which comprises a charge transport, semiconducting, electrically conducting, photoconducting or light emitting material, wherein said material comprises a polymer according to claim 1.

20. A device, a component thereof, or an assembly comprising it according to claim 19, wherein
said device is selected from organic field effect transistors (OFET), thin film transistors (TFT), organic light emitting diodes (OLED), organic light emitting transistors (OLET), organic photovoltaic devices (OPV), organic solar cells, laser diodes, Schottky diodes, photoconductors and photodetectors,
said component is selected from charge injection layers, charge transport layers, interlayers, planarising layers, antistatic films, polymer electrolyte membranes (PEM), conducting substrates, conducting patterns, and
said assembly is selected from integrated circuits (IC), radio frequency identification (RFID) tags or security markings or security devices containing them, flat panel displays or backlights thereof, electrophotographic devices, electrophotographic recording devices, organic memory devices, sensor devices, biosensors and biochips.

21. The device according to claim 20, wherein said device is an organic field effect transistor which is an OFET, a bulk heterojunction organic photovoltaic device, or an inverted bulk heterojunction organic photovoltaic device.

22. A monomer of formula VI $$R^5\text{-}(Ar^1)_a\text{---}U\text{-}(Ar^2)_b\text{---}R^6 \qquad VI$$

wherein
U is a unit of formula I,

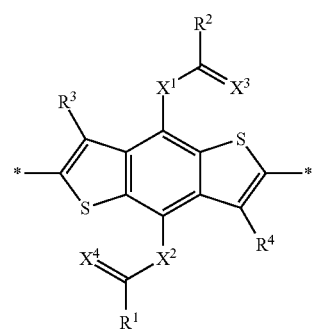

X$^1$, X$^2$, X$^3$, X$^4$ each denote independently of each other, and on each occurrence identically or differently O or S,
R$^1$, R$^2$ denote independently of each other, and on each occurrence identically or differently, a straight-chain or branched alkyl with 1 to 20 C atoms, which is unsubstituted or substituted by one or more F atoms,
R$^3$, R$^4$ denote independently of each other, and on each occurrence identically or differently, H, halogen, or an optionally substituted carbyl or hydrocarbyl group, wherein one or more C atoms are each optionally replaced by a hetero atom,
Ar$^1$ and Ar$^2$ are, on each occurrence identically or differently, and independently of each other, aryl or heteroaryl that is different from U, and is optionally substituted by one or more groups R$^S$,
R$^S$ is on each occurrence identically or differently F, Br, Cl, —CN, —NC, —NCO, —NCS, —OCN, —SCN, —C(O)NR$^0$R$^{00}$, —C(O)X$^0$, —C(O)R$^0$, —C(O)OR$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, carbyl or hydrocarbyl with 1 to 40 C atoms that is optionally substituted and optionally comprises one or more hetero atoms, or is P-Sp-,
R$^0$ and R$^{00}$ are independently of each other H or optionally substituted C$_{1-40}$ carbyl or hydrocarbyl,
P is a polymerizable or crosslinkable group,
Sp is a spacer group or a single bond,
X$^0$ is halogen,
a and b are on each occurrence identically or differently 0, 1 or 2,
R$^5$ and R$^6$ are each independently selected from Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —C≡CH, —C≡CSi(Z$^1$)$_3$, —ZnX$^0$ and —Sn(Z$^4$)$_3$,
X$^0$ is halogen, and
Z$^{1\text{-}4}$ are each independently selected from alkyl and aryl, each being optionally substituted, and two groups Z$^2$ may also together form a cyclic group.

23. The monomer of claim 22, wherein said monomer is selected from the following formulae $$R^5\text{-}Ar^1\text{---}U\text{-}Ar^2\text{---}R^6 \qquad VI1$$

$$R^5\text{---}U\text{---}R^6 \qquad VI2$$

$$R^5\text{-}Ar^1\text{—}U\text{—}R^6 \qquad VI3$$

$$R^5\text{—}U\text{-}Ar^2\text{—}R^6 \qquad VI4$$

24. A process of preparing a polymer comprising coupling, in an aryl-aryl coupling reaction, one or more monomers according to claim 22 with each other, and/or with one or more monomers selected from the following formulae $$R^5\text{-}(Ar^1)_a\text{-}A^1\text{-}(Ar^2)_c\text{—}R^6 \qquad C$$

$$R^5\text{-}Ar^1\text{—}R^6 \qquad D$$

$$R^5\text{-}Ar^3\text{—}R^6 \qquad E$$

wherein c is 0, 1 or 2.

25. The polymer according to claim 5, wherein
P is selected from vinyloxy, acrylate, methacrylate, fluoroacrylate, chloracrylate, oxetan and epoxy groups,
Sp is of formula Sp'-X',
Sp' is alkylene with up to 30 C atoms which is unsubstituted or mono- or polysubstituted by F, Cl, Br, I or CN, and optionally one or more non-adjacent $CH_2$ groups are each replaced, in each case independently from one another, by —O—, —S—, —NH—, —NR$^0$—, —SiR$^0$R$^{00}$—, —C(O)—, —C(O)O—, —OC(O)—, —OC(O)—O—, —S—C(O)—, —C(O)—S—, —CH=CH— or —C≡C— in such a manner that O and/or S atoms are not linked directly to one another,
X' is —O—, —S—, —C(O)—, —C(O)O—, —OC(O)—, —O—C(O)O—, —C(O)—NR$^0$—, —NR$^0$—C(O)—, —NR$^0$—C(O)—NR$^{00}$—, —OCH$_2$—, —CH$_2$O—, —SCH$_2$—, —CH$_2$S—, —CF$_2$O—, —OCF$_2$—, —CF$_2$S—, —SCF$_2$—, —CF$_2$CH$_2$—, —CH$_2$CF$_2$—, —CF$_2$CF$_2$—, —CH=N—, —N=CH—, —N=N—, —CH=CR$^0$—, —CY$^1$=CY$^2$—, —C≡C—, —CH=CH—C(O)O—, —OC(O)—CH=CH— or a single bond,
R$^0$ and R$^{00}$ are each independently of each other H or alkyl with 1 to 12 C-atoms, and
Y$^1$ and Y$^2$ are each independently of each other H, F, Cl or CN.

26. The polymer according to claim 1, wherein $X^3$ and $X^4$ are O.

27. The polymer according to claim 1, wherein $X^1$ and $X^2$ are O.

28. The polymer according to claim 1, wherein $X^1$, $X^2$, $X^3$ and $X^4$ are each O.

* * * * *